United States Patent
Lin et al.

(10) Patent No.: US 8,207,019 B2
(45) Date of Patent: Jun. 26, 2012

(54) METHOD OF MAKING A SEMICONDUCTOR CHIP ASSEMBLY WITH A POST/BASE/POST HEAT SPREADER AND ASYMMETRIC POSTS

(75) Inventors: Charles W. C. Lin, Singapore (SG); Chia-Chung Wang, Hsinchu (TW)

(73) Assignee: Bridge Semiconductor Corporation, Taipei (TW)

( * ) Notice: Subject to any disclaimer, the term of this patent is extended or adjusted under 35 U.S.C. 154(b) by 0 days.

(21) Appl. No.: 13/031,222

(22) Filed: Feb. 20, 2011

(65) Prior Publication Data

US 2011/0151626 A1    Jun. 23, 2011

Related U.S. Application Data

(60) Division of application No. 13/030,136, filed on Feb. 18, 2011, which is a continuation-in-part of application No. 12/616,773, filed on Nov. 11, 2009, now Pat. No. 8,067,784, and a continuation-in-part of application No. 12/616,775, filed on Nov. 11, 2009, said application No. 12/616,773 is a continuation-in-part of application No. 12/557,540, filed on Sep. 11, 2009, which is a continuation-in-part of application No. 12/406,510, filed on Mar. 18, 2009, said application No. 12/557,540 is a continuation-in-part of application No. 12/557,541, filed on Sep. 11, 2009, now Pat. No. 7,948,076, which is a continuation-in-part of application No. 12/406,510, said application No. 12/557,541 is a continuation-in-part of application No. 12/557,540, which is a continuation-in-part of application No.

(Continued)

(51) Int. Cl.
    *H01L 21/00*    (2006.01)
    *H01L 23/12*    (2006.01)

(52) U.S. Cl. ... 438/122; 438/26; 257/711; 257/E23.102; 257/E23.104; 257/E33.075

(58) Field of Classification Search .................. 438/26, 438/27, 122, 612, 39; 257/684, 712, 99, 257/711, 717, 706, 707, E33.056
    See application file for complete search history.

(56) References Cited

U.S. PATENT DOCUMENTS 3,689,993 A    9/1972    Tolar ............................ 438/380
(Continued)

FOREIGN PATENT DOCUMENTS

JP    2005-166775    6/2005

OTHER PUBLICATIONS

Wilson, et al., Handbook of Multilevel Metallization for Integrated Circuits: Materials, Technology, and Applications, 1993.*

*Primary Examiner* — Jenny L Wagner
*Assistant Examiner* — Abbigale Boyle
(74) *Attorney, Agent, or Firm* — Jackson IPG PLLC; Demian K. Jackson

(57) ABSTRACT

A method of making a semiconductor chip assembly includes providing first and second posts, first and second adhesives and a base, wherein the first post extends from the base in a first vertical direction into a first opening in the first adhesive and is located within a periphery of the second post, the second post extends from the base in a second vertical direction into a second opening in the second adhesive and the base is sandwiched between and extends laterally from the posts, then flowing and solidifying the adhesives, then providing a conductive trace that includes a pad and a terminal, wherein the pad extends beyond the base in the first vertical direction and the terminal extends beyond the base in the second vertical direction, providing a heat spreader that includes the posts and the base, then mounting a semiconductor device on the first post, electrically connecting the semiconductor device to the conductive trace and thermally connecting the semiconductor device to the heat spreader.

53 Claims, 41 Drawing Sheets

Related U.S. Application Data

12/406,510, said application No. 12/557,540 is a continuation-in-part of application No. 12/557,541, which is a continuation-in-part of application No. 12/406,510.

(60) Provisional application No. 61/410,932, filed on Nov. 7, 2010, provisional application No. 61/350,923, filed on Jun. 3, 2010, provisional application No. 61/071,589, filed on May 7, 2008, provisional application No. 61/071,588, filed on May 7, 2008, provisional application No. 61/071,072, filed on Apr. 11, 2008, provisional application No. 61/064,748, filed on Mar. 25, 2008, provisional application No. 61/150,980, filed on Feb. 9, 2009.

(56) References Cited

U.S. PATENT DOCUMENTS

| | | | | |
|---|---|---|---|---|
| 3,969,199 | A | 7/1976 | Berdan et al. | 205/177 |
| 4,420,767 | A | 12/1983 | Hodge et al. | 257/713 |
| 4,509,096 | A | 4/1985 | Baldwin et al. | 257/706 |
| 5,012,386 | A | 4/1991 | McShane et al. | 361/386 |
| 5,102,829 | A | 4/1992 | Cohn | 437/217 |
| 5,379,187 | A | 1/1995 | Lee et al. | 361/707 |
| 5,457,605 | A | 10/1995 | Wagner et al. | 361/720 |
| 5,644,163 | A | 7/1997 | Tsuji | 257/706 |
| 6,057,601 | A | 5/2000 | Lau et al. | 257/738 |
| 6,107,683 | A | 8/2000 | Castro et al. | 257/700 |
| 6,160,705 | A | 12/2000 | Stearns et al. | 361/704 |
| 6,281,568 | B1 | 8/2001 | Glenn et al. | 257/684 |
| 6,313,525 | B1 | 11/2001 | Sasano | 257/704 |
| 6,453,549 | B1 | 9/2002 | Bhatt et al. | 29/837 |
| 6,495,914 | B1 | 12/2002 | Sekine et al. | 257/723 |
| 6,498,355 | B1 | 12/2002 | Harrah et al. | 257/99 |
| 6,507,102 | B2* | 1/2003 | Juskey et al. | 257/706 |
| 6,528,882 | B2 | 3/2003 | Ding et al. | 257/738 |
| 6,541,832 | B2 | 4/2003 | Coyle | 257/415 |
| 6,583,444 | B2 | 6/2003 | Fjelstad | 257/82 |
| 6,603,209 | B1 | 8/2003 | DiStefano et al. | 257/781 |
| 6,625,028 | B1 | 9/2003 | Dove et al. | 361/707 |
| 6,670,219 | B2 | 12/2003 | Lee et al. | 438/107 |
| 6,683,795 | B1 | 1/2004 | Yoo | 361/816 |
| 6,720,651 | B2 | 4/2004 | Gaku et al. | 257/707 |
| 6,744,135 | B2 | 6/2004 | Hasebe et al. | 257/712 |
| 6,861,750 | B2 | 3/2005 | Zhao et al. | 257/739 |
| 6,900,535 | B2 | 5/2005 | Zhou | 257/707 |
| 6,906,414 | B2 | 6/2005 | Zhao et al. | 257/707 |
| 6,936,855 | B1 | 8/2005 | Harrah | 257/88 |
| 6,964,877 | B2 | 11/2005 | Chen et al. | 438/20 |
| 7,038,311 | B2* | 5/2006 | Woodall et al. | 257/706 |
| 7,196,403 | B2 | 3/2007 | Karim | 257/675 |
| 7,335,522 | B2 | 2/2008 | Wang et al. | 438/26 |
| 7,470,935 | B2 | 12/2008 | Lee et al. | 257/98 |
| 7,495,322 | B2 | 2/2009 | Hashimoto et al. | 257/676 |
| 7,582,951 | B2 | 9/2009 | Zhao et al. | 257/660 |
| 7,642,137 | B2 | 1/2010 | Lin et al. | 438/127 |
| 7,690,817 | B2 | 4/2010 | Sanpei et al. | 362/294 |
| 7,741,158 | B2 | 6/2010 | Leung et al. | 438/122 |
| 7,781,266 | B2 | 8/2010 | Zhao et al. | 438/123 |
| 7,808,087 | B2 | 10/2010 | Zhao et al. | 257/670 |
| 7,812,360 | B2 | 10/2010 | Yano | 257/98 |
| 7,956,372 | B2 | 6/2011 | Kamada et al. | 257/98 |
| 8,030,676 | B2 | 10/2011 | Lin | 257/99 |
| 8,071,998 | B2 | 12/2011 | Chen | 257/99 |
| 2002/0100967 | A1* | 8/2002 | Gaku et al. | 257/707 |
| 2003/0189830 | A1 | 10/2003 | Sugimoto et al. | 362/294 |
| 2004/0061433 | A1 | 4/2004 | Izuno et al. | 313/498 |
| 2004/0065894 | A1 | 4/2004 | Hashimoto et al. | 257/100 |
| 2005/0024834 | A1 | 2/2005 | Newby | 361/719 |
| 2005/0135105 | A1 | 6/2005 | Teixeira et al. | 362/294 |
| 2005/0185880 | A1 | 8/2005 | Asai | 385/14 |
| 2005/0274959 | A1 | 12/2005 | Kim et al. | 257/79 |
| 2006/0012967 | A1 | 1/2006 | Asai et al. | 361/764 |
| 2006/0054915 | A1 | 3/2006 | Chang | 257/100 |
| 2006/0109632 | A1 | 5/2006 | Berlin et al. | 361/719 |
| 2006/0131735 | A1 | 6/2006 | Ong et al. | 257/706 |
| 2007/0063213 | A1 | 3/2007 | Hsieh et al. | 257/99 |
| 2007/0077416 | A1 | 4/2007 | Ito et al. | 428/339 |
| 2007/0252166 | A1 | 11/2007 | Chang et al. | 257/98 |
| 2007/0267642 | A1 | 11/2007 | Erchak et al. | 257/98 |
| 2007/0290322 | A1 | 12/2007 | Zhao et al. | 257/690 |
| 2008/0019133 | A1 | 1/2008 | Kim et al. | 362/294 |
| 2008/0099770 | A1 | 5/2008 | Mendendorp et al. | 257/79 |
| 2008/0102631 | A1 | 5/2008 | Andryushchenko et al. | 438/686 |
| 2008/0128739 | A1* | 6/2008 | Sanpei et al. | 257/99 |
| 2008/0173884 | A1* | 7/2008 | Chitnis et al. | 257/98 |
| 2008/0180824 | A1 | 7/2008 | Endoh et al. | 359/894 |
| 2009/0309213 | A1 | 12/2009 | Takahashi et al. | 257/707 |
| 2010/0149756 | A1 | 6/2010 | Rowcliffe et al. | 361/714 |
| 2010/0291737 | A1 | 11/2010 | Ikeguchi et al. | 438/108 |
| 2011/0104856 | A1* | 5/2011 | Lin et al. | 438/118 |
| 2011/0287563 | A1* | 11/2011 | Lin et al. | 438/26 |

* cited by examiner

US 8,207,019 B2

METHOD OF MAKING A SEMICONDUCTOR CHIP ASSEMBLY WITH A POST/BASE/POST HEAT SPREADER AND ASYMMETRIC POSTS

CROSS-REFERENCE TO RELATED APPLICATIONS

This application is a divisional of U.S. Application Ser. No. 13/030,136 filed Feb. 18, 2011, which is a continuation-in-part of U.S. Application Ser. No. 12/616,773 filed Nov. 11, 2009 now U.S. Pat. No. 8,067,784 and a continuation-in-part of U.S. Application Ser. No. 12/616,775 filed Nov. 11, 2009, each of which is incorporated by reference. U.S. Application Ser. No. 13/030,136 filed Feb. 18, 2011 also claims the benefit of U.S. Provisional Application Ser. No. 61/410,932 filed Nov. 7, 2010 and U.S. Provisional Application Ser. No. 61/350,923 filed Jun. 3, 2010, each of which is incorporated by reference.

U.S. application Ser. No. 12/616,773 filed Nov. 11, 2009 and U.S. application Ser. No. 12/616,775 filed Nov. 11, 2009 are each a continuation-in-part of U.S. application Ser. No. 12/557,540 filed Sep. 11, 2009 and a continuation-in-part of U.S. application Ser. No. 12/557,541 filed Sep. 11, 2009 now U.S. Pat. No. 7,948,076.

U.S. application Ser. No. 12/557,540 filed Sep. 11, 2009 and U.S. application Ser. No. 12/557,541 filed Sep. 11, 2009 are each a continuation-in-part of U.S. application Ser. No. 12/406,510 filed Mar. 18, 2009, which claims the benefit of U.S. Provisional Application Ser. No. 61/071,589 filed May 7, 2008, U.S. Provisional Application Ser. No. 61/071,588 filed May 7, 2008, U.S. Provisional Application Ser. No. 61/071,072 filed Apr. 11, 2008, and U.S. Provisional Application Ser. No. 61/064,748 filed Mar. 25, 2008, each of which is incorporated by reference. U.S. application Ser. No. 12/557,540 filed Sep. 11, 2009 and U.S. application Ser. No. 12/557,541 filed Sep. 11, 2009 also claim the benefit of U.S. Provisional Application Ser. No. 61/150,980 filed Feb. 9, 2009, which is incorporated by reference.

BACKGROUND OF THE INVENTION

1. Field of the Invention

The present invention relates to semiconductor chip assembly, and more particularly to a semiconductor chip assembly with a semiconductor device, a conductive trace, an adhesive and a heat spreader and its method of manufacture.

2. Description of the Related Art

Semiconductor devices such as packaged and unpackaged semiconductor chips have high voltage, high frequency and high performance applications that require substantial power to perform the specified functions. As the power increases, the semiconductor device generates more heat. Furthermore, the heat build-up is aggravated by higher packing density and smaller profile sizes which reduce the surface area to dissipate the heat.

Semiconductor devices are susceptible to performance degradation as well as short life span and immediate failure at high operating temperatures. The heat not only degrades the chip, but also imposes thermal stress on the chip and surrounding elements due to thermal expansion mismatch. As a result, the heat must be dissipated rapidly and efficiently from the chip to ensure effective and reliable operation. A high thermal conductivity path typically requires heat conduction and heat spreading to a much larger surface area than the chip or a die pad it is mounted on.

Light emitting diodes (LEDs) have recently become popular alternatives to incandescent, fluorescent and halogen light sources. LEDs provide energy efficient, cost effective, long term lighting for medical, military, signage, signal, aircraft, maritime, automotive, portable, commercial and residential applications. For instance, LEDs provide light sources for lamps, flashlights, headlights, flood lights, traffic lights and displays.

LEDs include high power chips that generate high light output and considerable heat. Unfortunately, LEDs exhibit color shifts and low light output as well as short lifetimes and immediate failure at high operating temperatures. Furthermore, LED light output and reliability are constrained by heat dissipation limits. LEDs underscore the critical need for providing high power chips with adequate heat dissipation.

LED packages usually include an LED chip, a submount, electrical contacts and a thermal contact. The submount is thermally connected to and mechanically supports the LED chip. The electrical contacts are electrically connected to the anode and cathode of the LED chip. The thermal contact is thermally connected to the LED chip by the submount but requires adequate heat dissipation by the underlying carrier to prevent the LED chip from overheating.

Packages and thermal boards for high power chips have been developed extensively in the industry with a wide variety of designs and manufacturing techniques in attempts to meet performance demands in an extremely cost-competitive environment.

Plastic ball grid array (PBGA) packages have a chip and a laminated substrate enclosed in a plastic housing and are attached to a printed circuit board (PCB) by solder balls. The laminated substrate includes a dielectric layer that often includes fiberglass. The heat from the chip flows through the plastic and the dielectric layer to the solder balls and then the PCB. However, since the plastic and the dielectric layer typically have low thermal conductivity, the PBGA provides poor heat dissipation.

Quad-Flat-No Lead (QFN) packages have the chip mounted on a copper die pad which is soldered to the PCB. The heat from the chip flows through the die pad to the PCB. However, since the lead frame type interposer has limited routing capability, the QFN package cannot accommodate high input/output (I/O) chips or passive elements.

Thermal boards provide electrical routing, thermal management and mechanical support for semiconductor devices. Thermal boards usually include a substrate for signal routing, a heat spreader or heat sink for heat removal, pads for electrical connection to the semiconductor device and terminals for electrical connection to the next level assembly. The substrate can be a laminated structure with single layer or multi-layer routing circuitry and one or more dielectric layers. The heat spreader can be a metal base, a metal slug or an embedded metal layer.

Thermal boards interface with the next level assembly. For instance, the next level assembly can be a light fixture with a printed circuit board and a heat sink. In this instance, an LED package is mounted on the thermal board, the thermal board is mounted on the heat sink, the thermal board/heat sink subassembly and the printed circuit board are mounted in the light fixture and the thermal board is electrically connected to the printed circuit board by wires. The substrate routes electrical signals to the LED package from the printed circuit board and the heat spreader spreads and transfers heat from the LED package to the heat sink. The thermal board thus provides a critical thermal path for the LED chip.

U.S. Pat. No. 6,507,102 to Juskey et al. discloses an assembly in which a composite substrate with fiberglass and cured thermosetting resin includes a central opening, a heat slug with a square or rectangular shape resembling the central opening is attached to the substrate at sidewalls of the central opening, top and bottom conductive layers are attached to the top and bottom of the substrate and electrically connected to one another by plated through-holes through the substrate, a chip is mounted on the heat slug and wire bonded to the top conductive layer, an encapsulant is molded on the chip and solder balls are placed on the bottom conductive layer.

During manufacture, the substrate is initially a prepreg with B-stage resin placed on the bottom conductive layer, the heat slug is inserted into the central opening and on the bottom conductive layer and spaced from the substrate by a gap, the top conductive layer is mounted on the substrate, the conductive layers are heated and pressed towards one another so that the resin melts, flows into the gap and solidifies, the conductive layers are patterned to form circuit traces on the substrate and expose the excess resin flash on the heat slug, and the excess resin flash is removed to expose the heat slug. The chip is then mounted on the heat slug, wire bonded and encapsulated.

The heat flows from the chip through the heat slug to the PCB. However, manually dropping the heat slug into the central opening is prohibitively cumbersome and expensive for high volume manufacture. Furthermore, since the heat slug is difficult to accurately position in the central opening due to tight lateral placement tolerance, voids and inconsistent bond lines arise between the substrate and the heat slug. The substrate is therefore partially attached to the heat slug, fragile due to inadequate support by the heat slug and prone to delamination. In addition, the wet chemical etch that removes portions of the conductive layers to expose the excess resin flash also removes portions of the heat slug exposed by the excess resin flash. The heat slug is therefore non-planar and difficult to bond to. As a result, the assembly suffers from high yield loss, poor reliability and excessive cost.

U.S. Pat. No. 6,528,882 to Ding et al. discloses a thermal enhanced ball grid array package in which the substrate includes a metal core layer. The chip is mounted on a die pad region at the top surface of the metal core layer, an insulating layer is formed on the bottom surface of the metal core layer, blind vias extend through the insulating layer to the metal core layer, thermal balls fill the blind vias and solder balls are placed on the substrate and aligned with the thermal balls. The heat from the chip flows through the metal core layer to the thermal balls to the PCB. However, the insulating layer sandwiched between the metal core layer and the PCB limits the heat flow to the PCB.

U.S. Pat. No. 6,670,219 to Lee et al. discloses a cavity down ball grid array (CDBGA) package in which a ground plate with a central opening is mounted on a heat spreader to form a thermal dissipating substrate. A substrate with a central opening is mounted on the ground plate using an adhesive with a central opening. A chip is mounted on the heat spreader in a cavity defined by the central opening in the ground plate and solder balls are placed on the substrate. However, since the solder balls extend above the substrate, the heat spreader does not contact the PCB. As a result, the heat spreader releases the heat by thermal convection rather than thermal conduction which severely limits the heat dissipation.

U.S. Pat. No. 7,038,311 to Woodall et al. discloses a thermal enhanced BGA package in which a heat sink with an inverted T-like shape includes a pedestal and an expanded base, a substrate with a window opening is mounted on the expanded base, an adhesive attaches the pedestal and the expanded base to the substrate, a chip is mounted on the pedestal and wire bonded to the substrate, an encapsulant is molded on the chip and solder balls are placed on the substrate. The pedestal extends through the window opening, the substrate is supported by the expanded base and the solder balls are located between the expanded base and the perimeter of the substrate. The heat from the chip flows through the pedestal to the expanded base to the PCB. However, since the expanded base must leave room for the solder balls, the expanded base protrudes below the substrate only between the central window and the innermost solder ball. Consequently, the substrate is unbalanced and wobbles and warps during manufacture. This creates enormous difficulties with chip mounting, wire bonding and encapsulant molding. Furthermore, the expanded base may be bent by the encapsulant molding and may impede soldering the package to the next level assembly as the solder balls collapse. As a result, the package suffers from high yield loss, poor reliability and excessive cost.

U.S. Patent Application Publication No. 2007/0267642 to Erchak et al. discloses a light emitting device assembly in which a base with an inverted T-like shape includes a substrate, a protrusion and an insulative layer with an aperture, electrical contacts are mounted on the insulative layer, a package with an aperture and a transparent lid is mounted on the electrical contacts and an LED chip is mounted on the protrusion and wire bonded to the substrate. The protrusion is adjacent to the substrate and extends through the apertures in the insulative layer and the package into the package, the insulative layer is mounted on the substrate, the electrical contacts are mounted on the insulative layer and the package is mounted on the electrical contacts and spaced from the insulative layer. The heat from the chip flows through the protrusion to the substrate to a heat sink. However, the electrical contacts are difficult to mount on the insulating layer, difficult to electrically connect to the next level assembly and fail to provide multi-layer routing.

Conventional packages and thermal boards thus have major deficiencies. For instance, dielectrics with low thermal conductivity such as epoxy limit heat dissipation, whereas dielectrics with higher thermal conductivity such as epoxy filled with ceramic or silicon carbide have low adhesion and are prohibitively expensive for high volume manufacture. The dielectric may delaminate during manufacture or prematurely during operation due to the heat. The substrate may have single layer circuitry with limited routing capability or multi-layer circuitry with thick dielectric layers which reduce heat dissipation. The heat spreader may be inefficient, cumbersome or difficult to thermally connect to the next level assembly. The manufacturing process may be unsuitable for low cost, high volume manufacture.

In view of the various development stages and limitations in currently available packages and thermal boards for high power semiconductor devices, there is a need for a semiconductor chip assembly that is cost effective, reliable, manufacturable, versatile, provides flexible signal routing and has excellent heat spreading and dissipation.

SUMMARY OF THE INVENTION

The present invention provides a semiconductor chip assembly that includes a semiconductor device, a heat spreader, a conductive trace and first and second adhesives. The heat spreader includes a first post, a second post and a base. The conductive trace includes a pad and a terminal. The semiconductor device is electrically connected to the conductive trace and thermally connected to the heat spreader. The first post extends from the base in a first vertical direction into a first opening in the first adhesive and is located within a periphery of the second post, the second post extends from the base in a second vertical direction into a second opening in the second adhesive and the base is sandwiched between and extends laterally from the posts. The conductive trace provides signal routing between the pad and the terminal.

In accordance with an aspect of the present invention, a semiconductor chip assembly includes a semiconductor device, first and second adhesives, a heat spreader and a conductive trace. The first adhesive includes a first opening. The second adhesive includes a second opening. The heat spreader includes a first post, a second post and a base, wherein (i) the first post is adjacent to the base, extends vertically from the base in a first vertical direction, is located within a periphery of the second post and has a surface area that is less than one-half of a surface area of the second post, (ii) the second post is adjacent to the base and extends vertically from the base in a second vertical direction opposite the first vertical direction and (iii) the base is sandwiched between the posts and extends laterally from the posts in lateral directions orthogonal to the vertical directions. The conductive trace includes a pad, a terminal and an electrical interconnect, wherein an electrically conductive path between the pad and the terminal includes the electrical interconnect.

The semiconductor device is mounted on the first post, extends vertically beyond the base in the first vertical direction, extends laterally within peripheries of the posts, is electrically connected to the pad and thereby electrically connected to the terminal and is thermally connected to the first post and thereby thermally connected to the second post. The first adhesive extends vertically beyond the base in the first vertical direction, extends laterally from the first post to or beyond the terminal and is sandwiched between the base and the pad. The second adhesive extends vertically beyond the base in the second vertical direction, extends laterally from the second post to or beyond the terminal and is sandwiched between the base and the terminal. The pad extends vertically beyond the base in the first vertical direction, the terminal extends vertically beyond the base in the second vertical direction and the electrical interconnect extends through the adhesives and the base and is spaced from and electrically isolated from the base. The first post extends into the first opening, the second post extends into the second opening and the base is sandwiched between the adhesives and covers the semiconductor device in the second vertical direction.

In accordance with another aspect of the present invention, a semiconductor chip assembly includes a semiconductor device, first and second adhesives, a heat spreader and a conductive trace. The first adhesive includes a first opening. The second adhesive includes a second opening. The heat spreader includes a first post, a second post, a first cap, a second cap and a base, wherein (i) the first post is adjacent to and integral with the base, extends vertically from the base in a first vertical direction, is sandwiched between the base and the first cap, is located within a periphery of the second post and has a surface area that is less than one-half of a surface area of the second post, (ii) the second post is adjacent to and integral with the base, extends vertically from the base in a second vertical direction opposite the first vertical direction and is sandwiched between the base and the second cap, (iii) the base is sandwiched between the posts and extends laterally from the posts in lateral directions orthogonal to the vertical directions, (iv) the first cap is adjacent to the first post, covers the first post in the first vertical direction and extends laterally from the first post and (v) the second cap is adjacent to the second post, covers the second post in the second vertical direction and extends laterally from the second post. The conductive trace includes a pad, a terminal and an electrical interconnect, wherein an electrically conductive path between the pad and the terminal includes the electrical interconnect.

The semiconductor device is mounted on the first cap, extends vertically beyond the first cap in the first vertical direction, extends laterally within peripheries of the posts and the caps, is located within peripheries of the second post and the second cap, is electrically connected to the pad and thereby electrically connected to the terminal and is thermally connected to the first cap and thereby thermally connected to the second cap. The first adhesive contacts the first post and the base, is spaced from the second post, extends vertically beyond the base in the first vertical direction, extends laterally from the first post to or beyond the terminal and is sandwiched between the base and the pad. The second adhesive contacts the second post and the base, is spaced from the first post, extends vertically beyond the base in the second vertical direction, extends laterally from the second post to or beyond the terminal and is sandwiched between the base and the terminal. The pad extends vertically beyond the first adhesive in the first vertical direction, the terminal extends vertically beyond the second adhesive in the second vertical direction and the electrical interconnect extends through the adhesives and the base and is spaced from and electrically isolated from the base. The first post extends into the first opening, the second post extends into the second opening, the first cap extends vertically beyond the first adhesive in the first vertical direction, the second cap extends vertically beyond the second adhesive in the second vertical direction and the base is sandwiched between the adhesives and covers the semiconductor device in the second vertical direction.

The first cap can have a rectangular or square shape and the first post can have a circular shape. In this instance, the first cap can be sized and shaped to accommodate a thermal contact surface of the semiconductor device whereas the first post is not sized and shaped to accommodate the thermal contact surface of the semiconductor device. Likewise, the second cap can have a rectangular or square shape and the second post can have a circular shape. In this instance, the second cap can be sized and shaped to accommodate a thermal contact surface of a heat sink whereas the second post is not sized and shaped to accommodate the thermal contact surface of the heat sink. Furthermore, the first cap can be located within the periphery of the second post. In any case, the caps are thermally connected to one another by the posts and the base.

The heat spreader can consist of the posts and the base or the posts, the base and the caps. The heat spreader can also consist essentially of copper, aluminum or copper/nickel/aluminum. The heat spreader can also consist of a buried copper, aluminum or copper/nickel/aluminum core shared by the posts and the base and plated surface contacts that consist of gold, silver and/or nickel at the caps. In any case, the heat spreader provides heat dissipation and spreading from the semiconductor device to the next level assembly.

The semiconductor device can be mounted on the heat spreader and the conductive trace. For instance, the semiconductor device can be mounted on the first cap and the pad, extend beyond the first cap and the pad in the first vertical direction, be electrically connected to the pad using a first solder joint and be thermally connected to the heat spreader using a second solder joint. Alternatively, the semiconductor device can be mounted on the first cap but not the pad, extend beyond the first cap and the pad in the first vertical direction, be electrically connected to the pad using a wire bond and be thermally connected to the first cap using a die attach.

The semiconductor device can be a packaged or unpackaged semiconductor chip. For instance, the semiconductor device can be an LED package that includes an LED chip, is mounted on the first cap and the pad, extends beyond the first cap and the pad in the first vertical direction, is electrically connected to the pad using a first solder joint and is thermally connected to the first cap using a second solder joint. Alternatively, the semiconductor device can be a semiconductor chip such as an LED chip that is mounted on the first cap but not the pad, extends beyond the first cap and the pad in the first vertical direction, is electrically connected to the pad using a wire bond and is thermally connected to the first cap using a die attach.

The first adhesive can contact the first post, the first cap and the base and be spaced from the second post, the second adhesive, the electrical interconnect and the terminal. The first adhesive can also contact and be sandwiched between the first post and the pad, between the base and the pad and between the base and the first cap. The first adhesive can also cover and surround the first post in the lateral directions, cover the base outside the first post in the first vertical direction and cover the first cap outside the first post in the second vertical direction. The first adhesive can also conformally coat the sidewalls of the first post.

The first adhesive can extend laterally from the first post to or beyond the terminal. For instance, the first adhesive and the terminal can extend to peripheral edges of the assembly. In this instance, the first adhesive extends laterally from the first post to the terminal. Alternatively, the first adhesive can extend to peripheral edges of the assembly and the terminal can be spaced from the peripheral edges of the assembly. In this instance, the first adhesive extends laterally from the first post beyond the terminal.

The first adhesive alone can intersect an imaginary horizontal line between the first post and an insulative filler, an imaginary horizontal line between the first post and a peripheral edge of the assembly, an imaginary vertical line between the base and the pad and an imaginary vertical line between the base and the first cap.

The second adhesive can contact the second post, the second cap and the base and be spaced from the first post, the first adhesive, the electrical interconnect and the pad. The second adhesive can also contact and be sandwiched between the second post and the terminal, between the base and the terminal and between the base and the second cap. The second adhesive can also cover and surround the second post in the lateral directions, cover the base outside the second post in the second vertical direction and cover the second cap outside the second post in the first vertical direction. The second adhesive can also conformally coat the sidewalls of the second post.

The second adhesive can extend laterally from the second post to or beyond the terminal. For instance, the second adhesive and the terminal can extend to peripheral edges of the assembly. In this instance, the second adhesive extends laterally from the second post to the terminal. Alternatively, the second adhesive can extend to peripheral edges of the assembly and the terminal can be spaced from the peripheral edges of the assembly. In this instance, the second adhesive extends laterally from the second post beyond the terminal.

The second adhesive alone can intersect an imaginary horizontal line between the second post and an insulative filler, an imaginary horizontal line between the second post and a peripheral edge of the assembly, an imaginary vertical line between the base and the terminal and an imaginary vertical line between the base and the second cap.

The posts can be integral with the base. For instance, the posts and the base can be a single-piece metal or include a single-piece metal at their interface, and the single-piece metal can be copper. The first post can be coplanar with the first adhesive at the first cap and at the base and second post can also be coplanar with the second adhesive at the second cap and at the base. The first post can also have a cut-off conical or pyramidal shape in which its diameter decreases as it extends in the first vertical direction from the base to the first cap and the second post can also have a cut-off conical or pyramidal shape in which its diameter decreases as it extends in the second vertical direction from the base to the second cap.

The base can cover the first post and the first adhesive in the second vertical direction, cover the second post and the second adhesive in the first vertical direction, support the posts and the adhesives and extend to peripheral edges of the assembly. The base can also be thicker than the pad, the terminal and the caps.

The pad can be located within the periphery of the second post and the terminal can be located outside the periphery of the second post. Furthermore, the first adhesive can extend within and outside the periphery of the second post. In any case, the posts are asymmetric since the first post is substantially smaller than the second post.

The pad can contact or be spaced from the first adhesive and the terminal can contact or be spaced from the second adhesive. For instance, the pad can contact the first adhesive and the terminal can contact the second adhesive. Alternatively, the assembly can include first and second dielectric layers, wherein the pad is spaced from the first adhesive, the terminal is spaced from the second adhesive, the first dielectric layer contacts and is sandwiched between the pad and the first adhesive and is spaced from the first post and the base, the second dielectric layer contacts and is sandwiched between the terminal and the second adhesive and is spaced from the second post and the base, the dielectric layers are spaced from one another and the electrical interconnect extends through the dielectric layers. Furthermore, a first substrate can include the pad and the first dielectric layer and be a laminated structure that is spaced from the first post and the base and a second substrate can include the terminal and the second dielectric layer and be a laminated structure that is spaced from the second post and the base.

The pad and the first cap can have the same thickness where closest to one another, have different thickness where the first cap is adjacent to the first post and be coplanar with one another at a surface that faces in the first vertical direction.

The terminal and the second cap can have the same thickness where closest to one another, have different thickness where the second cap is adjacent to the second post and be coplanar with one another at a surface that faces in the second vertical direction.

The conductive trace can include a routing line that extends beyond the first adhesive in the first vertical direction and extends laterally in an electrically conductive path between the pad and the electrical interconnect Likewise, the conductive trace can include a routing line that extends beyond the second adhesive in the second vertical direction and extends laterally in an electrically conductive path between the terminal and the electrical interconnect. Furthermore, the electrical interconnect can be a plated through-hole that extends through and is spaced from the base and the adhesives and is located within an insulative filler that contacts and extends through the base and the adhesives.

The conductive trace can consist essentially of copper. The conductive trace can also include a buried copper core shared by the pad, the terminal and the electrical interconnect and plated surface contacts that consist of gold, silver and/or nickel at the pad and the terminal. In any case, the conductive trace provides signal routing between the pad and the terminal.

The pad can be an electrical contact for the semiconductor device, the terminal can be an electrical contact for the next level assembly, and the pad and the terminal can provide signal routing between the semiconductor device and the next level assembly.

The pad, the terminal and the caps can be the same metals and the posts and the base can be the same metal. For instance, the pad, the terminal and the caps can include a gold, silver or nickel surface layer and a buried copper core and be primarily copper, the posts and the base can be copper and the electrical interconnect can include copper. In this instance, a plated contact can include a gold or silver surface layer and a buried nickel layer that contacts and is sandwiched between the surface layer and the buried copper core or a nickel surface layer that contacts the buried copper core.

The heat spreader can include a copper core shared by the posts, the base and the caps and the conductive trace can include a copper core shared by the pad, the terminal and the electrical interconnect. For instance, the heat spreader can include a gold, silver or nickel surface layer at the caps, a buried copper core at the posts, the base and the caps and be primarily copper. In this instance, the first cap can include a plated contact as its surface layer and the second cap can include a plated contact as its surface layer. Likewise, the conductive trace can include a gold, silver or nickel surface layer at the pad and the terminal, a buried copper core at the pad, the terminal and the electrical interconnect and be primarily copper. In this instance, the pad can include a plated contact as its surface layer and the terminal can include a plated contact as its surface layer.

The assembly can be a first-level or second-level single-chip or multi-chip device. For instance, the assembly can be a first-level package that contains a single chip or multiple chips. Alternatively, the assembly can be a second-level module that contains a single LED package or multiple LED packages, and each LED package can contain a single LED chip or multiple LED chips.

The present invention provides a method of making a semiconductor chip assembly that includes providing first and second posts, first and second adhesives and a base, wherein the first post extends from the base in a first vertical direction into a first opening in the first adhesive and is located within a periphery of the second post, the second post extends from the base in a second vertical direction into a second opening in the second adhesive and the base is sandwiched between and extends laterally from the posts, then flowing and solidifying the adhesives, then providing a conductive trace that includes a pad and a terminal, wherein the pad extends beyond the base in the first vertical direction and the terminal extends beyond the base in the second vertical direction, providing a heat spreader that includes the posts and the base, then mounting a semiconductor device on the first post, electrically connecting the semiconductor device to the conductive trace and thermally connecting the semiconductor device to the heat spreader.

In accordance with an aspect of the present invention, a method of making a semiconductor chip assembly includes (1) providing a first post, a second post, a first adhesive, a second adhesive and a base, wherein (a) the first post is adjacent to the base, extends vertically from the base in a first vertical direction and extends into a first opening in the first adhesive, (b) the second post is adjacent to the base, extends vertically from the base in a second vertical direction opposite the first vertical direction and extends into a second opening in the second adhesive, (c) the first adhesive contacts the base, extends vertically beyond the base in the first vertical direction and is non-solidified, (d) the second adhesive contacts the base, extends vertically beyond the base in the second vertical direction and is non-solidified, (e) the base is sandwiched between the posts and between the adhesives and extends laterally from the posts in lateral directions orthogonal to the vertical directions, and (f) the first post and the first opening are located within a periphery of the second post, then (2) flowing the first adhesive, (3) flowing the second adhesive, (4) solidifying the adhesives, then (5) providing a conductive trace that includes a pad, a terminal and an electrical interconnect, wherein the pad extends vertically beyond the base in the first vertical direction, the terminal extends vertically beyond the base in the second vertical direction, the electrical interconnect extends through the adhesives and the base and is spaced from and electrically isolated from the base and an electrically conductive path between the pad and the terminal includes the electrical interconnect, (6) providing a heat spreader that includes the posts and the base, then (7) mounting a semiconductor device on the first post, wherein the semiconductor device extends vertically beyond the base in the first vertical direction, extends laterally within peripheries of the posts and the first post is sandwiched between the semiconductor device and the base, (8) electrically connecting the semiconductor device to the pad, thereby electrically connecting the semiconductor device to the terminal, and (9) thermally connecting the semiconductor device to the first post, thereby thermally connecting the semiconductor device to the second post.

Providing the conductive trace can providing selected portions of first and second conductive layers. Furthermore, the conductive layers can be provided before or after solidifying the adhesives.

For instance, the method can include contacting a first release sheet and the first adhesive, wherein the first adhesive contacts and is sandwiched between the first release sheet and the base, then flowing and solidifying the first adhesive, then removing the first release sheet from the first adhesive, then depositing a first conductive layer on the first adhesive and then providing the conductive trace with a selected portion of the first conductive layer. Likewise, the method can include contacting a second release sheet and the second adhesive, wherein the second adhesive contacts and is sandwiched between the second release sheet and the base, then flowing and solidifying the second adhesive, then removing the second release sheet from the second adhesive, then depositing a second conductive layer on the second adhesive and then providing the conductive trace with a selected portion of the second conductive layer. As a result, the first adhesive laminates only itself to the first post and the base, the second adhesive laminates only itself to the second post and the base and the conductive layers are provided after solidifying the adhesives. Furthermore, the conductive layers can be deposited by sputtering and then electroplating or by electroless plating and then electroplating.

As another example, the method can include providing a first conductive layer, then flowing the first adhesive into a first aperture that extends through the first conductive layer and then providing the conductive trace with a selected portion of the first conductive layer. Likewise, the method can include providing a second conductive layer, then flowing the second adhesive into a second aperture that extends through the second conductive layer and then providing the conductive trace with a selected portion of the second conductive layer. In this manner, the first adhesive laminates the first conductive layer to the first post and the base, the second adhesive laminates the second conductive layer to the second post and the base and the conductive layers are provided before solidifying the adhesives.

In accordance with another aspect of the present invention, a method of making a semiconductor chip assembly includes (1) providing a first post, a second post, a first adhesive, a second adhesive, a first conductive layer, a second conductive layer and a base, wherein (a) the first post is adjacent to and integral with the base, extends vertically from the base in a first vertical direction, extends into a first opening in the first adhesive and is aligned with a first aperture in the first conductive layer, (b) the second post is adjacent to and integral with the base, extends vertically from the base in a second vertical direction opposite the first vertical direction, extends into a second opening in the second adhesive and is aligned with a second aperture in the second conductive layer, (c) the first adhesive contacts the base, is sandwiched between the base and the first conductive layer, extends vertically beyond the base in the first vertical direction and is non-solidified, (d) the second adhesive contacts the base, is sandwiched between the base and the second conductive layer, extends vertically beyond the base in the second vertical direction and is non-solidified, (e) the first conductive layer extends vertically beyond the first adhesive in the first vertical direction, (f) the second conductive layer extends vertically beyond the second adhesive in the second vertical direction, (g) the base is sandwiched between the posts, between the adhesives and between the conductive layers and extends laterally from the posts in lateral directions orthogonal to the vertical directions, and (h) the first post, the first opening and the first aperture are located within a periphery of the second post, then (2) flowing the first adhesive in the first vertical direction into a first gap located in the first aperture between the first post and the first conductive layer, (3) flowing the second adhesive in the second vertical direction into a second gap located in the second aperture between the second post and the second conductive layer, (4) solidifying the adhesives, thereby mechanically attaching the first conductive layer to the first post and the base using the first adhesive and mechanically attaching the second conductive layer to the second post and the base using the second adhesive, then (5) providing a conductive trace that includes a pad, a terminal, an electrical interconnect and selected portions of the conductive layers, wherein the pad extends vertically beyond the base in the first vertical direction, the terminal extends vertically beyond the base in the second vertical direction, the electrical interconnect extends through the adhesives and the base and is spaced from and electrically isolated from the base and an electrically conductive path between the pad and the terminal includes the electrical interconnect, (6) providing a heat spreader that includes the posts and the base, then (7) mounting a semiconductor device on the first post, wherein the semiconductor device extends vertically beyond the base in the first vertical direction, extends laterally within peripheries of the posts and the first post is sandwiched between the semiconductor device and the base, (8) electrically connecting the semiconductor device to the pad, thereby electrically connecting the semiconductor device to the terminal, and (9) thermally connecting the semiconductor device to the first post, thereby thermally connecting the semiconductor device to the second post.

Providing the first conductive layer can include mounting the first conductive layer alone on the first adhesive, or alternatively, attaching the first conductive layer to a first carrier, then mounting the first conductive layer and the first carrier on the first adhesive such that the first conductive layer contacts and is sandwiched between the first adhesive and the first carrier, and then, after solidifying the first adhesive, removing the first carrier and then providing the conductive trace. As another alternative, mounting the first conductive layer can include mounting the first conductive layer and a first dielectric layer on the first adhesive such that the first dielectric layer contacts and is sandwiched between the first conductive layer and the first adhesive.

Providing the second conductive layer can include mounting the second conductive layer alone on the second adhesive, or alternatively, attaching the second conductive layer to a second carrier, then mounting the second conductive layer and the second carrier on the second adhesive such that the second conductive layer contacts and is sandwiched between the second adhesive and the second carrier, and then, after solidifying the second adhesive, removing the second carrier and then providing the conductive trace. As another alternative, mounting the second conductive layer can include mounting the second conductive layer and a second dielectric layer on the second adhesive such that the second dielectric layer contacts and is sandwiched between the second conductive layer and the second adhesive.

In accordance with another aspect of the present invention, a method of making a semiconductor chip assembly includes (1) providing a first post, a second post, a first adhesive, a second adhesive, a first conductive layer, a second conductive layer and a base, wherein (a) the first post is adjacent to and integral with the base, extends vertically from the base in a first vertical direction, extends into a first opening in the first adhesive and is aligned with a first aperture in the first conductive layer, (b) the second post is adjacent to and integral with the base, extends vertically from the base in a second vertical direction opposite the first vertical direction, extends into a second opening in the second adhesive and is aligned with a second aperture in the second conductive layer, (c) the first adhesive contacts the base, is sandwiched between the base and the first conductive layer, extends vertically beyond the base in the first vertical direction and is non-solidified, (d) the second adhesive contacts the base, is sandwiched between the base and the second conductive layer, extends vertically beyond the base in the second vertical direction and is non-solidified, (e) the first conductive layer extends vertically beyond the first adhesive in the first vertical direction, (f) the second conductive layer extends vertically beyond the second adhesive in the second vertical direction, (g) the base is sandwiched between the posts, between the adhesives and between the conductive layers and extends laterally from the posts in lateral directions orthogonal to the vertical directions, and (h) the first post, the first opening and the first aperture are located within a periphery of the second post, then (2) flowing the first adhesive in the first vertical direction into a first gap located in the first aperture between the first post and the first conductive layer, (3) flowing the second adhesive in the second vertical direction into a second gap located in the second aperture between the second post and the second conductive layer, (4) solidifying the adhesives, thereby mechanically attaching the first conductive layer to the first post and the base using the first adhesive and mechanically attaching the second conductive layer to the second post and the base using the second adhesive, then (5) providing a conductive trace that includes a pad, a terminal, an electrical interconnect and selected portions of the conductive layers, wherein the pad extends vertically beyond the first adhesive in the first vertical direction, the terminal extends vertically beyond the second adhesive in the second vertical direction, the electrical interconnect extends through the adhesives and the base and is spaced from and electrically isolated from the base and an electrically conductive path between the pad and the terminal includes the electrical interconnect, (6) providing a heat spreader that includes the posts, the base, a first cap, a second cap and selected portions of the conductive layers, wherein the first cap is adjacent to the first post, covers the first post in the first vertical direction, extends laterally from the first post and extends vertically beyond the first adhesive in the first vertical direction and the second cap is adjacent to the second post, covers the second post in the second vertical direction, extends laterally from the second post and extends vertically beyond the second adhesive in the second vertical direction, then (7) mounting a semiconductor device on the first cap, wherein the semiconductor device extends vertically beyond the first cap in the first vertical direction and extends laterally within peripheries of the posts and the caps and the first post and the first cap are sandwiched between the semiconductor device and the base, (8) electrically connecting the semiconductor device to the pad, thereby electrically connecting the semiconductor device to the terminal, and (9) thermally connecting the semiconductor device to the first cap, thereby thermally connecting the semiconductor device to the second cap.

In accordance with another aspect of the present invention, a method of making a semiconductor chip assembly includes (1) providing a first post, a second post, a first adhesive, a second adhesive, a first conductive layer, a second conductive layer and a base, wherein (a) the first post is adjacent to and integral with the base, extends vertically from the base in a first vertical direction, extends into a first opening in the first adhesive and is aligned with a first aperture in the first conductive layer, (b) the second post is adjacent to and integral with the base, extends vertically from the base in a second vertical direction opposite the first vertical direction, extends into a second opening in the second adhesive and is aligned with a second aperture in the second conductive layer, (c) the first adhesive contacts the base, is sandwiched between the base and the first conductive layer, extends vertically beyond the base in the first vertical direction and is non-solidified, (d) the second adhesive contacts the base, is sandwiched between the base and the second conductive layer, extends vertically beyond the base in the second vertical direction and is non-solidified, (e) the first conductive layer extends vertically beyond the first adhesive in the first vertical direction, (f) the second conductive layer extends vertically beyond the second adhesive in the second vertical direction, (g) the base is sandwiched between the posts, between the adhesives and between the conductive layers and extends laterally from the posts in lateral directions orthogonal to the vertical directions, and (h) the first post, the first opening and the first aperture are located within a periphery of the second post, then (2) applying heat to melt the adhesives, (3) moving the conductive layers towards one another, thereby (a) moving the first post in the first vertical direction in the first aperture, (b) moving the second post in the second vertical direction in the second aperture, (c) applying pressure to the molten first adhesive between the base and the first conductive layer and (d) applying pressure to the molten second adhesive between the base and the second conductive layer, wherein (e) the pressure between the base and the first conductive layer forces the molten first adhesive to flow in the first vertical direction into a first gap located in the first aperture between the first post and the first conductive layer and (f) the pressure between the base and the second conductive layer forces the molten second adhesive to flow in the second vertical direction into a second gap located in the second aperture between the second post and the second conductive layer, (4) applying heat to solidify the molten adhesives, thereby mechanically attaching the first conductive layer to the first post and the base using the first adhesive and mechanically attaching the second conductive layer to the second post and the base using the second adhesive, then (5) providing a conductive trace that includes a pad, a terminal and an electrical interconnect, wherein the pad includes a selected portion of the first conductive layer and extends vertically beyond the first adhesive in the first vertical direction, the terminal includes a selected portion of the second conductive layer and extends vertically beyond the second adhesive in the second vertical direction, the electrical interconnect extends through the adhesives and the base and is spaced from and electrically isolated from the base and an electrically conductive path between the pad and the terminal includes the electrical interconnect, (6) providing a heat spreader that includes the posts, the base, a first cap and a second cap, wherein the first cap is adjacent to the first post, covers the first post in the first vertical direction, extends laterally from the first post, extends vertically beyond the first adhesive in the first vertical direction and includes a selected portion of the first conductive layer and the second cap is adjacent to the second post, covers the second post in the second vertical direction, extends laterally from the second post, extends vertically beyond the second adhesive in the second vertical direction and includes a selected portion of the second conductive layer, then (7) mounting a semiconductor device on the first cap, wherein the semiconductor device extends vertically beyond the first cap in the first vertical direction and extends laterally within peripheries of the posts and the caps and the first post and the first cap are sandwiched between the semiconductor device and the base, (8) electrically connecting the semiconductor device to the pad, thereby electrically connecting the semiconductor device to the terminal, and (9) thermally connecting the semiconductor device to the first cap, thereby thermally connecting the semiconductor device to the second cap.

Providing the posts and the base can include providing a metal plate, forming a first etch mask on the metal plate that selectively exposes the metal plate in the first vertical direction and defines the first post, forming a second etch mask on the metal plate that selectively exposes the metal plate in the second vertical direction and defines the second post, then etching the metal plate in a first pattern defined by the first etch mask and a second pattern defined by the second etch mask, thereby forming a first recess in the metal plate that extends into but not through the metal plate and a second recess in the metal plate that extends into but not through the metal plate, wherein the first post includes an unetched portion of the metal plate that protrudes beyond the base in the first vertical direction and is laterally surrounded by the first recess, the second post includes an unetched portion of the metal plate that protrudes beyond the base in the second vertical direction and is laterally surrounded by the second recess and the base includes an unetched portion of the metal plate that is sandwiched between the posts and between the recesses, and then removing the etch masks.

Providing the first adhesive can include providing a first prepreg with a first uncured epoxy and then inserting the first post into the first opening, flowing the first adhesive can include melting the first uncured epoxy and compressing the first uncured epoxy between the first conductive layer and the base and solidifying the first adhesive can include curing the molten first uncured epoxy Likewise, providing the second adhesive can include providing a second prepreg with a second uncured epoxy and then inserting the second post into the second opening, flowing the second adhesive can include melting the second uncured epoxy and compressing the second uncured epoxy between the second conductive layer and the base and solidifying the second adhesive can include curing the molten second uncured epoxy.

Providing the first conductive layer can include contacting the first conductive layer and the first adhesive, wherein the first aperture extends through the first conductive layer alone, and then flowing the first adhesive into the first gap. Likewise, providing the second conductive layer can include contacting the second conductive layer and the second adhesive, wherein the second aperture extends through the second conductive layer alone, and then flowing the second adhesive into the second gap. In this manner, the first adhesive laminates the first conductive layer alone to the first post and the base and the second adhesive laminates the second conductive layer alone to the second post and the base.

Providing the first conductive layer can include providing a first substrate that includes the first conductive layer and a first dielectric layer and then contacting the first dielectric layer and the first adhesive, wherein the first dielectric layer contacts and is sandwiched between the first conductive layer and the first adhesive and is solidified and the first aperture extends through the first conductive layer and the first dielectric layer, and then flowing the first adhesive into the first gap Likewise, providing the second conductive layer can include providing a second substrate that includes the second conductive layer and a second dielectric layer and then contacting the second dielectric layer and the second adhesive, wherein the second dielectric layer contacts and is sandwiched between the second conductive layer and the second adhesive and is solidified and the second aperture extends through the second conductive layer and the second dielectric layer, and then flowing the second adhesive into the second gap. In this manner, the first adhesive laminates the first conductive layer and the first dielectric layer to the first post and the base and the second adhesive laminates the second conductive layer and the second dielectric layer to the second post and the base.

Providing the pad can include removing selected portions of the first conductive layer after solidifying the first adhesive. The removing can include applying a wet chemical etch to the first conductive layer using an etch mask that defines the pad such that the pad includes a selected portion of the first conductive layer.

Providing the terminal can include removing selected portions of the second conductive layer after solidifying the second adhesive. The removing can include applying a wet chemical etch to the second conductive layer using an etch mask that defines the terminal such that the terminal includes a selected portion of the second conductive layer.

Providing the first cap can include removing selected portions of the first conductive layer after solidifying the first adhesive. The removing can include applying a wet chemical etch to the first conductive layer using an etch mask that defines the first cap such that the first cap includes a selected portion of the first conductive layer.

Providing the second cap can include removing selected portions of the second conductive layer after solidifying the second adhesive. The removing can include applying a wet chemical etch to the second conductive layer using an etch mask that defines the second cap such that the second cap includes a selected portion of the second conductive layer.

Providing the pad and the first cap can include removing selected portions of the first conductive layer using an etch mask that defines the pad and the first cap. Thus, the pad and the first cap can be formed simultaneously using the same etch mask and wet chemical etch.

Providing the terminal and the second cap can include removing selected portions of the second conductive layer using an etch mask that defines the terminal and the second cap. Thus, the terminal and the second cap can be formed simultaneously using the same etch mask and wet chemical etch.

Providing the pad and the first cap can include grinding the first post, the first adhesive and the first conductive layer after solidifying the first adhesive such that the first post, the first adhesive and the first conductive layer are laterally aligned with one another at a lateral surface that faces in the first vertical direction, and then removing selected portions of the first conductive layer such that the pad and the first cap include selected portions of the first conductive layer. The grinding can include grinding the first adhesive without grinding the first post and then grinding the first post, the first adhesive and the first conductive layer. The removing can include applying a wet chemical etch to the first conductive layer using an etch mask that defines the pad and the first cap.

Providing the terminal and the second cap can include grinding the second post, the second adhesive and the second conductive layer after solidifying the second adhesive such that the second post, the second adhesive and the second conductive layer are laterally aligned with one another at a lateral surface that faces in the second vertical direction, and then removing selected portions of the second conductive layer such that the terminal and the second cap include selected portions of the second conductive layer. The grinding can include grinding the second adhesive without grinding the second post and then grinding the second post, the second adhesive and the second conductive layer. The removing can include applying a wet chemical etch to the second conductive layer using an etch mask that defines the terminal and the second cap.

Providing the pad and the first cap can include depositing a first plated layer on the first post, the first adhesive and the first conductive layer after the grinding and then removing selected portions of the first conductive layer and the first plated layer such that the pad and the first cap include selected portions of the first conductive layer and the first plated layer. Depositing the first plated layer can include electrolessly plating an electrolessly plated layer on the first post, the first adhesive and the first conductive layer and then electroplating an electroplated layer on the electrolessly plated layer. The removing can include applying the wet chemical etch to the first conductive layer and the first plated layer using the etch mask to define the pad and the first cap.

Providing the terminal and the second cap can include depositing a second plated layer on the second post, the second adhesive and the second conductive layer after the grinding and then removing selected portions of the second conductive layer and the second plated layer such that the terminal and the second cap include selected portions of the second conductive layer and the second plated layer. Depositing the second plated layer can include electrolessly plating an electrolessly plated layer on the second post, the second adhesive and the second conductive layer and then electroplating an electroplated layer on the electrolesssly plated layer. The removing can include applying the wet chemical etch to the second conductive layer and the second plated layer using the etch mask to define the terminal and the second cap.

Providing the conductive trace can include providing a hole that extends through the base, the adhesives and the conductive layers after solidifying the adhesives, then depositing a plated metal on the posts, the adhesives and the conductive layers, wherein the plated metal forms a first plated layer that covers the first post in the first vertical direction, a second plated layer that covers the second post in the second vertical direction and the electrical interconnect as a plated through-hole in the hole, then forming a first etch mask on the first plated layer that defines the pad, forming a second etch mask on the second plated layer that defines the terminal, then etching the first conductive layer and the first plated layer in a first pattern defined by the first etch mask and etching the second conductive layer and the second plated layer in a second pattern defined by the second etch mask and then removing the etch masks.

Providing the hole can include providing an inner hole that extends through and is coaxial with an outer hole. For instance, providing the hole can include forming an outer hole that extends through and is adjacent to the base, the adhesives and the conductive layers after solidifying the adhesives, then depositing an insulative filler into the outer hole, and then forming the inner hole that extends through the outer hole, extends through and is adjacent to the insulative filler, extends through and is spaced from the base, the adhesives and the conductive layers and provides the hole. Furthermore, the inner hole can be formed in a single step by mechanical drilling, laser drilling or plasma etching and the outer hole can be formed in a single step by mechanical drilling or laser drilling or multiple steps in which the base, the first conductive layer and/or the second conductive layer are opened by wet chemical etching and the adhesives are opened by laser drilling or plasma etching.

Etching the first conductive layer and the first plated layer can include exposing the first adhesive in the first vertical direction without exposing the second adhesive in the first vertical direction, and etching the second conductive layer and the second plated layer can include exposing the second adhesive in the second vertical direction without exposing the first adhesive in the second vertical direction.

The pad can be formed before, during or after the terminal is formed. Thus, the pad and the terminal can be formed simultaneously using the same wet chemical etch and different etch masks or sequentially using different etch masks. Likewise, the first cap can be formed before, during or after the second cap is formed. Thus, the caps can be formed simultaneously using the same wet chemical etch and different etch masks or sequentially using different etch masks. Similarly, the pad, the terminal and the caps can be formed simultaneously or sequentially.

Flowing the first adhesive can include filling the first gap with the first adhesive. Flowing the first adhesive can also include squeezing the first adhesive through the first gap, beyond the first post and the first conductive layer in the first vertical direction and on surface portions of the first post and the first conductive layer adjacent to the first gap that face in the first vertical direction.

Flowing the second adhesive can include filling the second gap with the second adhesive. Flowing the second adhesive can also include squeezing the second adhesive through the second gap, beyond the second post and the second conductive layer in the second vertical direction and on surface portions of the second post and the second conductive layer adjacent to the second gap that face in the second vertical direction.

Solidifying the first adhesive can include mechanically bonding the first post and the base to the first conductive layer Likewise, solidifying the second adhesive can include mechanically bonding the second post and the base to the second conductive layer.

Mounting the semiconductor device on the first post can include mounting the semiconductor device on the first cap and thus the first post. Mounting the semiconductor device can also include positioning the semiconductor device within the peripheries of the posts and caps and outside the periphery of the conductive trace, or alternatively, positioning the semiconductor device to extend within and outside the peripheries of the first post, the first cap and the pad, within the peripheries of the second post and the second cap and outside the periphery of the terminal. Thus, the semiconductor device can be located within or extend within and outside the peripheries of the first post and the first cap yet be located within the peripheries of the second post and the second cap. In any case, the semiconductor device extends laterally within the peripheries of the posts and the caps.

Mounting the semiconductor device can include providing a first solder joint between an LED package that includes an LED chip and the pad and a second solder joint between the LED package and the first cap, electrically connecting the semiconductor device can include providing the first solder joint between the LED package and the pad, and thermally connecting the semiconductor device can include providing the second solder joint between the LED package and the first cap.

Mounting the semiconductor device can include providing a die attach between a semiconductor chip such as an LED chip and the first cap, electrically connecting the semiconductor device can include providing a wire bond between the chip and the pad, and thermally connecting the semiconductor device can include providing the die attach between the chip and the first cap.

The semiconductor device can be encapsulated by providing an encapsulant on the thermal board that covers the semiconductor device in the first vertical direction.

The first adhesive can contact the base, the first post and the first cap, be spaced from the terminal, the second post and the second adhesive, cover and surround the first post in the lateral directions and extend to peripheral edges of the assembly after the assembly is manufactured and detached from other assemblies in a batch.

The second adhesive can contact the base, the second post and the second cap, be spaced from the pad, the first post and the first adhesive, cover and surround the second post in the lateral directions and extend to peripheral edges of the assembly after the assembly is manufactured and detached from other assemblies in a batch.

The base can cover the semiconductor device, the first post, the first cap and the pad in the second vertical direction, cover the second post, the second cap and the terminal in the first vertical direction, support the adhesives and extend to peripheral edges of the assembly after the assembly is manufactured and detached from other assemblies in a batch.

The present invention has numerous advantages. The heat spreader can provide excellent heat spreading and heat dissipation without heat flow through the adhesives. As a result, the adhesives can be a low cost dielectric with low thermal conductivity and not prone to delamination. The posts and the base can be integral with one another, thereby enhancing reliability. The first post can provide thermal expansion matching with a semiconductor device mounted thereon, thereby increasing reliability. The first cap can be customized for the semiconductor device, thereby enhancing the thermal connection. The first adhesive can be sandwiched between the base and the pad and the second adhesive can be sandwiched between the base and the terminal, thereby providing a robust mechanical bond between the heat spreader and the conductive trace. The conductive trace can provide signal routing with simple circuitry patterns or flexible multi-layer signal routing with complex circuitry patterns. The conductive trace can also provide vertical signal routing between the pad and the terminal. The electrical interconnect can be a plated through-hole formed after the adhesives are solidified and remain a hollow tube or be split at a peripheral edge of the assembly. As a result, a solder joint subsequently reflowed on the terminal can wet and flow into the plated through-hole without creating a buried void in the solder joint beneath the plated through-hole that might otherwise occur if the plated through-hole is filled with the adhesives or another non-wettable insulator, thereby increasing reliability. The base can provide mechanical support for the conductive layers and the adhesives, thereby preventing warping. The assembly can be manufactured using low temperature processes which reduces stress and improves reliability. The assembly can also be manufactured using well-controlled processes which can be easily implemented by circuit board, lead frame and tape manufacturers.

These and other features and advantages of the present invention will be further described and more readily apparent from a review of the detailed description of the preferred embodiments which follows.

BRIEF DESCRIPTION OF THE DRAWINGS

The following detailed description of the preferred embodiments of the present invention can best be understood when read in conjunction with the following drawings, in which.

DETAILED DESCRIPTION OF THE INVENTION

Figure 1A:
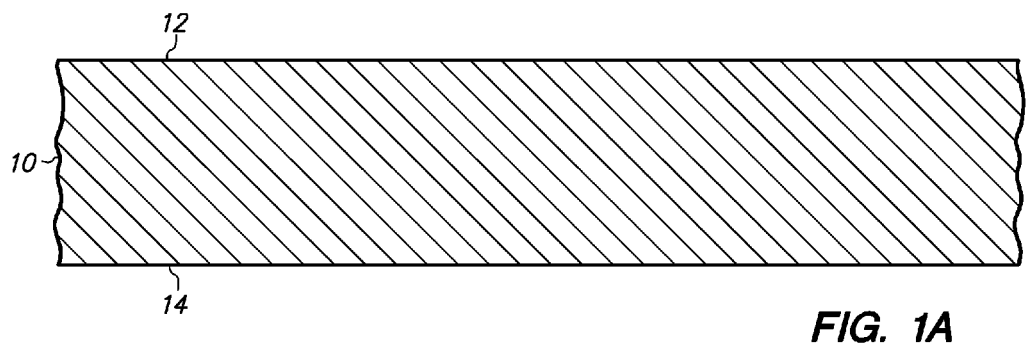
FIGS. 1A-1D are cross-sectional views showing a method of making first and second posts and a base in accordance with an embodiment of the present invention.
Figure 1B:
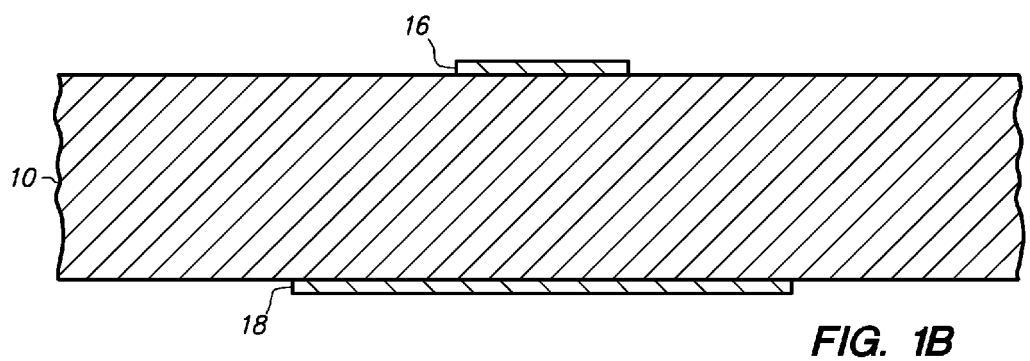
Figure 1C:
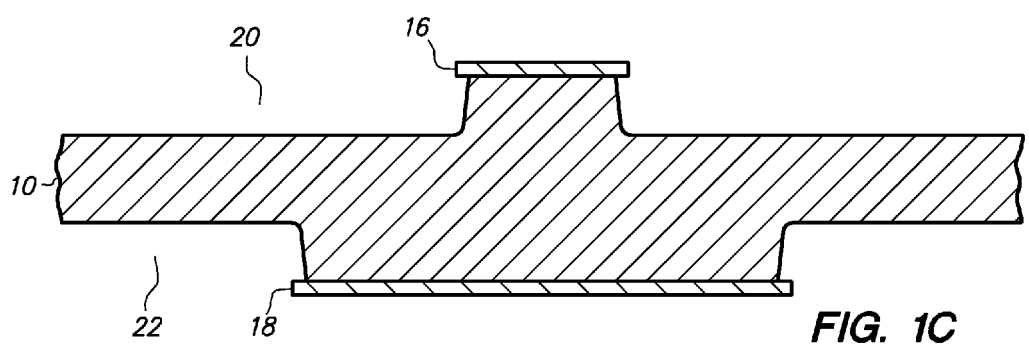
Figure 1D:
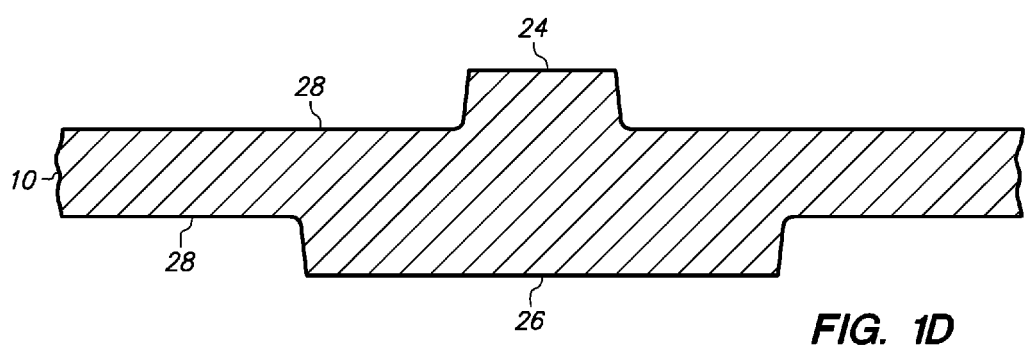
Figure 1E:
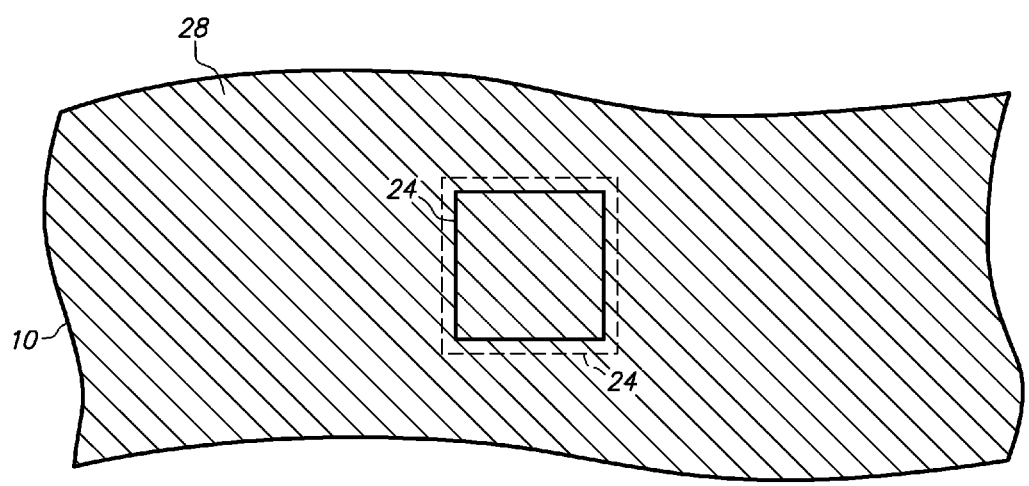
FIGS. 1E and 1F are top and bottom views, respectively, corresponding to FIG. 1D.
Figure 1F:
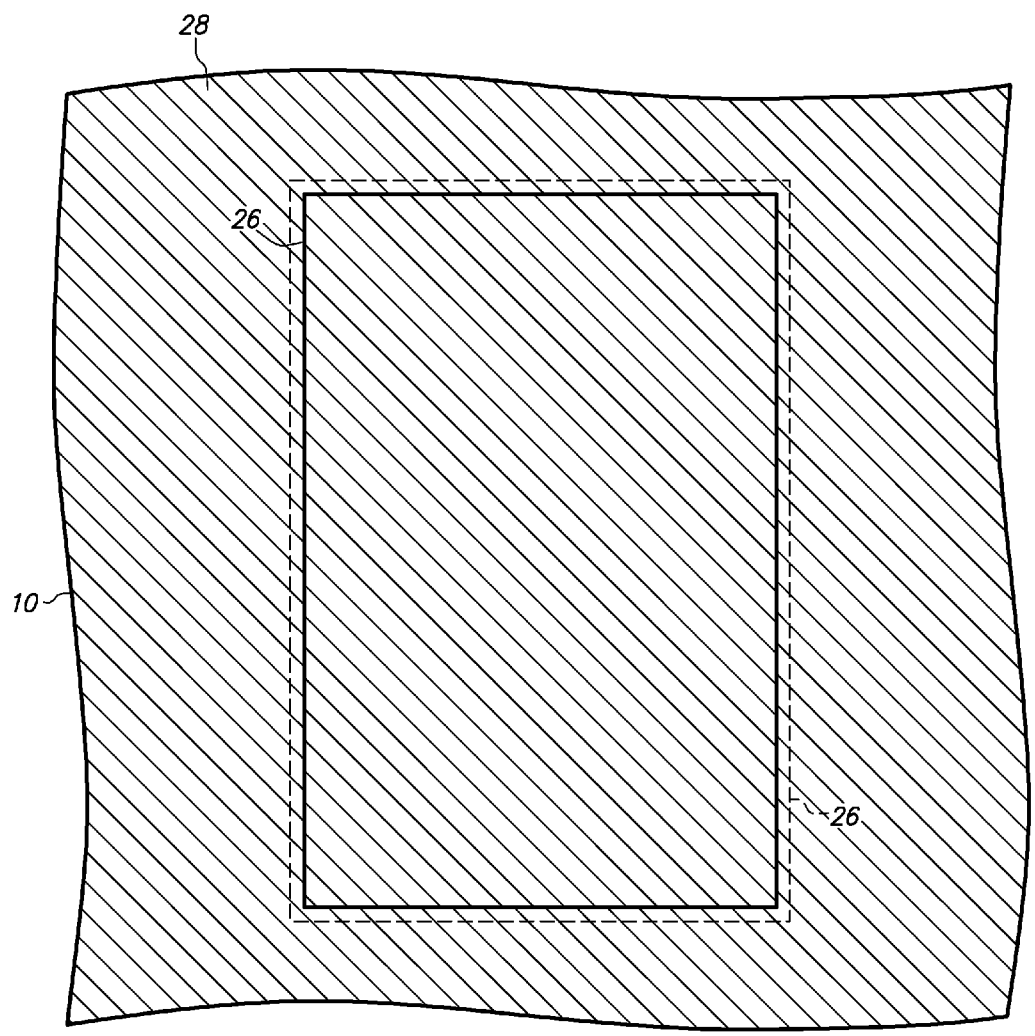

FIGS. 1A-1D are cross-sectional views showing a method of making first and second posts and a base in accordance with an embodiment of the present invention, and FIGS. 1E and 1F are top and bottom views, respectively, corresponding to FIG. 1D.

FIG. 1A. is a cross-sectional view of metal plate 10 which includes opposing major surfaces 12 and 14. Metal plate 10 is illustrated as a copper plate with a thickness of 500 microns. Copper has high thermal conductivity, good bondability and low cost. Metal plate 10 can be various metals such as copper, aluminum, alloy 42, iron, nickel, silver, gold, combinations thereof, and alloys thereof.

FIG. 1B is a cross-sectional view of etch masks 16 and 18 formed on metal plate 10. Etch masks 16 and 18 are illustrated as photoresist layers which are deposited on metal plate 10 using dry film lamination in which hot rolls simultaneously press photoresist layers 16 and 18 onto surfaces 12 and 14, respectively. Wet spin coating and curtain coating are also suitable deposition techniques. A first reticle (not shown) is positioned proximate to photoresist layer 16 and a second reticle (not shown) is positioned proximate to photoresist layer 18. Thereafter, photoresist layers 16 and 18 are patterned by selectively applying light through the first and second reticles, respectively, so that the photoresist portions exposed to the light are rendered insoluble, applying a developer solution to remove the photoresist portions that are unexposed to the light and remain soluble and then hard baking, as is conventional. As a result, photoresist layer 16 has a pattern that selectively exposes surface 12 and photoresist layer 18 has a pattern that selectively exposes surface 14.

FIG. 1C is a cross-sectional view of recesses 20 and 22 formed into but not through metal plate 10 by etching metal plate 10 in the patterns defined by etch masks 16 and 18, respectively. The etching is illustrated as a frontside and backside wet chemical etch. For instance, a top spray nozzle (not shown) and a bottom spray nozzle (not shown) can spray the wet chemical etch on the top and bottom of the structure, or the structure can be dipped in the wet chemical etch.

The wet chemical etch is highly selective of copper and etches 150 microns into metal plate 10 from the frontside and backside. As a result, recess 20 extends from surface 12 into but not through metal plate 10 and has a depth of 150 microns and recess 22 extends from surface 14 into but not through metal plate 10 and has a depth of 150 microns. The wet chemical etch also laterally undercuts metal plate 10 beneath etch mask 16 and above etch mask 18. A suitable wet chemical etch can be provided by a solution containing alkaline ammonia or a dilute mixture of nitric and hydrochloric acid. Likewise, the wet chemical etch can be acidic or alkaline. The optimal etch time for forming recesses 20 and 22 without excessively exposing metal plate 10 to the wet chemical etch can be established through trial and error.

FIGS. 1D, 1E and 1F are cross-sectional, top and bottom views, respectively, of metal plate 10 after etch masks 16 and 18 are removed. The photoresist layers are stripped using a solvent, such as a strong alkaline solution containing potassium hydroxide with a pH of 14, that is highly selective of photoresist with respect to copper.

Metal plate 10 as etched includes posts 24 and 26 and base 28.

Post 24 is an unetched portion of metal plate 10 defined by etch mask 16. Post 24 is adjacent to and integral with and protrudes above base 28 and is laterally surrounded by recess 20. Post 24 has a height of 150 microns (recess 20 depth), a length and width at its top surface (square portion of surface 12) of 1000 microns and a length and width at its bottom (square portion adjacent to base 28) of 1200 microns. Thus, post 24 has a cut-off pyramidal shape with tapered sidewalls in which its diameter decreases as it extends upwardly from base 28 to its flat square top surface. The tapered sidewalls arise from the lateral undercutting by the wet chemical etch beneath etch mask 16. The top surface is concentrically disposed within a periphery of the bottom (shown in phantom in FIG. 1E).

Post 26 is an unetched portion of metal plate 10 defined by etch mask 18. Post 26 is adjacent to and integral with and protrudes below base 28 and is laterally surrounded by recess 22. Post 26 has a height of 150 microns (recess 22 depth), a length and width at its bottom surface (rectangular portion of surface 14) of 3000×5000 microns and a length and width at its top (rectangular portion adjacent to base 28) of 3200×5200 microns. Thus, post 26 has a cut-off pyramidal shape with tapered sidewalls in which its diameter decreases as it extends downwardly from base 28 to its flat rectangular bottom surface. The tapered sidewalls arise from the lateral undercutting by the wet chemical etch above etch mask 18. The bottom surface is concentrically disposed within a periphery of the top (shown in phantom in FIG. 1F).

Posts 24 and 26 have the same thickness and are axially aligned with one another and are vertically offset from one another by base 28. However, post 24 has a far smaller length, width and surface area than post 26. As a result, post 24 is centrally located within the periphery of post 26.

Base 28 is an unetched portion of metal plate 10 that is below post 24, above post 26, covers post 24 in the downward direction, covers post 26 in the upward direction, is sandwiched between posts 24 and 26, extends laterally from posts 24 and 26 in a lateral plane (with lateral directions such as left and right) and has a thickness of 200 microns (500−150−150).

Posts 24 and 26 and base 28 can be treated to improve bondability to epoxy and solder. For instance, posts 24 and 26 and base 28 can be chemically oxidized or microetched to provide rougher surfaces.

Posts 24 and 26 and base 28 are illustrated as a subtractively formed single-piece metal (copper). Posts 24 and 26 and base 28 can also be a stamped single-piece metal formed by stamping metal plate 10 with a contact piece with a recess or hole that defines post 24 and a recess or hole that defines post 26. Posts 24 and 26 can also be formed additively by depositing posts 24 and 26 on base 28 using electroplating, chemical vapor deposition (CVD), physical vapor deposition (PVD) and so on, for instance by electroplating a solder post 24 and a solder post 26 on a copper base 28, in which case post 24 and base 28 have a metallurgical interface and are adjacent to but not integral with one another and post 26 and base 28 have a metallurgical interface and are adjacent to but not integral with one another. Posts 24 and 26 can also be formed semi-additively, for instance by depositing upper portions of post 24 on etch-defined lower portions of post 24 and lower portions of post 26 on etch-defined upper portions of post 26. Posts 24 and 26 can also be formed semi-additively by depositing conformal upper portions of post 24 on etch-defined lower portions of post 24 and depositing conformal lower portions of post 26 on etch-defined upper portions of post 26. Posts 24 and 26 can also be sintered to base 28.

Figure 2A:
FIGS. 2A and 2B are cross-sectional views showing a method of making a first conductive layer in accordance with an embodiment of the present invention.
Figure 2B:
Figure 2C:
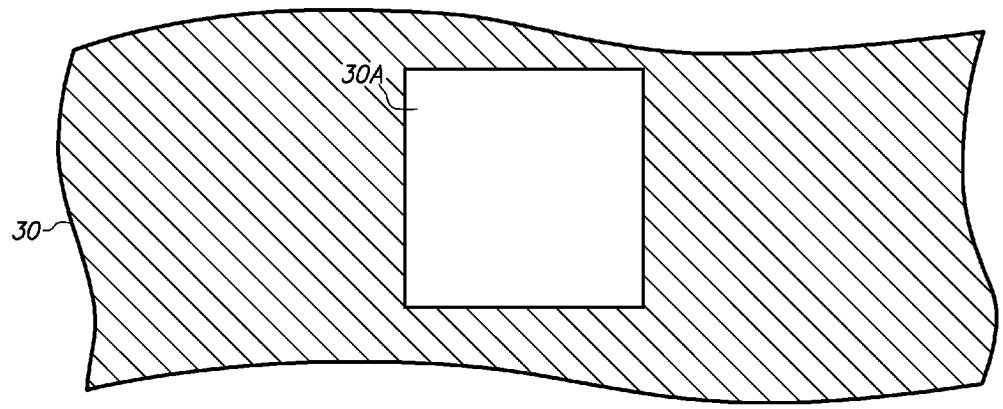
FIGS. 2C and 2D are top and bottom views, respectively, corresponding to FIG. 2B.
Figure 2D:
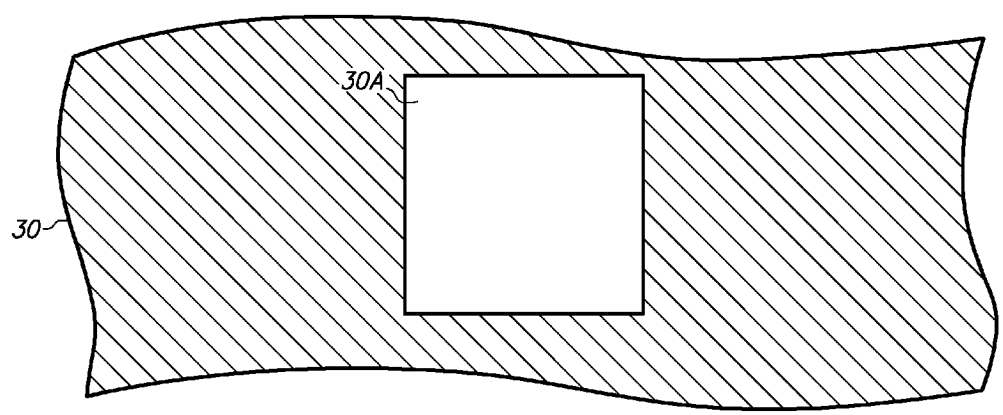

FIGS. 2A and 2B are cross-sectional views showing a method of making a first conductive layer in accordance with an embodiment of the present invention, and FIGS. 2C and 2D are top and bottom views, respectively, corresponding to FIG. 2B.

FIG. 2A is a cross-sectional view of conductive layer 30. For instance, conductive layer 30 is an unpatterned copper sheet with a thickness of 80 microns.

FIGS. 2B, 2C and 2D are cross-sectional, top and bottom views, respectively, of conductive layer 30 with aperture 30A. Aperture 30A is a window that extends through conductive layer 30 and has a length and width of 1250 microns. Aperture 30A is formed by punching or stamping through conductive layer 30 although other techniques such as wet chemical etching can be used.

Figure 3A:
FIGS. 3A and 3B are cross-sectional views showing a method of making a second conductive layer in accordance with an embodiment of the present invention.
Figure 3B:
Figure 3C:
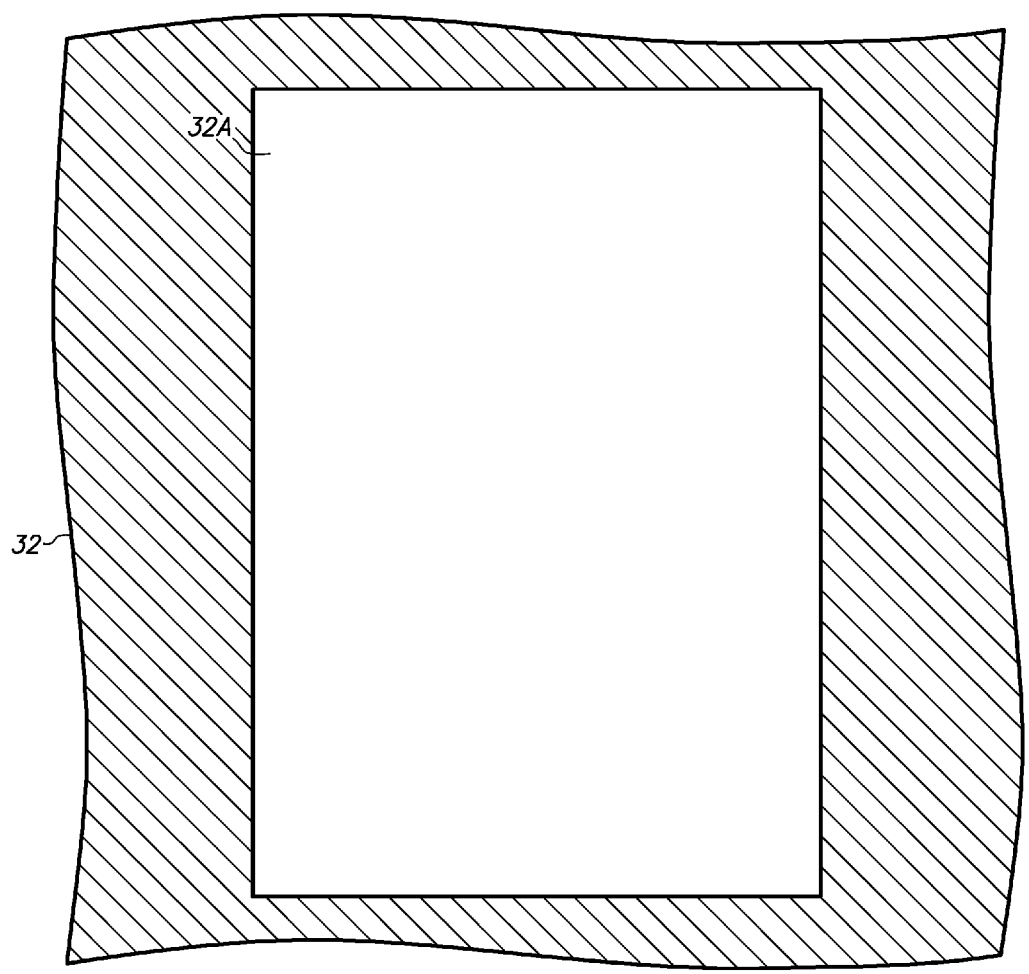
FIGS. 3C and 3D are top and bottom views, respectively, corresponding to FIG. 3B.
Figure 3D:
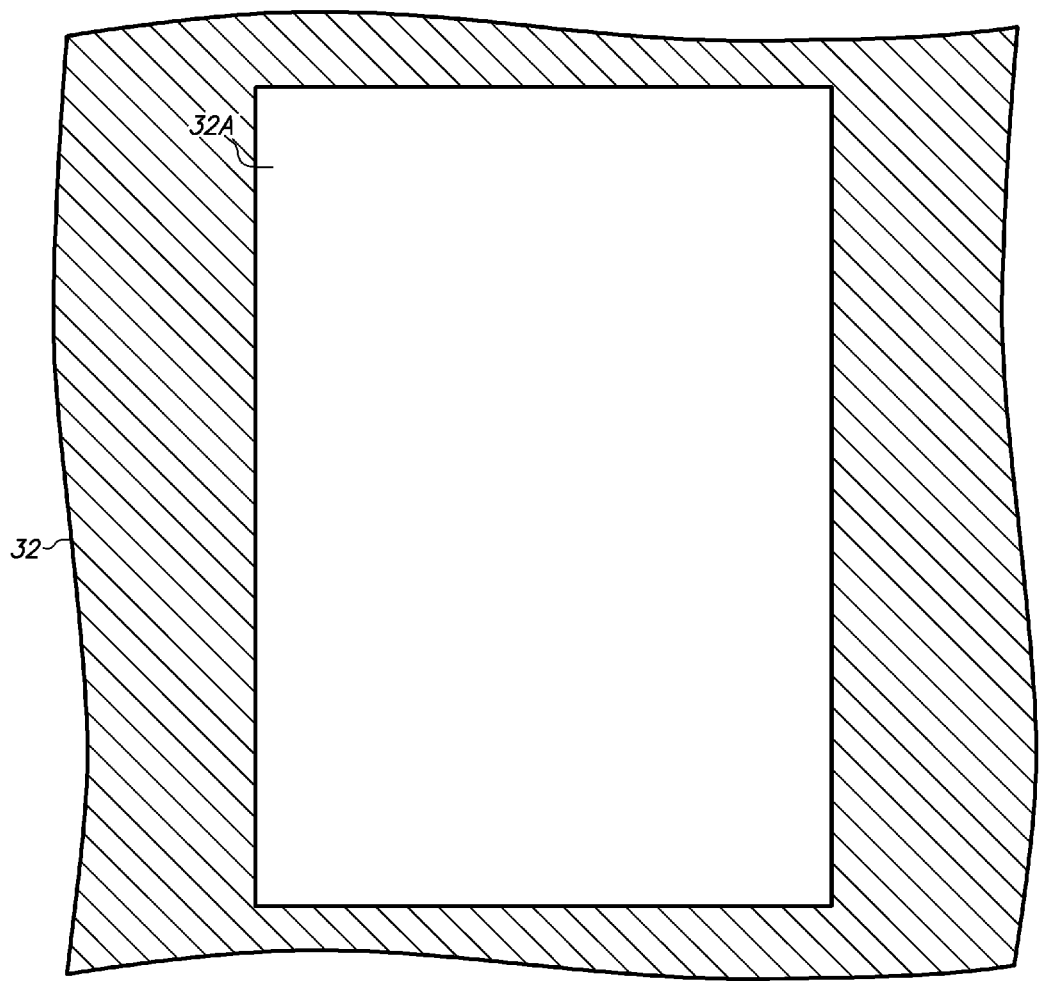

FIGS. 3A and 3B are cross-sectional views showing a method of making a second conductive layer in accordance with an embodiment of the present invention, and FIGS. 3C and 3D are top and bottom views, respectively, corresponding to FIG. 3B.

FIG. 3A is a cross-sectional view of conductive layer 32. For instance, conductive layer 32 is an unpatterned copper sheet with a thickness of 80 microns that is identical to conductive layer 30.

FIGS. 3B, 3C and 3D are cross-sectional, top and bottom views, respectively, of conductive layer 32 with aperture 32A. Aperture 32A is a window that extends through conductive layer 32 and has a length and width of 3250×5250 microns. Aperture 32A is formed by punching or stamping through conductive layer 32 although other techniques such as wet chemical etching can be used.

Figure 4A:
FIGS. 4A and 4B are cross-sectional views showing a method of making a first adhesive in accordance with an embodiment of the present invention.
Figure 4B:
Figure 4C:
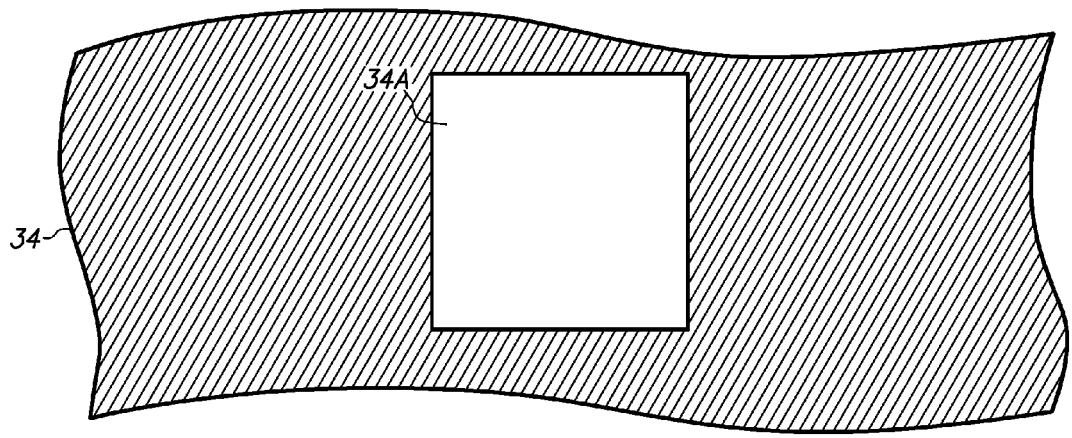
FIGS. 4C and 4D are top and bottom views, respectively, corresponding to FIG. 4B.
Figure 4D:
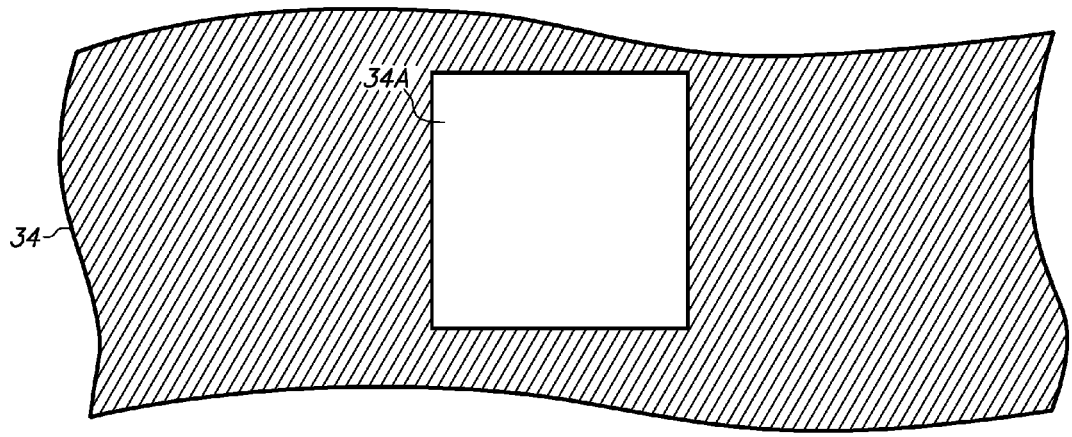

FIGS. 4A and 4B are cross-sectional views showing a method of making a first adhesive in accordance with an embodiment of the present invention, and FIGS. 4C and 4D are top and bottom views, respectively, corresponding to FIG. 4B.

FIG. 4A is a cross-sectional view of adhesive 34. Adhesive 34 is illustrated as a prepreg with B-stage uncured epoxy provided as a non-solidified unpatterned sheet with a thickness of 100 microns.

Adhesive 34 can be various dielectric films or prepregs formed from numerous organic or inorganic electrical insulators. For instance, adhesive 34 can initially be a prepreg in which thermosetting epoxy in resin form impregnates a reinforcement and is partially cured to an intermediate stage. The epoxy can be FR-4 although other epoxies such as polyfunctional and bismaleimide triazine (BT) are suitable. For specific applications, cyanate esters, polyimide and PTFE are also suitable. The reinforcement can be E-glass although other reinforcements such as S-glass, D-glass, quartz, kevlar aramid and paper are suitable. The reinforcement can also be woven, non-woven or random microfiber. A filler such as silica (powdered fused quartz) can be added to the prepreg to improve thermal conductivity, thermal shock resistance and thermal expansion matching. Commercially available prepregs such as SPEEDBOARD C prepreg by W.L. Gore & Associates of Eau Claire, Wis. are suitable.

FIGS. 4B, 4C and 4D are cross-sectional, top and bottom views, respectively, of adhesive 34 with opening 34A. Opening 34A is a window that extends through adhesive 34 and has a length and width of 1250 microns. Opening 34A is formed by punching or stamping through the prepreg although other techniques such as plasma etching can be used.

Figure 5A:
FIGS. 5A and 5B are cross-sectional views showing a method of making a second adhesive in accordance with an embodiment of the present invention.
Figure 5B:
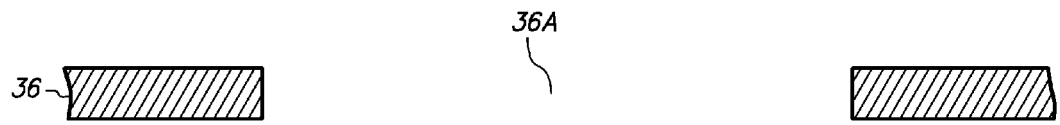
Figure 5C:
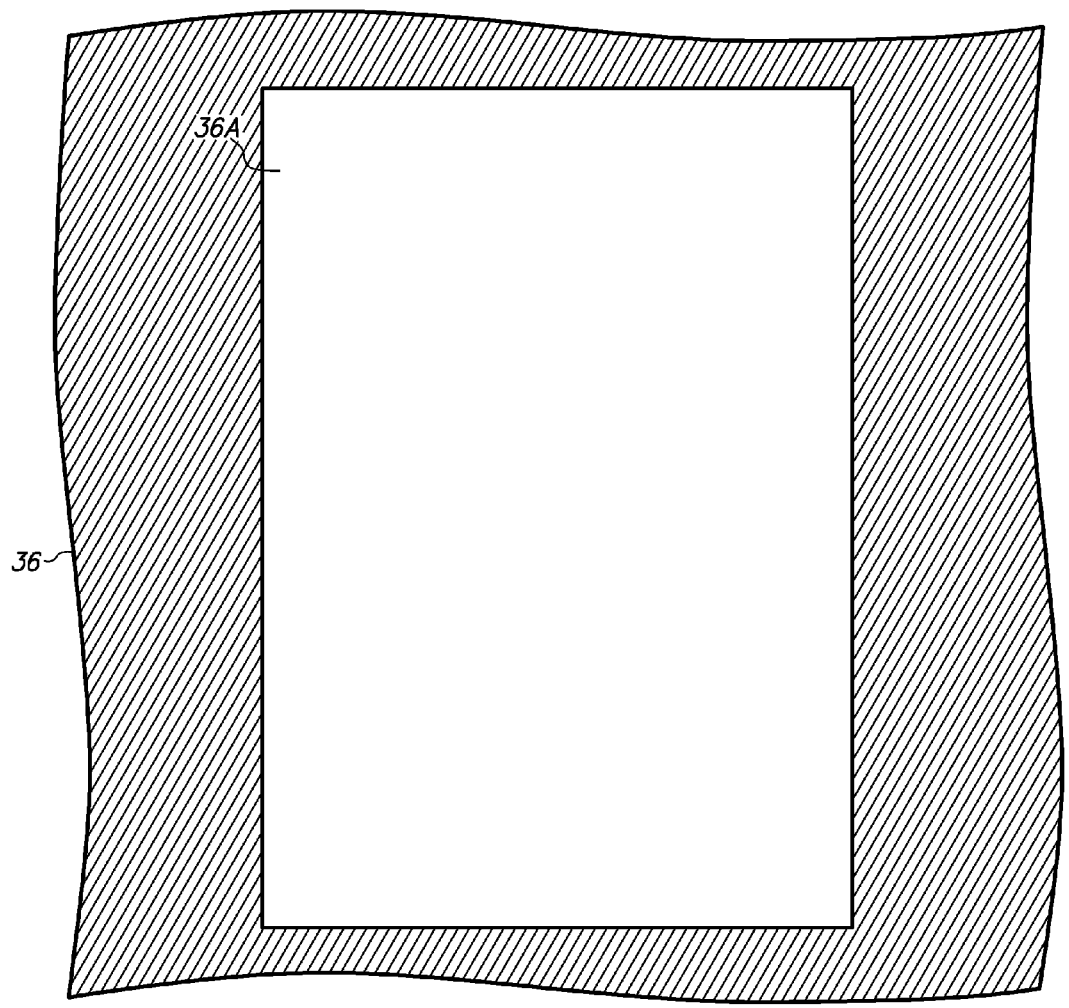
FIGS. 5C and 5D are top and bottom views, respectively, corresponding to FIG. 5B.
Figure 5D:
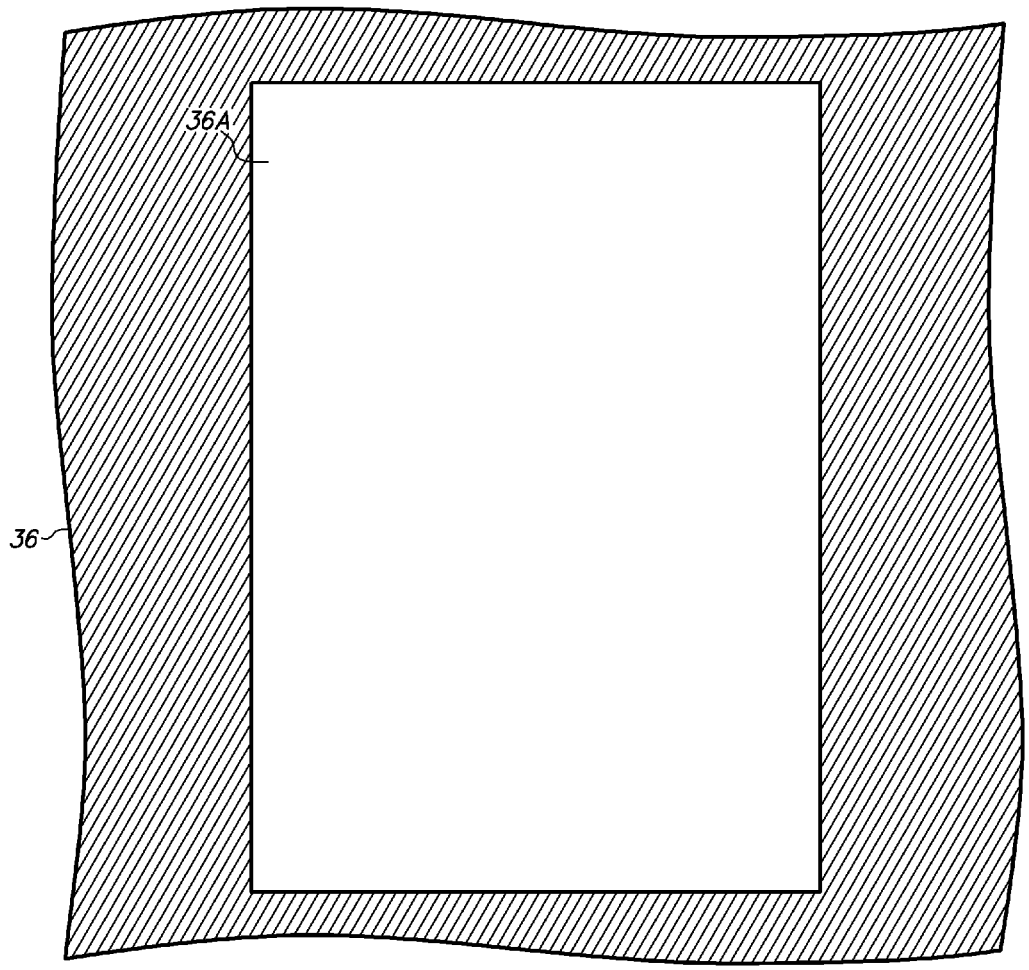

FIGS. 5A and 5B are cross-sectional views showing a method of making a second adhesive in accordance with an embodiment of the present invention, and FIGS. 5C and 5D are top and bottom views, respectively, corresponding to FIG. 5B.

FIG. 5A is a cross-sectional view of adhesive 36. Adhesive 36 is illustrated as a prepreg with B-stage uncured epoxy provided as a non-solidified unpatterned sheet with a thickness of 100 microns that is identical to adhesive 34.

FIGS. 5B, 5C and 5D are cross-sectional, top and bottom views, respectively, of adhesive 36 with opening 36A. Opening 36A is a window that extends through adhesive 36 and has a length and width of 3250×5250 microns. Opening 36A is formed by punching or stamping through the prepreg although other techniques such as plasma etching can be used.

Conductive layers 30 and 32 are identical copper sheets except that aperture 30A is far smaller than aperture 32A and adhesives 34 and 36 are identical prepregs except that opening 34A is far smaller than opening 36A. Furthermore, aperture 30A and opening 34A have the same shape and size and can be formed in the same manner with the same punch or stamp at the same station and aperture 32A and opening 36A have the same shape and size and can be formed in the same manner with the same punch or stamp at the same station.

Figure 6A:
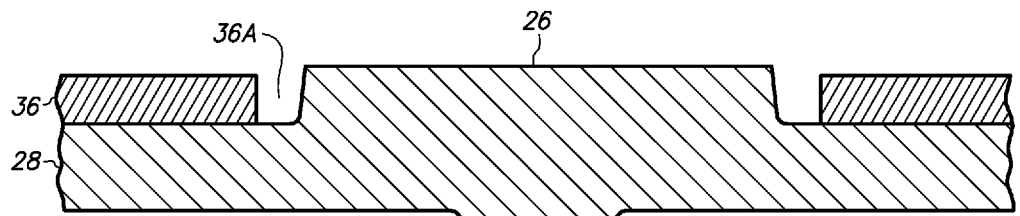
FIGS. 6A-6Q are cross-sectional views showing a method of making a thermal board in accordance with an embodiment of the present invention.
Figure 6B:
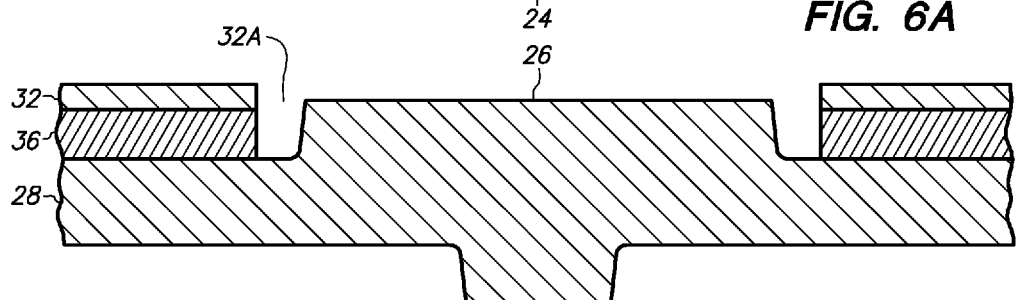
FIGS. 6R and 6S are top and bottom views, respectively, corresponding to FIG. 6Q.
Figure 6C:
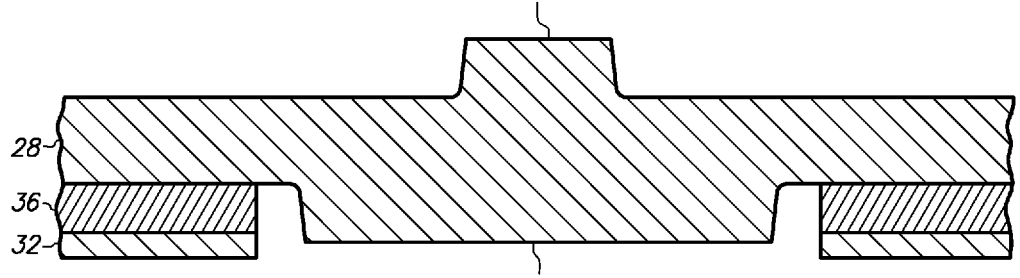
Figure 6D:
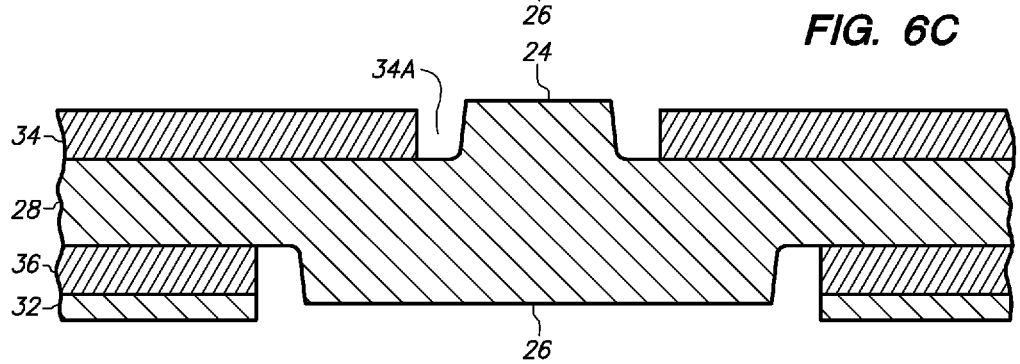
Figure 6E:
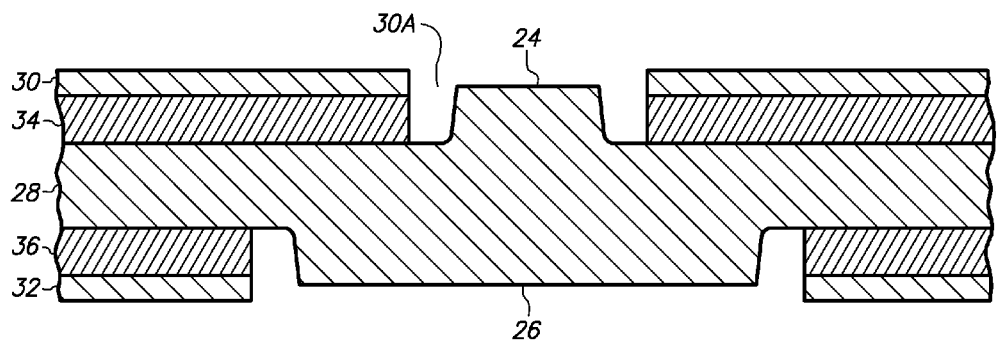
Figure 6F:
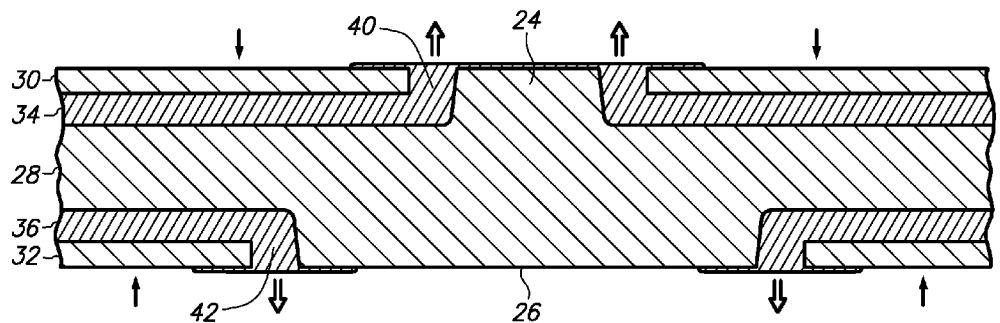
Figure 6G:
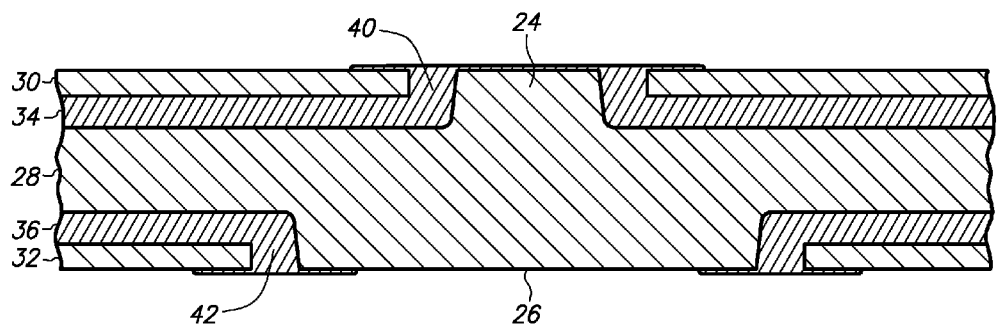
Figure 6H:
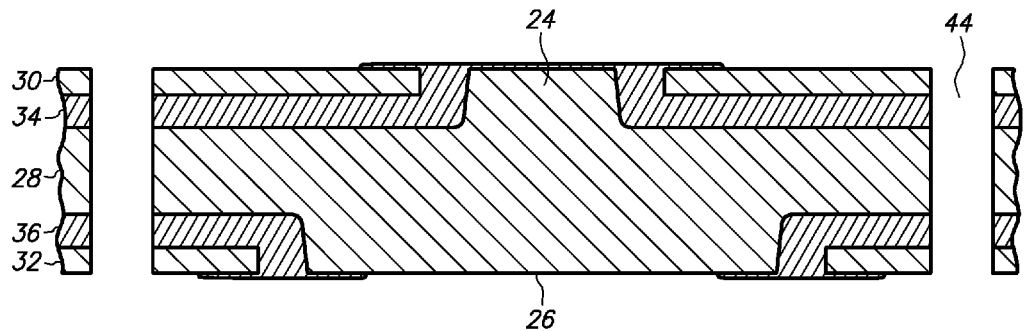
Figure 6I:
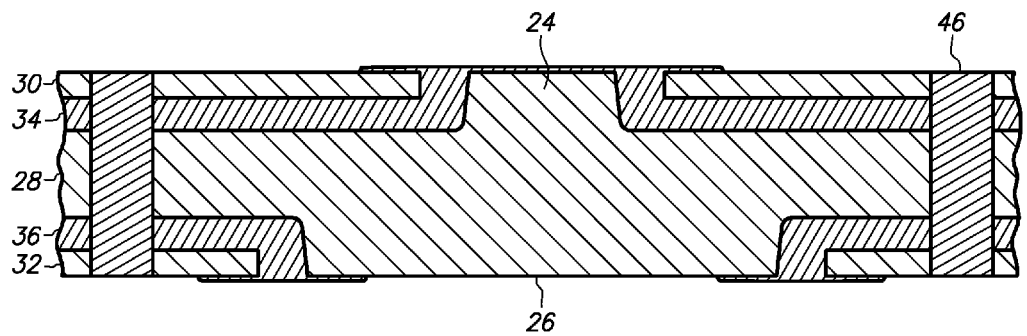
Figure 6J:
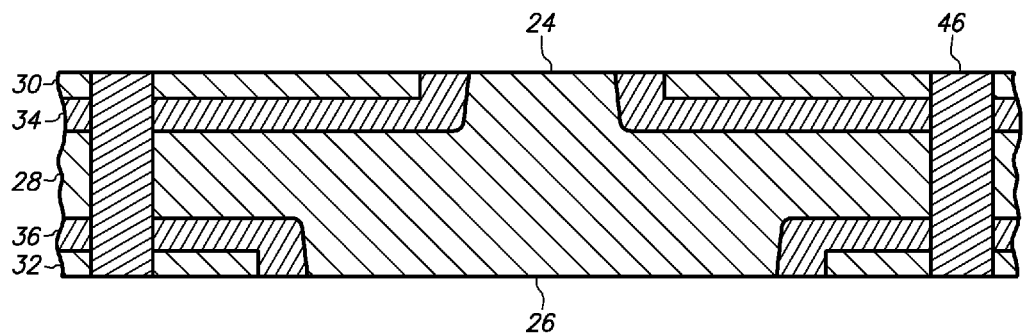
Figure 6K:
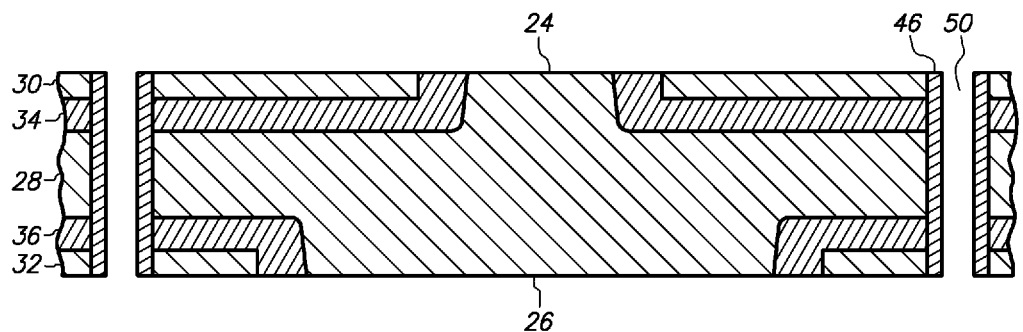
Figure 6L:
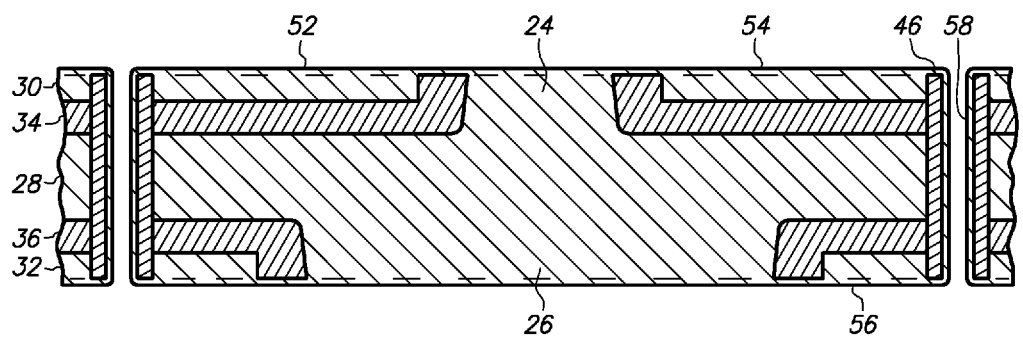
Figure 6M:
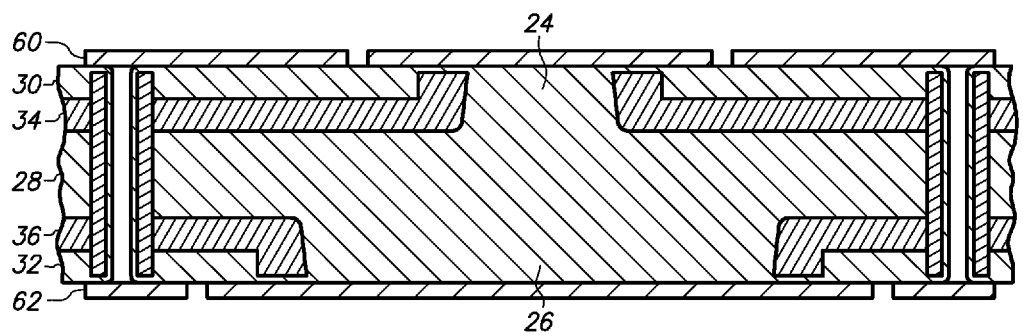
Figure 6N:
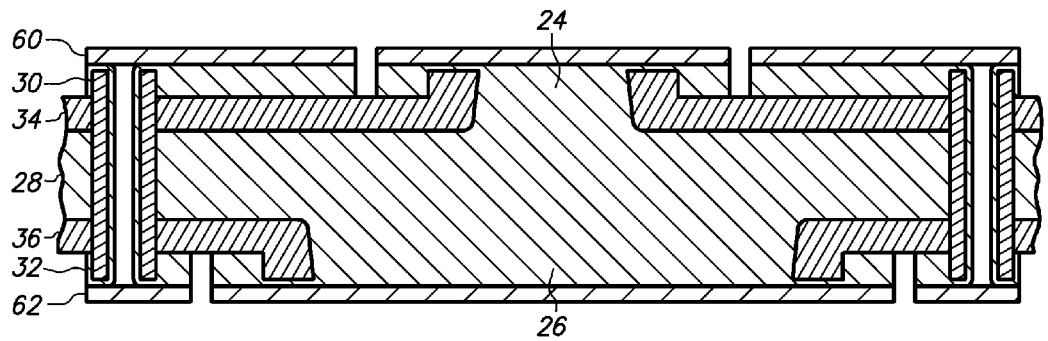
Figure 6O:
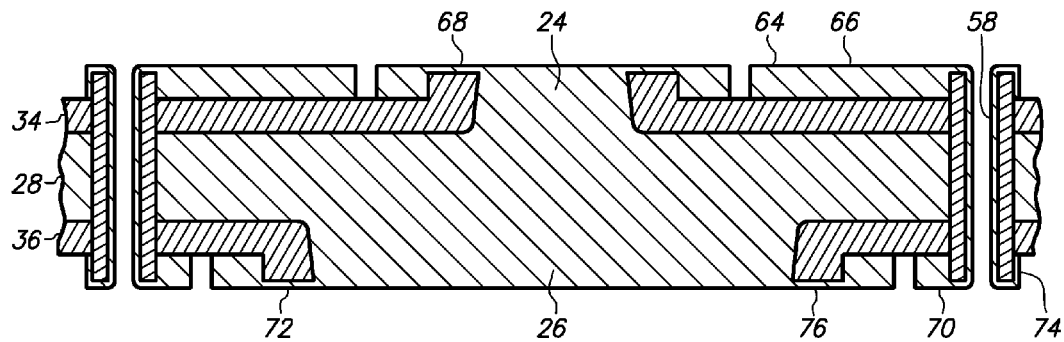
Figure 6P:
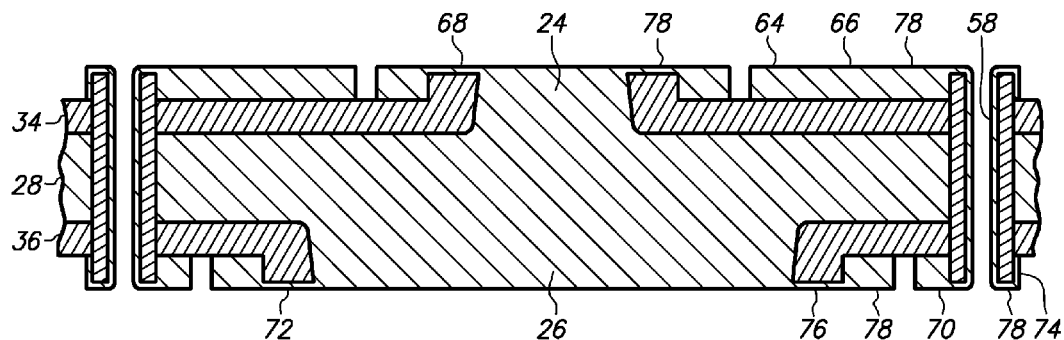
Figure 6Q:
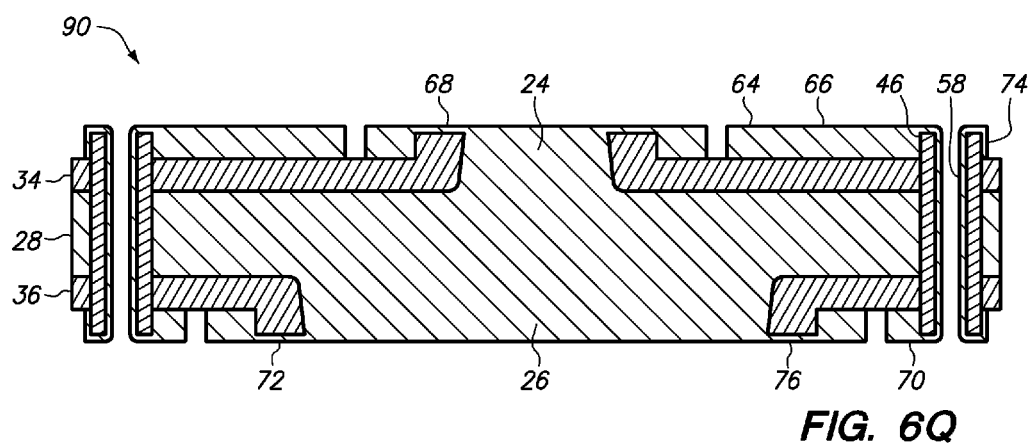
Figure 6R:
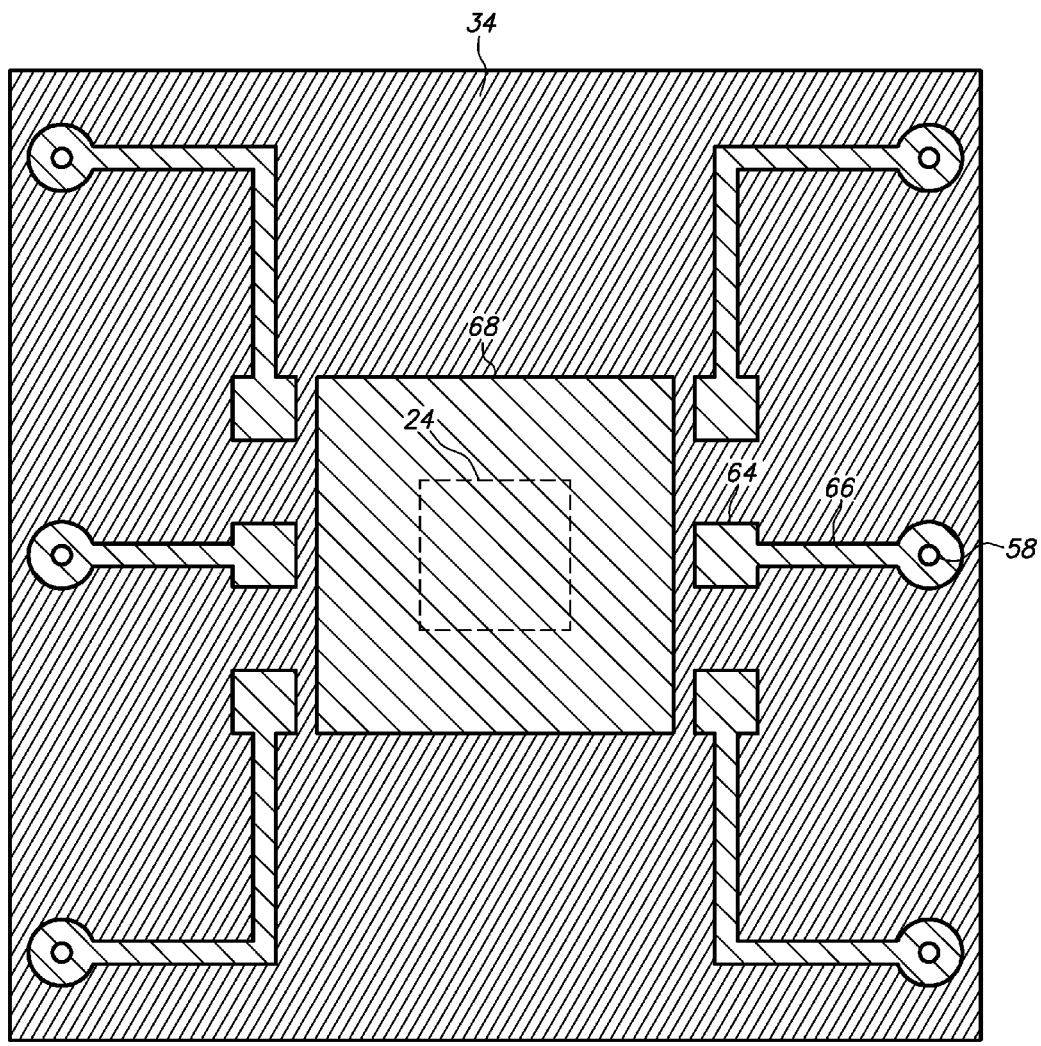
Figure 6S:
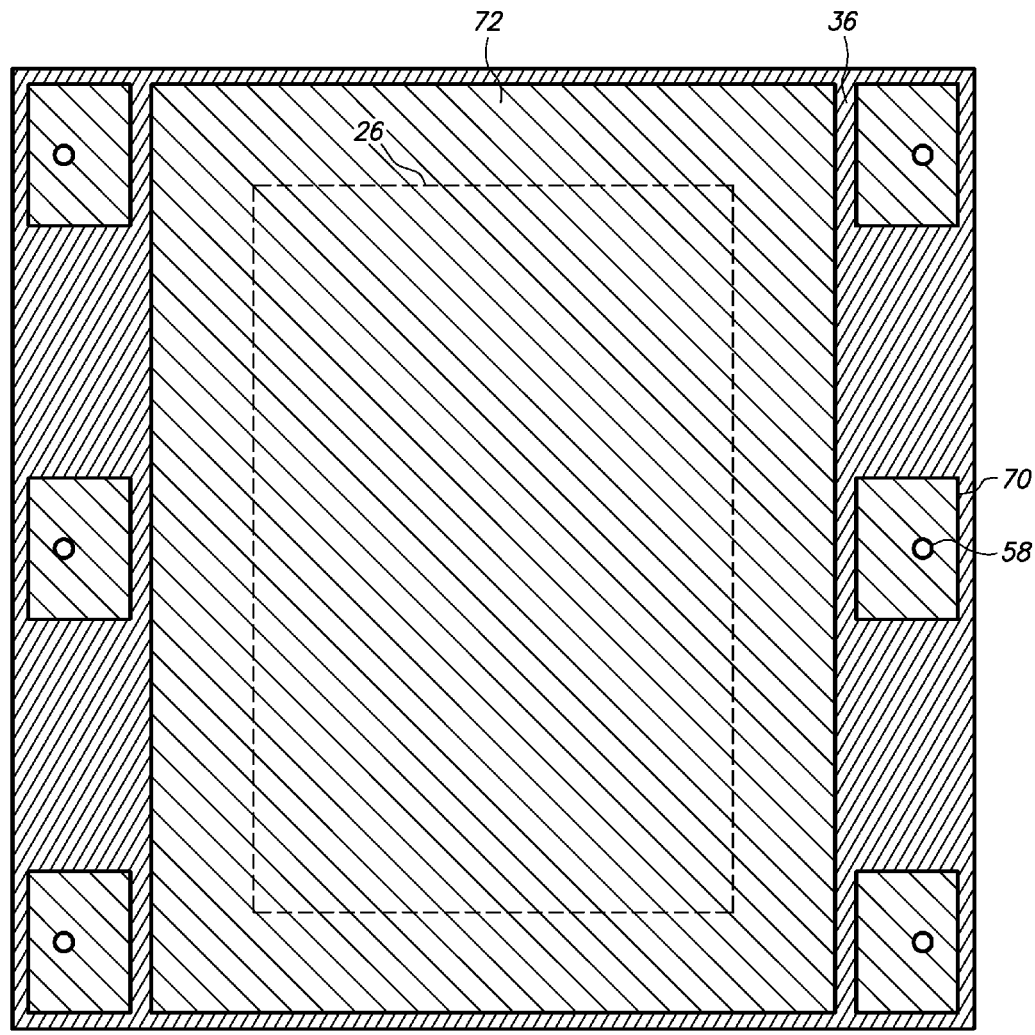

FIGS. 6A-6Q are cross-sectional views showing a method of making a thermal board that includes posts 24 and 26, base 28, conductive layers 30 and 32 and adhesives 34 and 36 in accordance with an embodiment of the present invention, and FIGS. 6R and 6S are top and bottom views, respectively, corresponding to FIG. 6Q.

In FIGS. 6A and 6B the structure is inverted so that post 26 protrudes above base 28 and post 24 protrudes below base 28. Thereafter, in FIGS. 6C-6Q the structure is upright as in FIGS. 1A-1D so that post 24 protrudes above base 28 and post 26 protrudes below base 28. As a result, gravity assists with mounting conductive layer 32 and adhesive 36 on base 28 in FIGS. 6A and 6B, and thereafter gravity assists with mounting conductive layer 30 and adhesive 34 on base 28 in FIGS. 6D and 6E. However, the relative orientation of the structure does not change. Post 24 extends from base 28 in the first vertical direction and is covered by base 28 in the second vertical direction and post 26 extends from base 28 in the second vertical direction and is covered by base 28 in the first vertical direction and regardless of whether the structure is inverted, rotated or slanted Likewise, adhesive 34 extends beyond base 28 in the first vertical direction and adhesive 36 extends beyond base 28 in the second vertical direction regardless of whether the structure is inverted, rotated or slanted. Hence, the first and second vertical directions are oriented relative to the structure and remain opposite to one another and orthogonal to the lateral directions.

FIG. 6A is a cross-sectional view of the structure with adhesive 36 mounted on base 28. Adhesive 36 is mounted by lowering it onto base 28 as post 26 is inserted upwards and into and through opening 36A. Adhesive 36 eventually contacts and rests on base 28. Post 26 is inserted into and extends through and above opening 36A without contacting adhesive 36 and is aligned with and centrally located within opening 36A.

FIG. 6B is a cross-sectional view of the structure with conductive layer 32 mounted on adhesive 36. Conductive layer 32 is mounted by lowering it onto adhesive 36 as post 26 is inserted upward and into but not through aperture 32A. Conductive layer 32 eventually contacts and rests on adhesive 36. Post 26 is inserted into and extends into but not through aperture 32A without contacting conductive layer 32 and is aligned with and centrally located within aperture 32A. In addition, aperture 32A and opening 36A are precisely aligned with one another and have the same length and width.

FIG. 6C is a cross-sectional view of the structure after it is inverted. As a result, adhesive 36 is mounted on conductive layer 32 and base 28 is mounted on adhesive 36.

FIG. 6D is a cross-sectional view of the structure with adhesive 34 mounted on base 28. Adhesive 34 is mounted by lowering it onto base 28 as post 24 is inserted upwards and into and through opening 34A. Adhesive 34 eventually contacts and rests on base 28. Post 24 is inserted into and extends through and above opening 34A without contacting adhesive 34 and is aligned with and centrally located within opening 34A.

FIG. 6E is a cross-sectional view of the structure with conductive layer 30 mounted on adhesive 34. Conductive layer 30 is mounted by lowering it onto adhesive 34 as post 24 is inserted upward and into but not through aperture 30A. Conductive layer 30 eventually contacts and rests on adhesive 34. Post 24 is inserted into and extends into but not through aperture 30A without contacting conductive layer 30 and is aligned with and centrally located within aperture 30A. In addition, aperture 30A and opening 34A are precisely aligned with one another and have the same length and width.

At this stage, conductive layer 30 is mounted on and contacts and extends above adhesive 34, adhesive 34 is mounted on and contacts and extends above base 28, base 28 is mounted on and contacts and extends above adhesive 36 and adhesive 36 is mounted on and contacts and extends above conductive layer 32. Thus, base 28 contacts and is sandwiched between adhesives 34 and 36 and is spaced from conductive layers 30 and 32, adhesive 34 contacts and is sandwiched between base 28 and conductive layer 30 and is spaced from conductive layer 32 and adhesive 36 and adhesive 36 contacts and is sandwiched between base 28 and conductive layer 32 and is spaced from conductive layer 30 and adhesive 34.

Post 24 extends through opening 34A into aperture 30A, is aligned with aperture 30A and opening 34A, is 30 microns below the top surface of conductive layer 30 and is exposed through aperture 30A in the upward direction. Post 24 remains adjacent to and integral with base 28 and spaced from conductive layer 30 and adhesive 34.

Post 26 extends through opening 36A into aperture 32A, is aligned with aperture 32A and opening 36A, is 30 microns above the bottom surface of conductive layer 32 and is exposed through aperture 32A in the downward direction. Post 26 remains adjacent to and integral with base 28 and spaced from conductive layer 32 and adhesive 36.

Adhesive 34 remains a non-solidified prepreg with B-stage uncured epoxy, adhesive 36 remains a non-solidified prepreg with B-stage uncured epoxy and adhesives 34 and 36 remain spaced from one another.

Post 24, aperture 30A and opening 34A are axially aligned with and located within the periphery of post 26. As a result, post 26 covers post 24, aperture 30A and opening 34A in the downward direction.

FIG. 6F is a cross-sectional view of the structure with adhesives 34 and 36 flowed into contact with posts 24 and 26, respectively.

Gap 40 is located in aperture 30A between post 24 and conductive layer 30 and gap 42 is located in aperture 32A between post 26 and conductive layer 32. Gap 40 laterally surrounds post 24 and is laterally surrounded by conductive layer 30 and gap 42 laterally surrounds post 26 and is laterally surrounded by conductive layer 32.

Adhesive 34 is flowed into gap 40 and adhesive 36 is flowed into gap 42 by applying heat and pressure. In this illustration, adhesive 34 is forced into gap 40 and adhesive 36 is forced into gap 42 by applying downward pressure to conductive layer 30 and/or upward pressure to conductive layer 32, thereby moving base 28 and conductive layer 30 towards one another, moving base 28 and conductive layer 32 towards one another and applying pressure to adhesives 34 and 36 while simultaneously applying heat to adhesives 34 and 36. Adhesives 34 and 36 become compliant enough under the heat and pressure to conform to virtually any shape. As a result, adhesive 34 sandwiched between base 28 and conductive layer 30 is compressed, forced out of its original shape and flows into and upward in gap 40. Likewise, adhesive 36 sandwiched between base 28 and conductive layer 32 is compressed, forced out of its original shape and flows into and downward in gap 42. Base 28 and conductive layer 30 continue to move towards one another and adhesive 34 eventually fills gap 40. Likewise, base 28 and conductive layer 32 continue to move towards one another and adhesive 36 eventually fills gap 42. Moreover, adhesive 34 remains sandwiched between and continues to fill the reduced space between base 28 and conductive layer 30 and adhesive 36 remains sandwiched between and continues to fill the reduced space between base 28 and conductive layer 32.

For instance, conductive layers 30 and 32 can be disposed between top and bottom platens (not shown) of a press. In addition, a top cull plate and top buffer paper (not shown) can be sandwiched between conductive layer 30 and the top platen, and a bottom cull plate and bottom buffer paper (not shown) can be sandwiched between conductive layer 32 and the bottom platen. The stack includes the top platen, top cull plate, top buffer paper, conductive layer 30, adhesive 34, base 28, adhesive 36, conductive layer 32, bottom buffer paper, bottom cull plate and bottom platen in descending order. Furthermore, the stack may be positioned on the bottom platen by tooling pins (not shown) that extend upward from the bottom platen through registration holes (not shown) in metal plate 10.

The platens are heated and move towards one another, thereby applying heat and pressure to adhesives 34 and 36. The cull plates disperse the heat from the platens so that it is more uniformly applied to conductive layers 30 and 32 and thus adhesives 34 and 36, and the buffer papers disperse the pressure from the platens so that it is more uniformly applied to conductive layers 30 and 32 and thus adhesives 34 and 36. Initially, conductive layer 30 contacts and presses down on adhesive 34 and conductive layer 32 contacts and presses up on adhesive 36.

As the platen motion and heat continue, adhesive 34 between base 28 and conductive layer 30 is compressed, melted and flows into and upward in gap 40 and adhesive 36 between base 28 and conductive layer 32 is compressed, melted and flows into and downward in gap 42. For instance, in adhesive 34 the uncured epoxy is melted by the heat and the molten uncured epoxy is squeezed by the pressure into gap 40, however the reinforcement and the filler remain between base 28 and conductive layer 30. Likewise, in adhesive 36 the uncured epoxy is melted by the heat and the molten uncured epoxy is squeezed by the pressure into gap 42, however the reinforcement and the filler remain between base 28 and conductive layer 32.

Adhesive 34 ascends more rapidly than post 24 in aperture 30A, fills and extends slightly above gap 40 and overflows onto the top surfaces of post 24 and conductive layer 30 adjacent to gap 40 before the platen motion stops. This may occur due to the prepreg being slightly thicker than necessary. As a result, adhesive 34 creates a thin coating on the top surfaces of post 24 and conductive layer 30.

Adhesive 36 descends more rapidly than post 26 in aperture 32A, fills and extends slightly below gap 42 and overflows onto the bottom surfaces of post 26 and conductive layer 32 adjacent to gap 42 before the platen motion stops. This may occur due to the prepreg being slightly thicker than necessary. As a result, adhesive 36 creates a thin coating on the bottom surfaces of post 26 and conductive layer 32.

The platen motion is eventually blocked by posts 24 and 26 and the platens become stationary but continue to apply heat to adhesives 34 and 36.

The upward flow of adhesive 34 in gap 40 is shown by the thick upward arrows, the downward flow of adhesive 36 in gap 42 is shown by the thick downward arrows, the upward motion of conductive layer 32 relative to post 26 and base 28 is shown by the thin upward arrows, and the downward motion of conductive layer 30 relative to post 24 and base 28 is shown by the thin downward arrows.

FIG. 6G is a cross-sectional view of the structure with adhesives 34 and 36 solidified.

For instance, the platens continue to clamp posts 24 and 26 and apply heat after the platen motion stops, thereby converting the B-stage molten uncured epoxy into C-stage cured or hardened epoxy. Thus, the epoxy is cured in a manner similar to conventional multi-layer lamination. After the epoxy is cured, the platens move away from one another and the structure is released from the press.

Adhesive 34 as solidified provides a secure robust mechanical bond between post 24 and conductive layer 30 and between base 28 and conductive layer 30. Adhesive 34 can withstand normal operating pressure without distortion or damage and is only temporarily distorted under unusually high pressure. Furthermore, adhesive 34 can absorb thermal expansion mismatch between post 24 and conductive layer 30 and between base 28 and conductive layer 30.

Adhesive 36 as solidified provides a secure robust mechanical bond between post 26 and conductive layer 32 and between base 28 and conductive layer 32. Adhesive 36 can withstand normal operating pressure without distortion or damage and is only temporarily distorted under unusually high pressure. Furthermore, adhesive 36 can absorb thermal expansion mismatch between post 26 and conductive layer 32 and between base 28 and conductive layer 32.

Post 24 and conductive layer 30 are essentially coplanar with one another and conductive layer 30 and adhesive 34 extend to a top surface that faces in the upward direction. For instance, adhesive 34 between base 28 and conductive layer 30 has a thickness of 70 microns which is 30 microns less than its initial thickness of 100 microns, post 24 ascends 30 microns in aperture 30A and conductive layer 30 descends 30 microns relative to post 24. The 150 micron height of post 24 is essentially the same as the combined height of conductive layer 30 (80 microns) and the underlying adhesive 34 (70 microns). Furthermore, post 24 continues to be centrally located in aperture 30A and opening 34A and spaced from conductive layer 30 and adhesive 36 fills the space between post 24 and conductive layer 30, fills the space between base 28 and conductive layer 30 and fills gap 40. For instance, gap 40 (as well as adhesive 34 between post 24 and conductive layer 30) has a width of 125 microns ((1250−1000)/2) at the top surface of post 24.

Post 26 and conductive layer 32 are essentially coplanar with one another and conductive layer 32 and adhesive 36 extend to a bottom surface that faces in the downward direction. For instance, adhesive 36 between base 28 and conductive layer 32 has a thickness of 70 microns which is 30 microns less than its initial thickness of 100 microns, post 26 descends 30 microns in aperture 32A and conductive layer 32 ascends 30 microns relative to post 26. The 150 micron height of post 26 is essentially the same as the combined height of conductive layer 32 (80 microns) and the overlying adhesive 36 (70 microns). Furthermore, post 26 continues to be centrally located in aperture 32A and opening 36A and spaced from conductive layer 32 and adhesive 34 fills the space between post 26 and conductive layer 32, fills the space between base 28 and conductive layer 32 and fills gap 42. For instance, gap 42 (as well as adhesive 36 between post 26 and conductive layer 32) has a width of 125 microns (((3250-3000)/2) and ((5250-5000)/2)) at the bottom surface of post 26.

Adhesive 34 extends across conductive layer 30 in gap 40. That is, adhesive 34 in gap 40 extends in the upward and downward directions across the thickness of conductive layer 30 at the outer sidewall of gap 40. Adhesive 34 also includes a thin top portion above gap 40 that contacts the top surfaces of post 24 and conductive layer 30 and extends above post 24 by 10 microns.

Adhesive 36 extends across conductive layer 32 in gap 42. That is, adhesive 36 in gap 42 extends in the upward and downward directions across the thickness of conductive layer 32 at the outer sidewall of gap 42. Adhesive 36 also includes a thin bottom portion below gap 42 that contacts the bottom surfaces of post 26 and conductive layer 32 and extends below post 26 by 10 microns.

FIG. 6H is a cross-sectional view of the structure with outer hole 44. Outer hole 44 is a through-hole that extends through and is adjacent to base 28, conductive layers 30 and 32 and adhesives 34 and 36 and has a diameter of 500 microns. Outer hole 44 is formed by mechanical drilling through base 28, conductive layers 30 and 32 and adhesives 34 and 36 although other techniques such as laser drilling, plasma etching and wet chemical etching can be used.

FIG. 6I is a cross-sectional view of the structure with insulative filler 46 in outer hole 44. Insulative filler 46 is an electrically insulative epoxy that is located within and fills outer hole 44, contacts base 28, conductive layer 30 and 32 and adhesives 34 and 36 in outer hole 44 and is spaced from posts 24 and 26.

Insulative filler 46 is initially an epoxy paste that is selectively screen printed into outer hole 44. Thereafter, the epoxy paste is heated and hardened at a relatively low temperature such as 190° C.

Insulative filler 46 can be various dielectric films formed from numerous organic and inorganic electrical insulators. For instance, insulative filler 46 can be polyimide or FR-4 epoxy although other epoxies such as polyfunctional and bismaleimide triazine (BT) are suitable.

FIG. 6J is a cross-sectional view of the structure after upper portions of post 24, conductive layer 30, adhesive 34 and insulative filler 46 are removed and lower portions of post 26, conductive layer 32, adhesive 36 and insulative filler 46 are removed.

Post 24, conductive layer 30, adhesive 34 and insulative filler 46 have their upper portions removed by grinding. For instance, a rotating diamond sand wheel and distilled water are applied to the top of the structure. Initially, the diamond sand wheel grinds only adhesive 34. As the grinding continues, adhesive 34 becomes thinner as its grinded surface migrates downwardly. Eventually the diamond sand wheel contacts post 24, conductive layer 30 and insulative filler 46 (not necessarily at the same time), and as a result, begins to grind post 24, conductive layer 30 and insulative filler 46 as well. As the grinding continues, post 24, conductive layer 30, adhesive 34 and insulative filler 46 become thinner as their grinded surfaces migrate downwardly. The grinding continues until the desired thickness has been removed. Thereafter, the structure is rinsed in distilled water to remove contaminants.

The grinding removes a 30 micron thick upper portion of adhesive 34, a 20 micron thick upper portion of post 24, a 20 micron thick upper portion of conductive layer 30 and a 20 micron thick upper portion of insulative filler 46. The decreased thickness does not appreciably affect post 24, conductive layer 30, adhesive 34 or insulative filler 46.

Post 26, conductive layer 32, adhesive 36 and insulative filler 46 have their lower portions removed by grinding. For instance, a rotating diamond sand wheel and distilled water are applied to the bottom of the structure. Initially, the diamond sand wheel grinds only adhesive 36. As the grinding continues, adhesive 36 becomes thinner as its grinded surface migrates upwardly. Eventually the diamond sand wheel contacts post 26, conductive layer 32 and insulative filler 46 (not necessarily at the same time), and as a result, begins to grind post 26, conductive layer 32 and insulative filler 46 as well. As the grinding continues, post 26, conductive layer 32, adhesive 36 and insulative filler 46 become thinner as their grinded surfaces migrate upwardly. The grinding continues until the desired thickness has been removed. Thereafter, the structure is rinsed in distilled water to remove contaminants.

The grinding removes a 30 micron thick lower portion of adhesive 36, a 20 micron thick lower portion of post 26, a 20 micron thick lower portion of conductive layer 32 and a 20 micron thick lower portion of insulative filler 46. The decreased thickness does not appreciably affect post 26, conductive layer 32, adhesive 36 or insulative filler 46.

At this stage, post 24, conductive layer 30, adhesive 34 and insulative filler 46 are coplanar with one another at a smoothed lapped lateral top surface that is above base 28 and faces in the upward direction. Likewise, post 26, conductive layer 32, adhesive 36 and insulative filler 46 are coplanar with one another at a smoothed lapped lateral bottom surface that is below base 28 and faces in the downward direction.

FIG. 6K is a cross-sectional view of the structure with inner hole 50 in outer hole 44. Inner hole 50 is a through-hole that is located within and extends through and is coaxial with outer hole 44. Inner hole 50 is located within and extends through and is adjacent to insulative filler 46, extends through and is spaced from base 28, conductive layers 30 and 32 and adhesives 34 and 36 and has a diameter of 300 microns. Thus, inner hole 50 has its sidewall at insulative filler 46 and is spaced from base 28, conductive layers 30 and 32 and adhesives 34 and 36 by 100 microns ((500−300)/2). Inner hole 50 is formed by mechanical drilling through insulative filler 46 although other techniques such as laser drilling and plasma etching can be used.

FIG. 6L is a cross-sectional view of the structure with plated metal 52 deposited on posts 24 and 26, conductive layers 30 and 32, adhesives 34 and 36 and insulative filler 46. Plated metal 52 forms plated layer 54, plated layer 56 and plated through-hole 58.

Plated layer 54 is deposited on and contacts post 24, conductive layer 30, adhesive 34 and insulative filler 46 at the lateral top surface and covers them in the upward direction. Plated layer 54 is an unpatterned copper layer with a thickness of 20 microns.

Plated layer 56 is deposited on and contacts post 26, conductive layer 32, adhesive 36 and insulative filler 46 at the lateral bottom surface and covers them in the downward direction. Plated layer 56 is an unpatterned copper layer with a thickness of 20 microns.

Plated through-hole 58 is deposited on and contacts insulative filler 46 in inner hole 50 and covers the sidewall in the lateral directions. Plated through-hole 58 is a copper tube with a thickness of 20 microns and is adjacent to and integral with and electrically connects plated layers 54 and 56. Furthermore, plated through-hole 58 is spaced from base 28 and adhesives 34 and 36 by 100 microns ((500−300)/2).

For instance, the structure is dipped in an activator solution to render adhesives 34 and 36 and insulative filler 46 catalytic to electroless copper, then a first copper layer is electrolessly plated on posts 24 and 26, conductive layers 30 and 32, adhesives 34 and 36 and insulative filler 46, and then a second copper layer is electroplated on the first copper layer. The first copper layer has a thickness of 2 microns, the second copper layer has a thickness of 18 microns, and plated metal 52 (and plated layers 54 and 56 and plated through-hole 58) has a thickness of 20 microns. As a result, conductive layer 30 essentially grows and has a thickness of 80 microns (60+20) and conductive layer 32 essentially grows and has a thickness of 80 microns (60+20).

Plated layer 54 serves as a cover layer for post 24, adhesive 34 and insulative filler 46 and a build-up layer for conductive layer 30, plated layer 56 serves as a cover layer for post 26, adhesive 36 and insulative filler 46 and a build-up layer for conductive layer 32 and plated through-hole 58 serves as an electrical interconnect between plated layers 54 and 56 and thus conductive layers 30 and 32.

Post 24, conductive layer 30, plated layer 54 and plated through-hole 58 are shown as a single layer for convenience of illustration Likewise, post 26, conductive layer 32, plated layer 56 and plated through-hole 58 are shown as a single layer for convenience of illustration. The boundary (shown in phantom) between post 24 and plated layer 54, between conductive layer 30 and plated layer 54, between post 26 and plated layer 56 and between conductive layer 32 and plated layer 56 may be difficult or impossible to detect since copper is plated on copper. However, the boundary between adhesive 34 and plated layer 54, between insulative filler 46 and plated layer 54, between adhesive 36 and plated layer 56, between insulative filler 46 and plated layer 56 and between insulative filler 46 and plated through-hole 58 is clear.

FIG. 6M is a cross-sectional view of the structure with etch masks 60 and 62 formed on plated layers 54 and 56, respectively. Etch masks 60 and 62 are illustrated as photoresist layers similar to photoresist layers 16 and 18, respectively. Photoresist layer 60 has a pattern that selectively exposes plated layer 54, and photoresist layer 62 has a pattern that selectively exposes plated layer 56.

FIG. 6N is a cross-sectional view of the structure with selected portions of conductive layer 30 and plated layer 54 removed by etching conductive layer 30 and plated layer 54 in the pattern defined by etch mask 60, and selected portions of conductive layer 32 and plated layer 56 removed by etching conductive layer 32 and plated layer 56 in the pattern defined by etch mask 62. The etching is a frontside and backside wet chemical etch similar to the etch applied to metal plate 10. For instance, a top spray nozzle (not shown) and a bottom spray nozzle (not shown) can spray the wet chemical etch on the top and bottom of the structure, or the structure can be dipped in the wet chemical etch. The wet chemical etch etches through conductive layer 30 and plated layer 54 to expose adhesive 34 in the upward direction without exposing base 28 or adhesive 36 in the upward direction and converts conductive layer 30 and plated layer 54 from unpatterned into patterned layers. The wet chemical etch also etches through conductive layer 32 and plated layer 56 to expose adhesive 36 in the downward direction without exposing base 28 or adhesive 34 in the downward direction and converts conductive layer 32 and plated layer 56 from unpatterned into patterned layers.

FIG. 6O is a cross-sectional view of the structure after etch masks 60 and 62 are removed. Photoresist layers 60 and 62 can be stripped in the same manner as photoresist layers 16 and 18.

Conductive layer 30 and plated layer 54 as etched include pad 64, routing line 66 and cap 68. Pad 64, routing line 66 and cap 68 are unetched portions of conductive layer 30 and plated layer 54 defined by etch mask 60. Thus, conductive layer 30 and plated layer 54 are a patterned layer that includes pad 64, routing line 66 and cap 68.

Pad 64 is an unetched portion of conductive layer 30 and plated layer 54 defined by etch mask 60 that is spaced from plated through-hole 58. Routing line 66 is an unetched portion of conductive layer 30 and plated layer 54 defined by etch mask 60 that is adjacent to and extends laterally from and electrically connects plated through-hole 58 and pad 64. Cap 68 is an unetched portion of conductive layer 30 and plated layer 54 defined by etch mask 60 that is adjacent to and extends laterally from and is thermally connected to post 24. Pad 64 has a thickness of 80 microns (60+20). Cap 68 has a thickness of 20 microns where it is adjacent to post 24 and a thickness of 80 microns (60+20) where it is closest to pad 64. Thus, pad 64 and cap 68 contact and extend above adhesive 34, have the same thickness where they are closest to one another, have different thickness where cap 68 is adjacent to post 24 and are spaced from and coplanar with one another.

Conductive layer 32 and plated layer 56 as etched include terminal 70 and cap 72. Terminal 70 and cap 72 are unetched portions of conductive layer 32 and plated layer 56 defined by etch mask 62. Thus, conductive layer 32 and plated layer 56 are a patterned layer that includes terminal 70 and cap 72.

Terminal 70 is an unetched portion of conductive layer 32 and plated layer 56 defined by etch mask 62 that is adjacent to and extends laterally from and is electrically connected to plated through-hole 58. Cap 72 is an unetched portion of conductive layer 32 and plated layer 56 defined by etch mask 62 that is spaced from and extends laterally beyond and is thermally connected to post 26. Terminal 70 has a thickness of 80 microns (60+20). Cap 72 has a thickness of 20 microns where it is adjacent to post 26 and a thickness of 80 microns (60+20) where it is closest to terminal 70. Thus, terminal 70 and cap 72 contact and extend below adhesive 36, have the same thickness where they are closest to one another, have different thickness where terminal 70 is adjacent to post 26 and are spaced from and coplanar with one another.

Conductive trace 74 is provided by plated through-hole 58, pad 64, routing line 66 and terminal 70. Similarly, an electrically conductive path between pad 64 and terminal 70 is plated through-hole 58 and routing line 66.

Furthermore, pad 64 is located within the peripheries of post 26 and cap 72, routing line 66 extends within and outside the peripheries of post 26 and cap 72 and plated through-hole 58 and terminal 70 are located outside the peripheries of post 26 and cap 72.

Heat spreader 76 is provided by posts 24 and 26, base 28 and caps 68 and 72. Post 24 and base 28 are integral with one another and post 26 and base 28 are integral with one another. Post 24 is sandwiched between base 28 and cap 68 and post 26 is sandwiched between base 28 and cap 72. Cap 68 is above and adjacent to and covers in the upward direction and extends laterally in the lateral directions from the top of post 24 and is positioned so that post 24 is centrally located within its periphery. Likewise, cap 72 is below and adjacent to and covers in the downward direction and extends laterally in the lateral directions from the bottom of post 26 and is positioned so that post 26 is centrally located within its periphery.

Furthermore, posts 24 and 26 and caps 68 and 72 are axially aligned with one another, post 24 and cap 68 are located within the peripheries of post 26 and cap 72 and post 26 is located within the periphery of cap 72. As a result, post 26 and cap 72 cover post 24 and cap 68 in the downward direction.

Heat spreader 76 is essentially a heat slug with a small upper pedestal (post 24), a large lower pedestal (post 26), upper wings that extend laterally from the upper pedestal (cap 68), lower wings that extend laterally from the lower pedestal (cap 72) and middle wings that extend laterally from the upper and lower pedestals (base 28).

FIG. 6P is a cross-sectional view of the structure with plated contacts 78 formed on conductive trace 74 and heat spreader 76.

Plated contacts 78 are thin spot plated metal coatings that contact the exposed copper surfaces. Thus, plated contacts 78 contact plated through-hole 58, pad 64, routing line 66 and cap 68 and cover them in the upward direction and contact plated through-hole 58, terminal 70 and cap 72 and cover them in the downward direction. For instance, a nickel layer is electrolessly plated on the exposed copper surfaces, and then a silver layer is electrolessly plated on the nickel layer. The buried nickel layer has a thickness of 3 microns, the silver surface layer has a thickness of 0.5 microns, and plated contacts 78 have a thickness of 3.5 microns.

Pad 64, cap 68, terminal 70 and cap 72 treated with plated contacts 78 as a surface finish have several advantages. The buried nickel layer provides the primary mechanical and electrical and/or thermal connection, and the silver surface layer provides a wettable surface to facilitate solder reflow and accommodates a solder joint and a wire bond. Plated contacts 78 also protect conductive trace 74 and heat spreader 76 from corrosion. Plated contacts 78 can include a wide variety of metals to accommodate the external connection media. For instance, a gold surface layer can be plated on a buried nickel layer or a nickel surface layer alone can be employed.

Conductive trace 74 and heat spreader 76 treated with plated contacts 78 are shown as single layers for convenience of illustration. The boundary (not shown) between conductive trace 74 and plated contacts 78 and between heat spreader 76 and plated contacts 78 occurs at the copper/nickel interface.

At this stage, the manufacture of thermal board 90 can be considered complete.

FIGS. 6Q, 6R and 6S are cross-sectional, top and bottom views, respectively, of thermal board 90 after it is detached at peripheral edges along cut lines from a support frame and/or adjacent thermal boards in a batch.

Thermal board 90 includes adhesives 34 and 36, insulative filler 46, conductive trace 74 and heat spreader 76. Conductive trace 74 includes plated through-hole 58, pad 64, routing line 66 and terminal 70. Heat spreader 76 includes posts 24 and 26, base 28 and caps 68 and 72.

Post 24 extends into and remains centrally located within opening 34A and remains centrally located within the peripheries of post 26, base 28, adhesives 34 and 36 and caps 68 and 72. Post 24 retains its cut-off pyramidal shape with tapered sidewalls in which its diameter decreases as it extends upwardly from base 28 to its flat square top adjacent to cap 68. Post 24 is also coplanar with adhesive 34 at their tops at cap 68 and at their bottoms at base 28.

Post 26 extends into and remains centrally located within opening 36A and remains centrally located within the peripheries of base 28, adhesives 34 and 36 and cap 72. Post 26 retains its cut-off pyramidal shape with tapered sidewalls in which its diameter decreases as it extends downwardly from base 28 to its flat rectangular bottom adjacent to cap 72. Post 26 is also coplanar with adhesive 36 at their tops at base 28 and at their bottoms at cap 72.

Base 28 is located below post 24 and covers post 24 in the downward direction, is located above post 26 and covers post 26 in the upward direction and extends laterally from posts 24 and 26 to the peripheral edges of thermal board 90. Base 28 remains sandwiched between posts 24 and 26, adhesives 34 and 36 and caps 68 and 72 and provides mechanical support for adhesives 34 and 36 and conductive trace 74. Furthermore, base 28 is thicker than pad 64, routing line 66, cap 68, terminal 70 and cap 72.

Adhesive 34 contacts and is sandwiched between post 24 and insulative filler 46, contacts and is sandwiched between base 28 and pad 64, contacts and is sandwiched between base 28 and routing line 66, contacts and is sandwiched between base 28 and cap 68 and is spaced from post 26, adhesive 36, terminal 70 and cap 72. Adhesive 34 also extends laterally from post 24 beyond and overlaps terminal 70, covers base 28 outside the periphery of post 24 in the upward direction, covers cap 68 outside the periphery of post 24 in the downward direction, covers and surrounds post 24 in the lateral directions and is solidified.

Adhesive 36 contacts and is sandwiched between post 26 and insulative filler 46, contacts and is sandwiched between base 28 and terminal 70, contacts and is sandwiched between base 28 and cap 72 and is spaced from post 24, adhesive 34, pad 64, routing line 66 and cap 68. Adhesive 36 also extends laterally from post 26 beyond and overlaps terminal 70, covers base 28 outside the periphery of post 26 in the downward direction, covers cap 72 outside the periphery of post 26 in the upward direction, covers and surrounds post 26 in the lateral directions and is solidified.

Adhesive 34 alone can intersect an imaginary horizontal line between post 24 and insulative filler 46, an imaginary vertical line between base 28 and pad 64, an imaginary vertical line between base 28 and routing line 66 and an imaginary vertical line between base 28 and cap 68. Thus, an imaginary horizontal line exists that intersects only adhesive 34 as the line extends from post 24 to insulative filler 46, an imaginary vertical line exists that intersects only adhesive 34 as the line extends from base 28 to pad 64 and so on.

Adhesive 36 alone can intersect an imaginary horizontal line between post 26 and insulative filler 46, an imaginary vertical line between base 28 and terminal 70 and an imaginary vertical line between base 28 and cap 72. Thus, an imaginary horizontal line exists that intersects only adhesive 36 as the line extends from post 26 to insulative filler 46, an imaginary vertical line exists that intersects only adhesive 36 as the line extends from base 28 to terminal 70 and so on.

Insulative filler 46 contacts base 28, adhesives 34 and 36, routing line 66 and terminal 70 in outer hole 44, is spaced from posts 24 and 26, extends through base 28 and adhesives 34 and 36 and extends into but not through routing line 66 and terminal 70.

Plated through-hole 58 extends through base 28 and adhesives 34 and 36 in inner hole 50. Plated through-hole 58 also contacts insulative filler 46, is spaced from base 28 and adhesives 34 and 36 by insulative filler 46 and is electrically isolated from base 28 by insulative filler 46. Plated through-hole 58 also retains its tubular shape with straight vertical inner and outer sidewalls in which its diameter is constant as it extends vertically from routing line 66 to terminal 70.

Pad 64 and cap 68 have the same thickness where they are closest to one another, have different thickness where cap 68 is adjacent to post 24, contact and extend above adhesive 34 and are coplanar with one another above adhesive 34 at a top surface that faces in the upward direction.

Terminal 70 and cap 72 have the same thickness where they are closest to one another, have different thickness where cap 72 is adjacent to post 26, contact and extend below adhesive 36 and are coplanar with one another below adhesive 36 at a bottom surface that faces in the downward direction.

Base 28 and adhesives 34 and 36 extend to straight vertical peripheral edges of thermal board 90 after it is detached or singulated from a batch of identical simultaneously manufactured thermal boards.

Pad 64 is customized as an electrical interface for a semiconductor device such as an LED chip that is subsequently mounted on cap 68, terminal 70 is customized as an electrical interface for the next level assembly such as a solderable electrical contact from a printed circuit board, cap 68 is customized as a thermal interface for the semiconductor device, and cap 72 is customized as a thermal interface for the next level assembly such as the printed circuit board or a heat sink for an electronic device.

Pad 64 and terminal 70 are horizontally and vertically offset from one another and exposed at the top and bottom surfaces, respectively, of thermal board 90, thereby providing horizontal and vertical signal routing between the semiconductor device and the next level assembly.

Conductive trace 74 provides horizontal (fan-out) routing from pad 64 to plated through-hole 58 by routing line 66 and vertical (top to bottom) routing from pad 64 to terminal 70 by plated through-hole 58. Conductive trace 74 is not limited to this configuration. For instance, pad 64 can be electrically connected to plated through-hole 58 without a routing line above adhesive 34 as defined by etch mask 60, and terminal 70 can be electrically connected to plated through-hole 58 by a routing line below adhesive 36 as defined by etch mask 62. Pad 64 or routing line 66 can be electrically connected to terminal 70 by separate plated through-holes 58 in separate electrically conductive paths. Furthermore, the electrically conductive path can include vias that extend through adhesives 34 and/or 36 and routing lines (above and/or below adhesives 34 and/or 36) as well as passive components such as resistors and capacitors mounted on additional pads.

Conductive trace 74 is shown in cross-section as a continuous circuit trace for convenience of illustration. However, conductive trace 74 can provide horizontal signal routing in both the X and Y directions. That is, pad 64 and terminal 70 can be laterally offset from one another in the X and Y directions. Furthermore, plated through-hole 58 can be located between pad 64 and cap 68, between terminal 70 and cap 72 or at a corner or peripheral edge of thermal board 90.

Conductive trace 74 and heat spreader 76 remain spaced from one another. As a result, conductive trace 74 and heat spreader 76 are mechanically attached and electrically isolated from one another.

Heat spreader 76 provides heat spreading and heat dissipation from a semiconductor device that is subsequently mounted on cap 68 to the next level assembly that thermal board 90 is subsequently mounted on. The semiconductor device generates heat that flows into cap 68, from cap 68 into post 24, through post 24 into base 28, through base 28 into post 26 and through post 26 into cap 72, where it is spread out relative to post 24 and dissipated in the downward direction, for instance to an underlying heat sink.

Posts 24 and 26 and base 28 are copper. Plated through-hole 58, pad 64, routing line 66, cap 68, terminal 70 and cap 72 are copper/nickel/silver. Plated through-hole 58, pad 64, routing line 66, cap 68, terminal 70 and cap 72 consist of a silver surface layer, a buried copper core and a buried nickel layer that contacts and is sandwiched between the silver surface layer and the buried copper core. Plated through-hole 58, pad 64, routing line 66, cap 68, terminal 70 and cap 72 are also primarily copper at the buried copper core. Plated contacts 78 provide the silver surface layer and the buried nickel layer and various combinations of metal plate 10, conductive layers 30 and 32 and plated metal 52 provide the buried copper core.

Conductive trace 74 includes a buried copper core shared by plated through-hole 58, pad 64, routing line 66 and terminal 70 and heat spreader 76 includes a buried copper core shared by posts 24 and 26, base 28 and caps 68 and 72. Furthermore, conductive trace 74 includes a plated contact 78 at plated through-hole 58, pad 64, routing line 66 and terminal 70 and heat spreader 76 includes a plated contact 78 at cap 68 and spaced from posts 24 and 26 and base 28 and another plated contact 78 at cap 72 and spaced from posts 24 and 26 and cap 68. Moreover, conductive trace 74 consists of copper/nickel/silver and is primarily copper at the buried copper core and heat spreader 76 consists of copper/nickel/silver and is primarily copper at the buried copper core.

Thermal board 90 does not expose post 24, post 26 or base 28 in the upward or downward direction. Post 24 is shown in phantom in FIG. 6R and post 26 is shown in phantom in FIG. 6S for convenience of illustration.

Thermal board 90 can include multiple conductive traces 74 with a plated through-hole 58, pad 64, routing line 66 and terminal 70. A single conductive trace 74 is described and labeled for convenience of illustration. In conductive traces 74, plated through-holes 58, pads 64 and terminals 70 generally have similar shapes and sizes. For instance, some conductive traces 74 may be spaced and separated and electrically isolated from one another whereas other conductive traces 74 can intersect or route to the same pad 64, routing line 66 or terminal 70 and be electrically connected to one another. Likewise, some pads 64 may receive independent signals whereas other pads 64 share a common signal, power or ground.

Thermal board 90 can be adapted for an LED package with blue, green and red LED chips, with each LED chip including an anode and a cathode and each LED package including a corresponding anode terminal and cathode terminal. In this instance, thermal board 90 can include six pads 64 and four terminals 70 so that each anode is routed from a separate pad 64 to a separate terminal 70 whereas each cathode is routed from a separate pad 64 to a common ground terminal 70.

A brief cleaning step can be applied to the structure at various manufacturing stages to remove oxides and debris that may be present on the exposed metal. For instance, a brief oxygen plasma cleaning step can be applied to the structure.

Alternatively, a brief wet chemical cleaning step using a solution containing potassium permanganate can be applied to the structure. Likewise, the structure can be rinsed in distilled water to remove contaminants. The cleaning step cleans the desired surfaces without appreciably affecting or damaging the structure.

Advantageously, there is no plating bus or related circuitry that need be disconnected or severed from conductive traces 74 after they are formed. A plating bus can be disconnected during the wet chemical etch that forms pad 64, routing line 66 and cap 68.

Thermal board 90 can include registration holes (not shown) that are drilled or sliced through base 28 and adhesives 34 and 36 so that thermal board 90 can be positioned by inserting tooling pins through the registration holes when it is subsequently mounted on an underlying carrier.

Thermal board 90 can accommodate multiple semiconductor devices rather than one with a single post 24 or multiple posts 24. Thus, multiple semiconductor devices can be mounted on a single post 24 or separate semiconductor devices can be mounted on separate posts 24.

Thermal board 90 with a single post 24 for multiple semiconductor devices can be accomplished by drilling additional holes to define additional plated through-holes 58, adjusting etch mask 60 to define additional pads 64 and routing lines 66 and adjusting etch mask 62 to define additional terminals 70. The plated through-holes 58, pads 64, routing lines 66 and terminals 70 can be laterally repositioned to provide a 2×2 array for four semiconductor devices. In addition, the topography (lateral shape) can be adjusted for pads 64 and terminals 70.

Thermal board 90 with multiple posts 24 for multiple semiconductor devices can be accomplished by adjusting etch mask 16 to define additional posts 24, adjusting conductive layer 30 to include additional apertures 30A, adjusting adhesive 34 to include additional openings 34A, drilling additional outer holes 44 and inner holes 50 to define additional plated through-holes 58, adjusting etch mask 60 to define additional pads 64, routing lines 66 and caps 68 and adjusting etch mask 62 to define additional terminals 70. These elements can be laterally repositioned to provide a 2×2 array for four semiconductor devices. In addition, the topography (lateral shape) can be adjusted for posts 24, pads 64, routing lines 66, caps 68 and terminals 70.

Figure 7A:
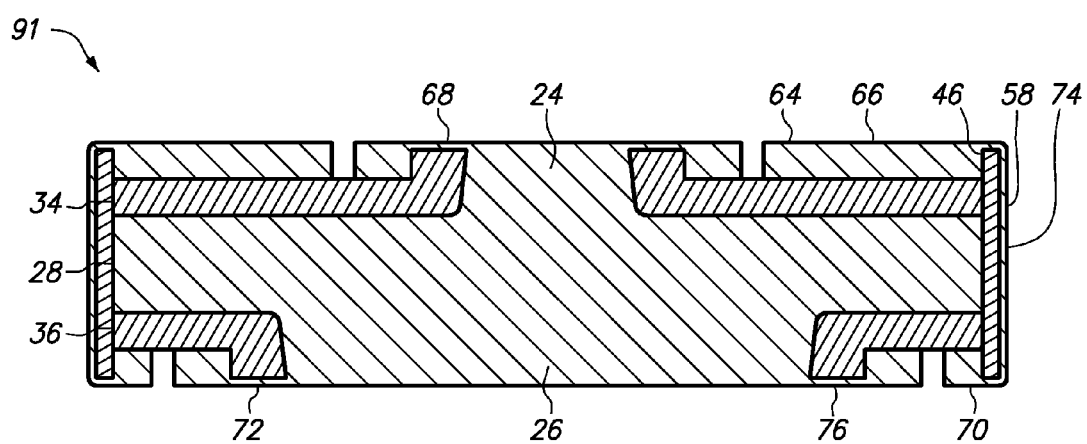
FIGS. 7A, 7B and 7C are cross-sectional, top and bottom views, respectively, of a thermal board with a plated through-hole at a peripheral edge in accordance with an embodiment of the present invention.
Figure 7B:
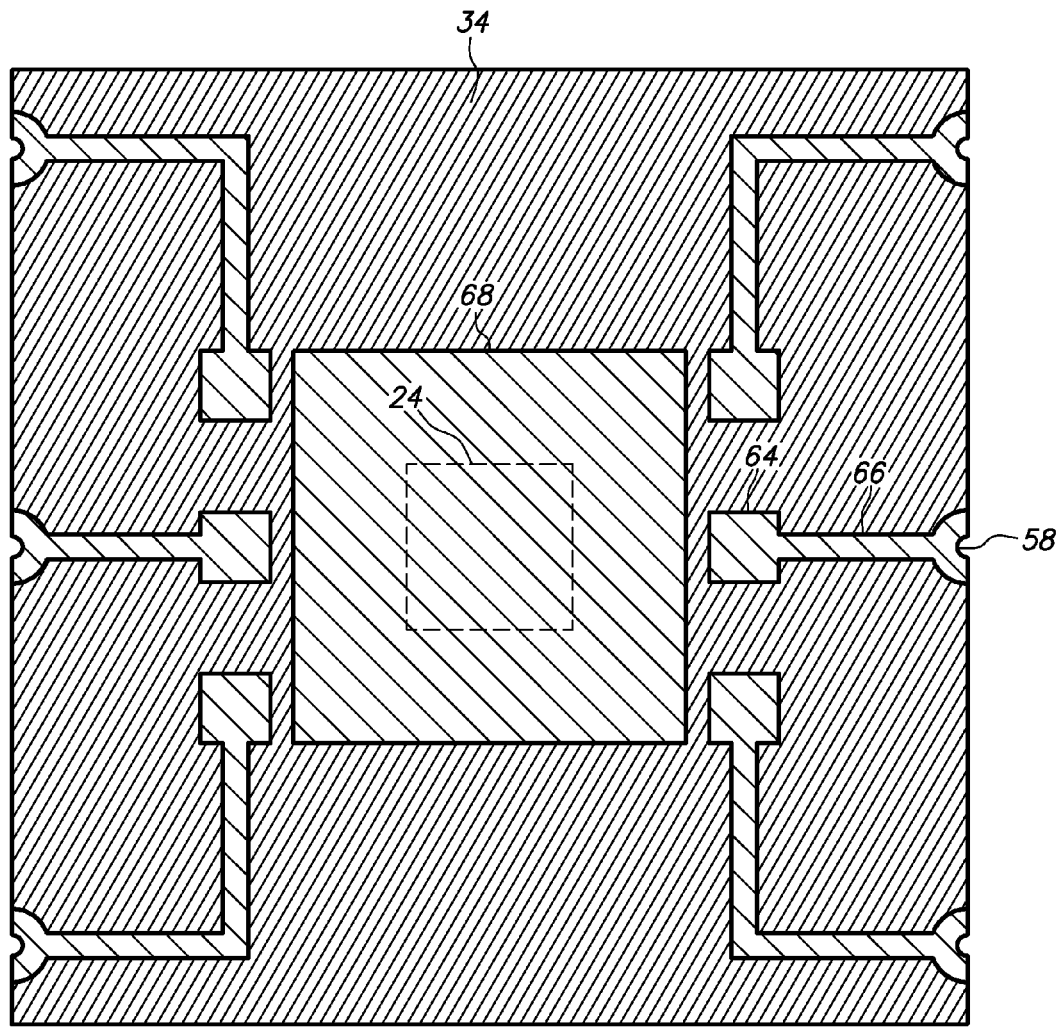
Figure 7C:
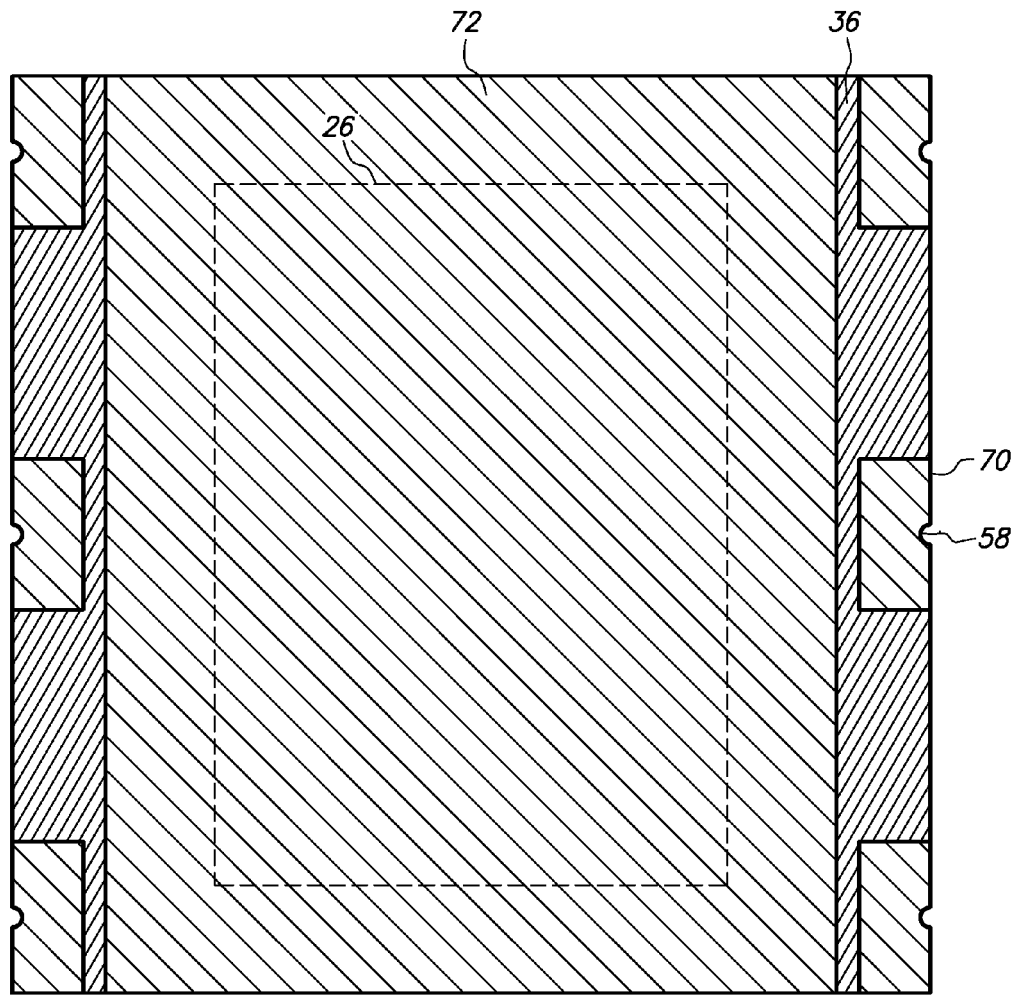

FIGS. 7A, 7B and 7C are cross-sectional, top and bottom views, respectively, of a thermal board with a plated through-hole at a peripheral edge in accordance with an embodiment of the present invention.

In this embodiment, the plated through-hole is located at a peripheral edge where the thermal board is detached. For purposes of brevity, any description of thermal board 90 is incorporated herein insofar as the same is applicable, and the same description need not be repeated Likewise, elements of the thermal board similar to those in thermal board 90 have corresponding reference numerals.

Thermal board 91 includes adhesives 34 and 36, insulative filler 46, conductive trace 74 and heat spreader 76. Conductive trace 74 includes plated through-hole 58, pad 64, routing line 66 and terminal 70. Heat spreader 76 includes posts 24 and 26, base 28 and caps 68 and 72.

Plated through-hole 58 is located at a peripheral edge of thermal board 91 rather than spaced from the peripheral edges of thermal board 91. As a result, thermal board 91 is more compact than thermal board 90. Furthermore, plated through-hole 58 has a semi-tubular shape with a semi-circular circumference rather than a tubular shape with a circular circumference and adhesives 34 and 36 extend laterally from posts 24 and 26 to but not beyond terminal 70.

Thermal board 91 can be manufactured in a manner similar to thermal board 90 with suitable adjustments for plated through-hole 58. For instance, adhesive 36 is mounted on base 28, conductive layer 32 is mounted on adhesive 36, the structure is inverted, adhesive 34 is mounted on base 28 and conductive layer 30 is mounted on adhesive 34. Thereafter, heat and pressure are applied to flow and solidify adhesives 34 and 36, outer hole 44 is drilled through base 28, conductive layers 30 and 32 and adhesives 34 and 36, insulative filler 46 is deposited into outer hole 44, grinding is applied to planarize the top and bottom surfaces, inner hole 50 is drilled through insulative filler 46 and then plated layers 54 and 56 and plated through-hole 58 are deposited on the structure. Thereafter, conductive layer 30 and plated layer 54 are etched to form pad 64, routing line 66 and cap 68, conductive layer 32 and plated layer 56 are etched to form terminal 70 and cap 72 and then plated contacts 78 provide a surface finish for pad 64, cap 68, terminal 70 and cap 72. Thereafter, base 28 and adhesives 34 and 36 are cut or cracked at the peripheral edges of thermal board 91 to detach it from the batch. As a result, a semi-tubular portion of plated through-hole 58 is detached from the peripheral edge while another semi-tubular portion of plated through-hole 58 at the peripheral edge remains intact.

Figure 8A:
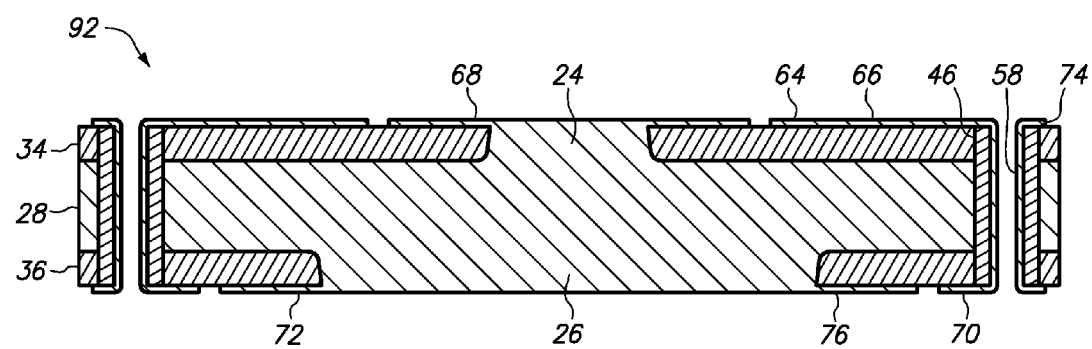
FIGS. 8A, 8B and 8C are cross-sectional, top and bottom views, respectively, of a thermal board with a pad and a first cap with the same thickness and a terminal and a second cap with the same thickness in accordance with an embodiment of the present invention.
Figure 8B:
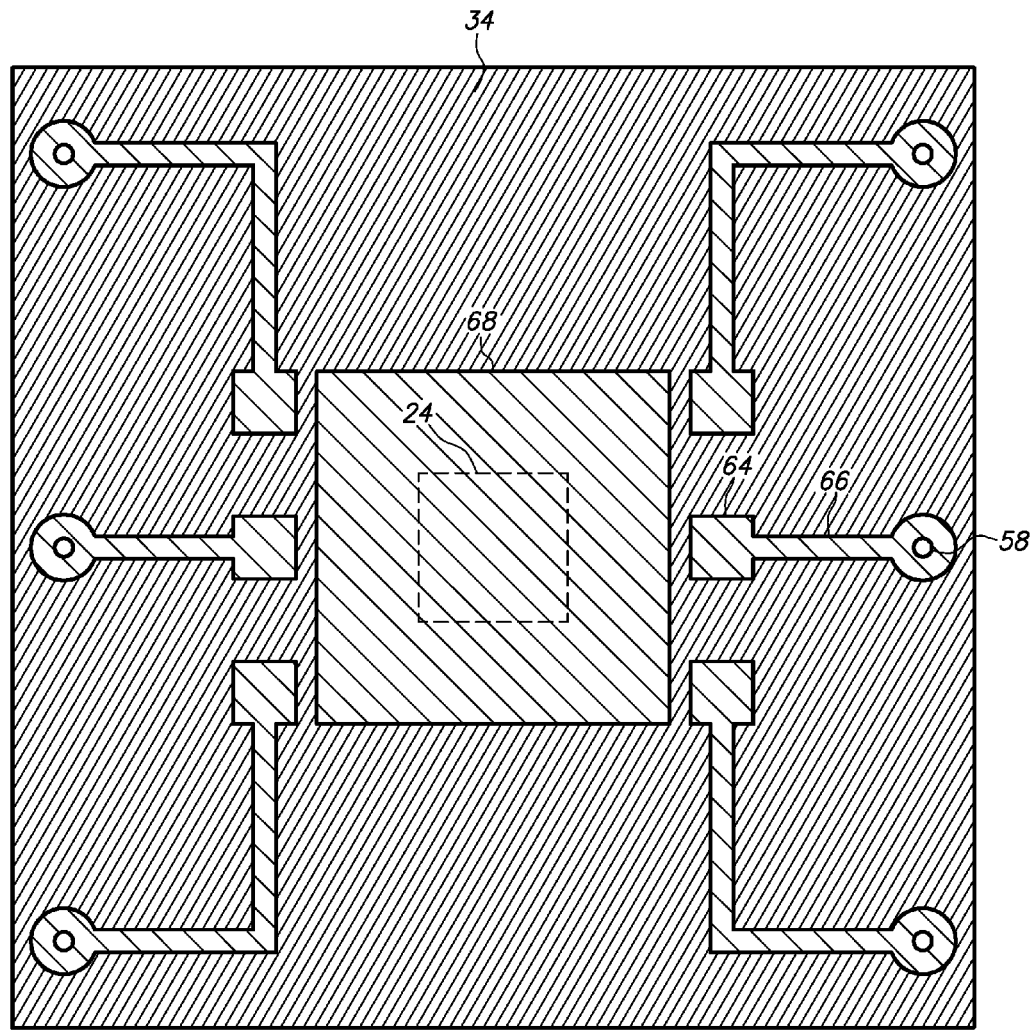
Figure 8C:
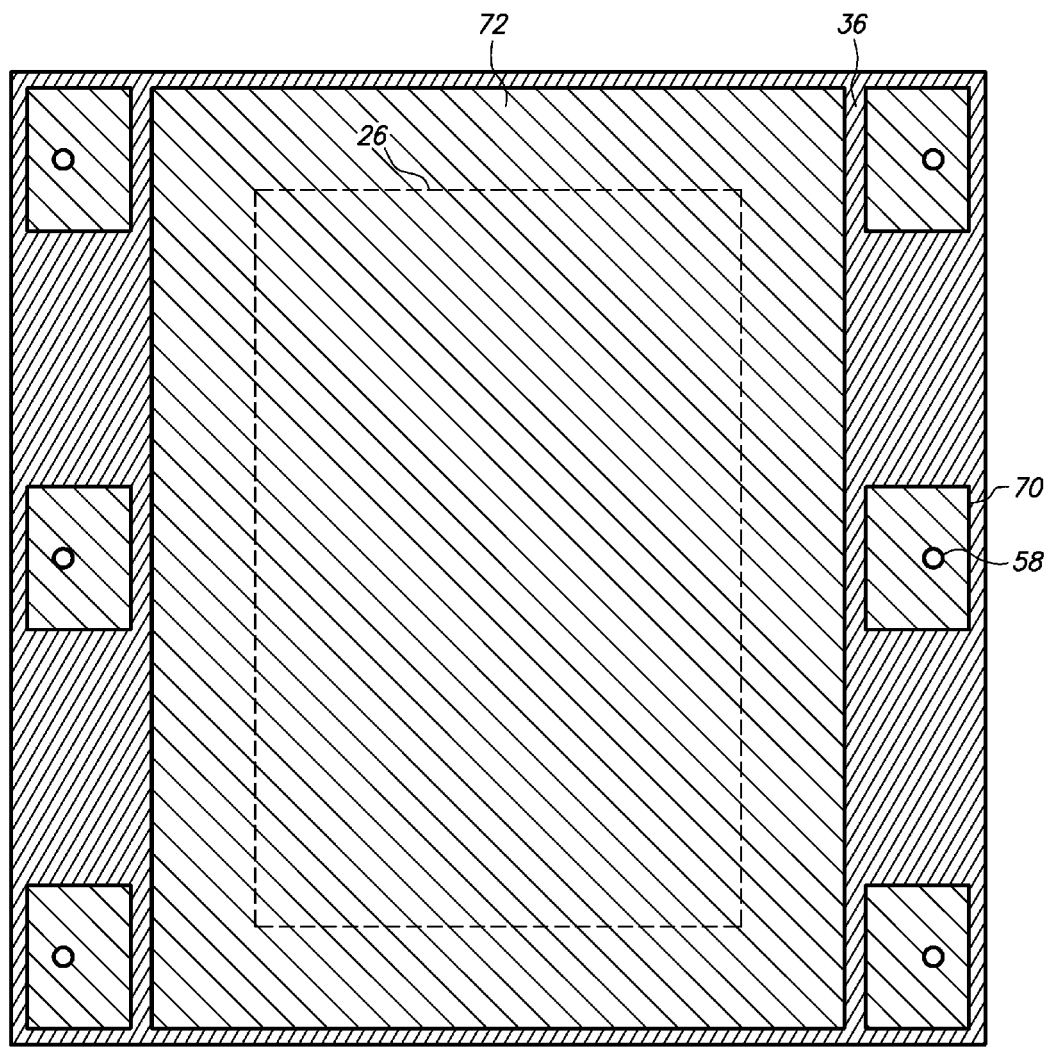

FIGS. 8A, 8B and 8C are cross-sectional, top and bottom views, respectively, of a thermal board with a pad and a first cap with the same thickness and a terminal and a second cap with the same thickness in accordance with an embodiment of the present invention.

In this embodiment, the pad and the first cap are above the first adhesive and have the same thickness and the terminal and the second cap are below the second adhesive and have the same thickness. For purposes of brevity, any description of thermal board 90 is incorporated herein insofar as the same is applicable, and the same description need not be repeated Likewise, elements of the thermal board similar to those in thermal board 90 have corresponding reference numerals.

Thermal board 92 includes adhesives 34 and 36, insulative filler 46, conductive trace 74 and heat spreader 76. Conductive trace 74 includes plated through-hole 58, pad 64, routing line 66 and terminal 70. Heat spreader 76 includes posts 24 and 26, base 28 and caps 68 and 72.

Pad 64 and cap 68 contact and are located above adhesive 34. Pad 64 and cap 68 also have the same thickness. Thus, pad 64 and cap 68 have the same thickness not only where they are closest to one another but also where cap 68 is adjacent to post 24.

Terminal 70 and cap 72 contact and are located below adhesive 36. Terminal 70 and cap 72 also have the same thickness. Thus, terminal 70 and cap 72 have the same thickness not only where they are closest to one another but also where cap 72 is adjacent to post 26.

Thermal board 92 can be manufactured in a manner similar to thermal board 90 with suitable adjustments for pad 64, routing line 66, cap 68, terminal 70 and cap 72. For instance, metal plate 10 is 300 microns (rather than 500 microns) and posts 24 and 26 have a height of 50 microns (rather than 150 microns). Furthermore, adhesives 34 and 36 as prepregs have a thickness of 60 microns (rather than 100 microns).

Adhesive 36 is mounted on base 28, the structure is inverted and adhesive 34 is mounted on base 28. However, conductive layers 30 and 32 are omitted. Furthermore, posts 24 and 26 extend into but not through openings 34A and 36A.

Thereafter, heat and pressure are applied to flow and solidify adhesives 34 and 36. For instance, adhesives 34 and 36 can be disposed between top and bottom platens of a press. In addition, a top cull plate and top buffer paper can be sandwiched between adhesive 34 and the top platen, and a bottom cull plate and bottom buffer paper can be sandwiched between adhesive 36 and the bottom platen. The stack includes the top platen, top cull plate, top buffer paper, adhesive 34, base 28, adhesive 36, bottom buffer paper, bottom cull plate and bottom platen in descending order. Thus, adhesive 34 contacts and is sandwiched between base 28 and the top buffer paper and adhesive 36 contacts and is sandwiched between base 28 and the bottom buffer paper.

The platens are heated and move towards one another, thereby applying heat and pressure to adhesives 34 and 36. As the platen motion and heat continue, adhesive 34 between base 28 and the top platen is compressed, melted and flows into contact with post 24 and adhesive 36 between base 28 and the bottom platen is compressed, melted and flows into contact with post 26. Furthermore, adhesive 34 creates a thin coating on the top surface of post 24 and adhesive 36 creates a thin coating on the bottom surface of post 26. The platen motion is eventually blocked by posts 24 and 26 and the platens become stationary but continue to apply heat to solidify adhesives 34 and 36. Thereafter, the platens move away from one another and the structure is released from the press.

The top buffer paper provides a release sheet for adhesive 34 and the bottom buffer paper provides a release sheet for adhesive 36. As a result, the top buffer paper is easily peeled off from adhesive 34 without delaminating adhesive 34 and the bottom buffer paper is easily peeled off adhesive 36 without delaminating adhesive 36 after adhesives 34 and 36 are solidified. Moreover, adhesive 34 laminates only itself to post 24 and base 28 and adhesive 36 laminates only itself to post 26 and base 28.

Thereafter, outer hole 44 is drilled through base 28 and adhesives 34 and 36, insulative filler 46 is deposited into outer hole 44, grinding is applied to planarize the top and bottom surfaces, inner hole 50 is drilled through insulative filler 46 and then plated layers 54 and 56 and plated through-hole 58 are deposited on the structure. Thereafter, plated layer 54 alone is etched to form pad 64, routing line 66 and cap 68, plated layer 56 alone is etched to form terminal 70 and cap 72 and then plated contacts 78 provide a surface finish for pad 64, cap 68, terminal 70 and cap 72. Thereafter, base 28 and adhesives 34 and 36 are cut or cracked at the peripheral edges of thermal board 92 to detach it from the batch.

Figure 9A:
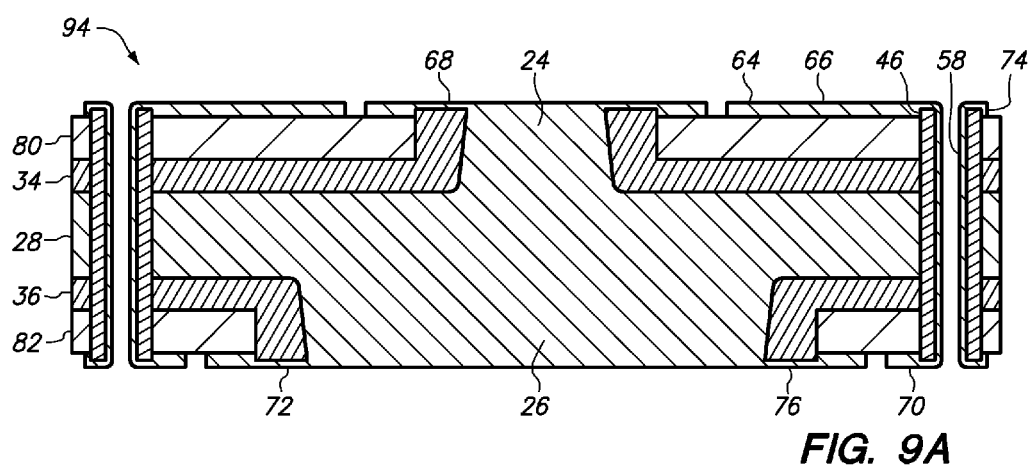
FIGS. 9A, 9B and 9C are cross-sectional, top and bottom views, respectively, of a thermal board with dielectric layers in accordance with an embodiment of the present invention.
Figure 9B:
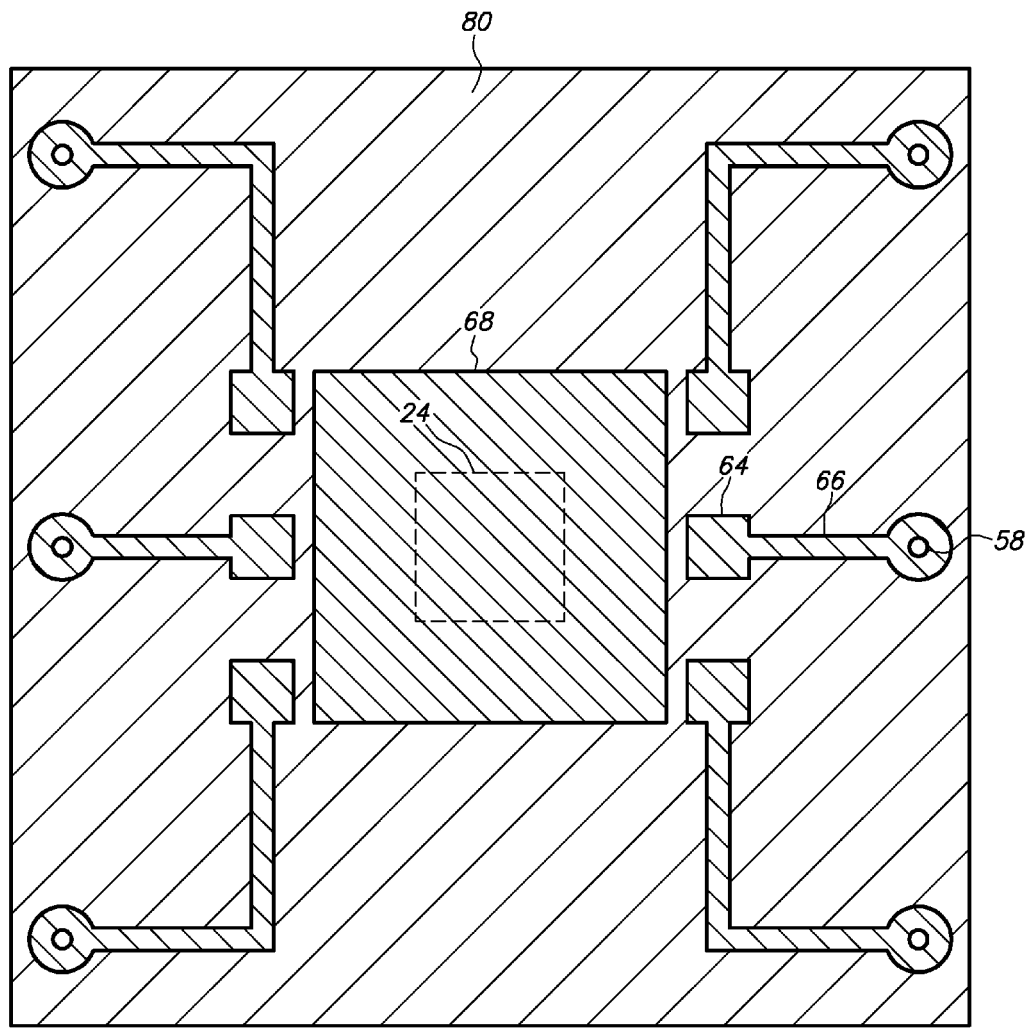
Figure 9C:
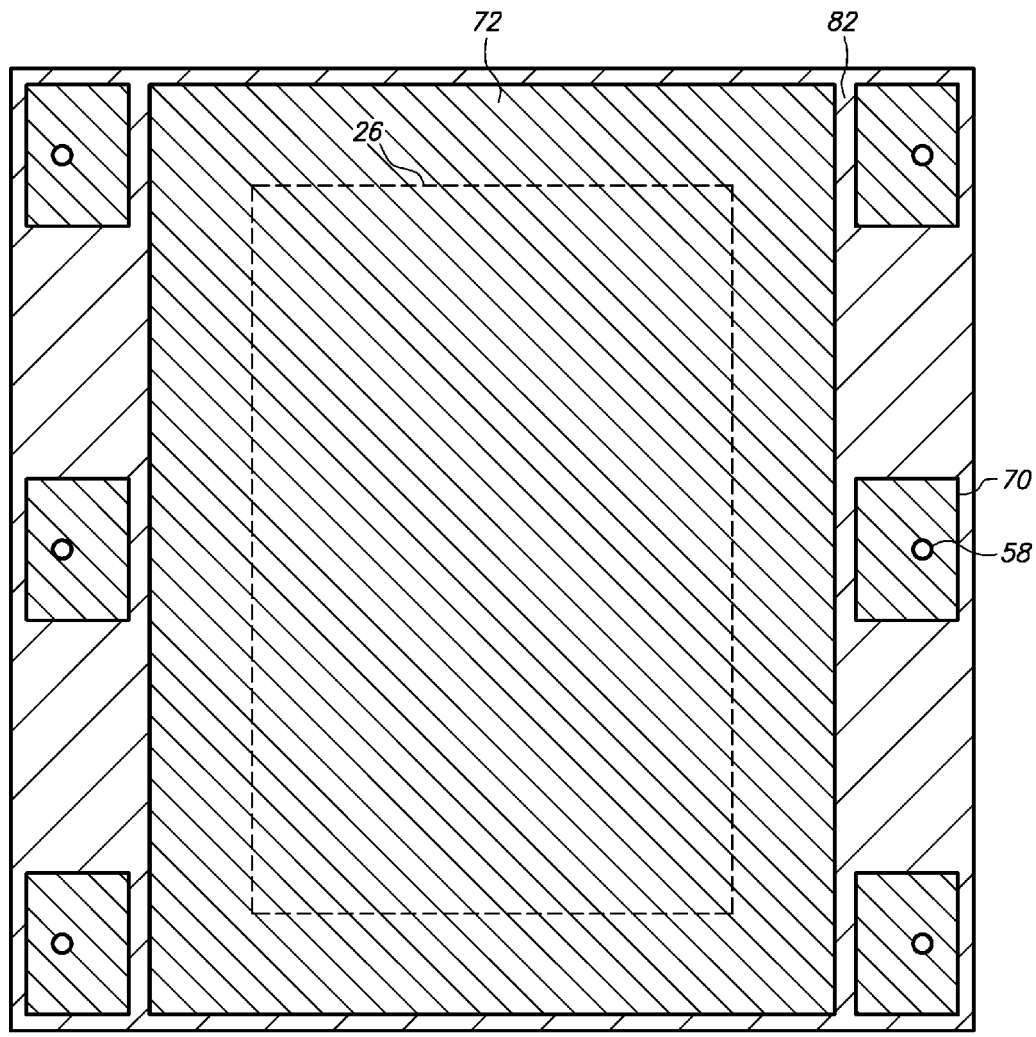

FIGS. 9A, 9B and 9C are cross-sectional, top and bottom views, respectively, of a thermal board with first and second dielectric layers in accordance with an embodiment of the present invention.

In this embodiment, a first dielectric layer is sandwiched between the pad and the first adhesive and a second dielectric layer is sandwiched between the terminal and the second adhesive. For purposes of brevity, any description of thermal board 90 is incorporated herein insofar as the same is applicable, and the same description need not be repeated. Likewise, elements of the thermal board similar to those in thermal board 90 have corresponding reference numerals.

Thermal board 94 includes adhesives 34 and 36, insulative filler 46, conductive trace 74, heat spreader 76 and dielectric layers 80 and 82. Conductive trace 74 includes plated through-hole 58, pad 64, routing line 66 and terminal 70. Heat spreader 76 includes posts 24 and 26, base 28 and caps 68 and 72.

Pad 64, routing line 66 and cap 68 contact and extend above dielectric layer 80. Cap 68 contacts adhesive 34 between post 24 and dielectric layer 80 but pad 64 and routing line 66 are spaced from adhesive 34. Dielectric layer 80 contacts and is sandwiched between adhesive 34 and pad 64, between adhesive 34 and routing line 66 and between adhesive 34 and cap 68 and is spaced from post 24 and base 28.

Terminal 70 and cap 72 contact and extend below dielectric layer 82. Cap 72 contacts adhesive 36 between post 26 and dielectric layer 82 but terminal 70 is spaced from adhesive 36. Dielectric layer 82 contacts and is sandwiched between adhesive 36 and terminal 70 and between adhesive 36 and cap 72 and is spaced from post 26 and base 28.

Holes 44 and 50, insulative filler 46 and plated through-hole 58 extend through dielectric layers 80 and 82. Likewise, insulative filler 46 contacts dielectric layers 80 and 82 and plated through-hole 58 is spaced from dielectric layers 80 and 82.

Thermal board 94 can be manufactured in a manner similar to thermal board 90 with suitable adjustments for dielectric layers 80 and 82. For instance, metal plate 10 is 600 microns (rather than 500 microns), posts 24 and 26 have a height of 200 microns (rather than 150 microns), conductive layers 30 and 32 have a thickness of 30 microns (rather than 80 microns) and dielectric layers 80 and 82 are electrically insulative epoxy sheets with a thickness of 100 microns. Furthermore, conductive layer 30 and dielectric layer 80 are attached to one another as a first copper/epoxy substrate, conductive layer 32 and dielectric layer 82 are attached to one another as a second copper/epoxy substrate, aperture 30A extends through conductive layer 30 and dielectric layer 80 and aperture 32A extends through conductive layer 32 and dielectric layer 82.

Adhesive 36 is mounted on base 28, conductive layer 32 and dielectric layer 82 are mounted on adhesive 36, the structure is inverted, adhesive 34 is mounted on base 28 and conductive layer 30 and dielectric layer 80 are mounted on adhesive 34. As a result, conductive layer 30 is spaced from adhesive 34, conductive layer 32 is spaced from adhesive 36, dielectric layer 80 contacts and is sandwiched between conductive layer 30 and adhesive 34 and dielectric layer 82 contacts and is sandwiched between conductive layer 32 and adhesive 36. Furthermore, adhesives 34 and 36 are non-solidified and dielectric layers 80 and 82 are solidified.

Thereafter, heat and pressure are applied to flow and solidify adhesives 34 and 36, outer hole 44 is drilled through base 28, conductive layers 30 and 32, adhesives 34 and 36 and dielectric layers 80 and 82, insulative filler 46 is deposited into outer hole 44, grinding is applied to planarize the top and bottom surfaces, inner hole 50 is drilled through insulative filler 46 and then plated layers 54 and 56 and plated through-hole 58 are deposited on the structure. Thereafter, conductive layer 30 and plated layer 54 are etched to form pad 64, routing line 66 and cap 68, conductive layer 32 and plated layer 56 are etched to form terminal 70 and cap 72 and then plated contacts 78 provide a surface finish for pad 64, cap 68, terminal 70 and cap 72. Thereafter, base 28, adhesives 34 and 36 and dielectric layers 80 and 82 are cut or cracked at the peripheral edges of thermal board 94 to detach it from the batch.

Figure 10A:
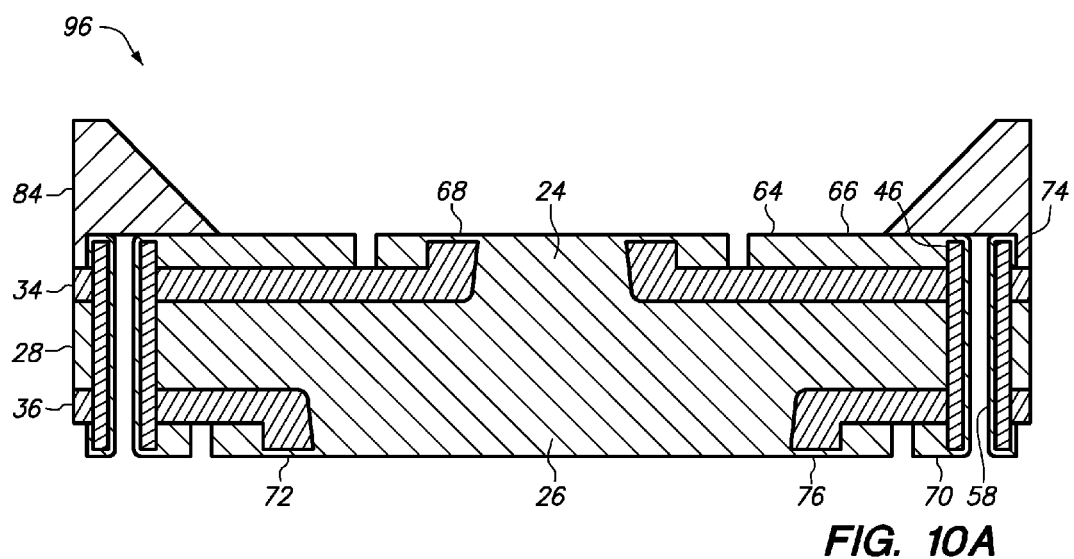
FIGS. 10A, 10B and 10C are cross-sectional, top and bottom views, respectively, of a thermal board with a rim in accordance with an embodiment of the present invention.
Figure 10B:
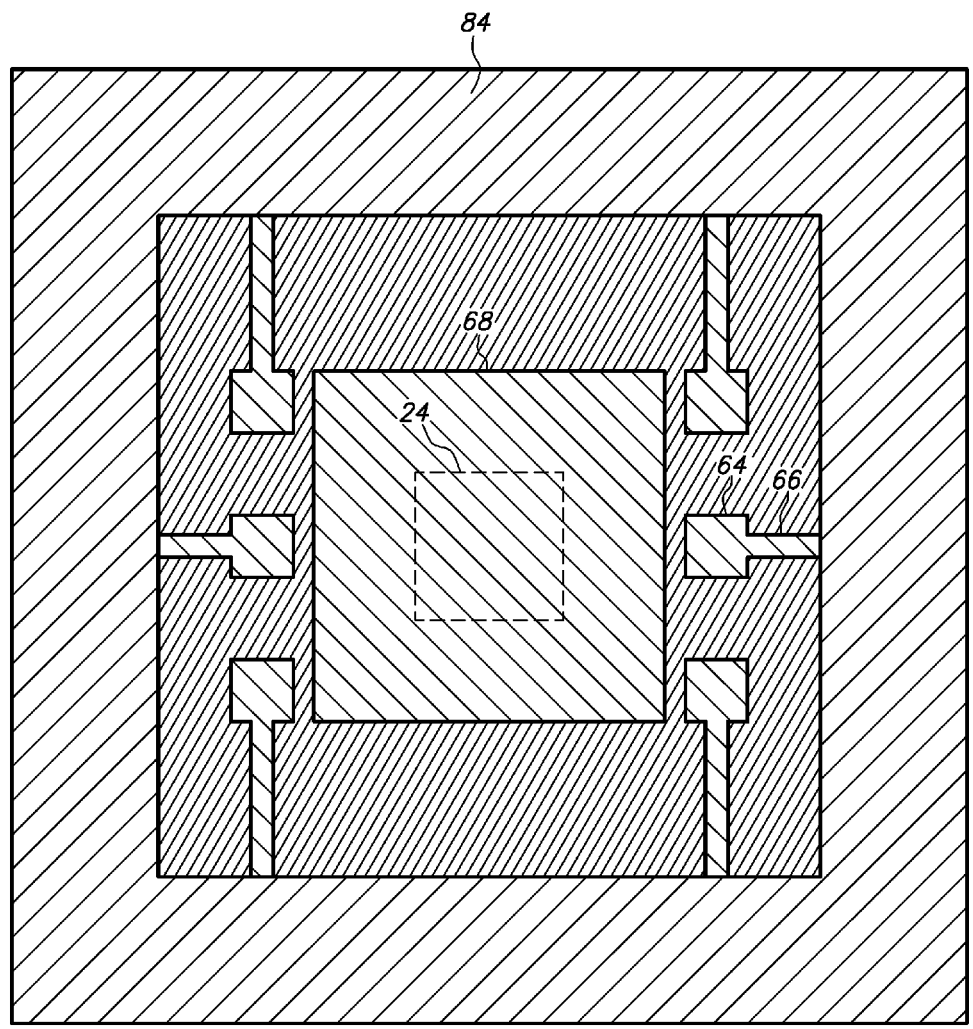
Figure 10C:
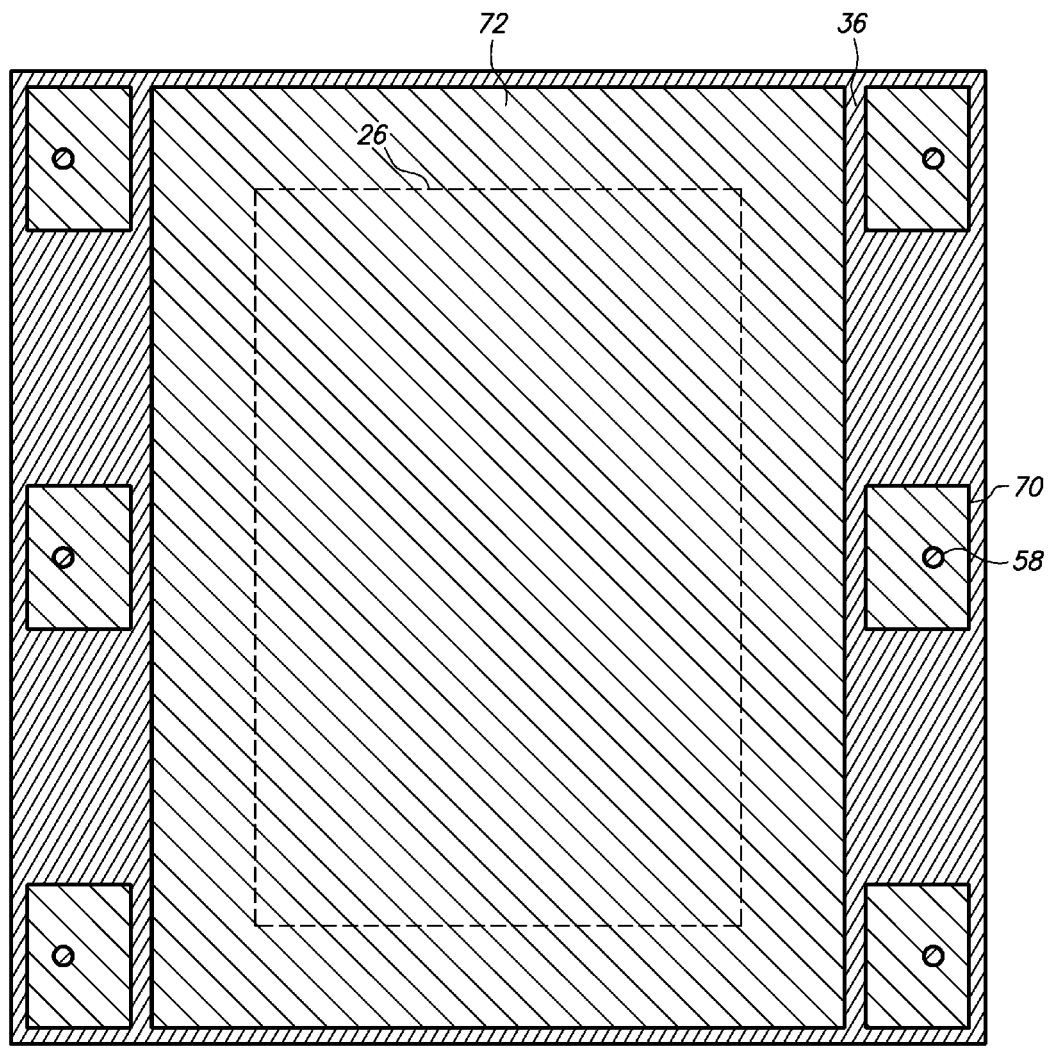

FIGS. 10A, 10B and 10C are cross-sectional, top and bottom views, respectively, of a thermal board with a rim in accordance with an embodiment of the present invention.

In this embodiment, a rim is mounted on the top surface. For purposes of brevity, any description of thermal board 90 is incorporated herein insofar as the same is applicable, and the same description need not be repeated. Likewise, elements of the thermal board similar to those in thermal board 90 have corresponding reference numerals.

Thermal board 96 includes adhesives 34 and 36, insulative filler 46, conductive trace 74, heat spreader 76 and rim 84.

Conductive trace 74 includes plated through-hole 58, pad 64, routing line 66 and terminal 70. Heat spreader 76 includes posts 24 and 26, base 28 and caps 68 and 72.

Rim 84 is a square shaped frame that contacts and extends above adhesive 34. Post 24 and cap 68 are centrally located within the periphery of rim 84. For instance, rim 84 has a height of 600 microns, a width (between its inner and outer sidewalls) of 1000 microns and is laterally spaced from cap 68 by 500 microns.

Rim 84 includes a solder mask, a laminate and an adhesive film shown as a single layer for convenience of illustration. The solder mask contacts and extends above the laminate and provides the top surface, the adhesive film contacts and extends below the laminate and provides the bottom surface, and the laminate contacts and is sandwiched between and laminated to the solder mask and adhesive film. The solder mask, laminate and adhesive film are electrical insulators. For instance, the solder mask has a thickness of 50 microns, the laminate has a thickness of 500 microns, and the adhesive film has thickness of 100 microns. Thus, rim 84 has a height of 650 microns (50+500+100).

The laminate can be various dielectric films formed from numerous organic and inorganic electrical insulators. For instance, the laminate can be polyimide or FR-4 epoxy although other epoxies such as polyfunctional and bismaleimide triazine (BT) are suitable. Alternatively, rim 84 can include a metal ring on the adhesive film.

Thermal board 96 can be manufactured in a manner similar to thermal board 90 with suitable adjustments for rim 84. For instance, For instance, adhesive 36 is mounted on base 28, conductive layer 32 is mounted on adhesive 36, the structure is inverted, adhesive 34 is mounted on base 28 and conductive layer 30 is mounted on adhesive 34. Thereafter, heat and pressure are applied to flow and solidify adhesives 34 and 36, outer hole 44 is drilled through base 28, conductive layers 30 and 32 and adhesives 34 and 36, insulative filler 46 is deposited into outer hole 44, grinding is applied to planarize the top and bottom surfaces, inner hole 50 is drilled through insulative filler 46 and then plated layers 54 and 56 and plated through-hole 58 are deposited on the structure. Thereafter, conductive layer 30 and plated layer 54 are etched to form pad 64, routing line 66 and cap 68, conductive layer 32 and plated layer 56 are etched to form terminal 70 and cap 72, then rim 84 is mounted on adhesive 34 and then plated contacts 78 provide a surface finish for pad 64, cap 68, terminal 70 and cap 72. Thereafter, base 28 and adhesives 34 and 36 are cut or cracked at the peripheral edges of thermal board 96 to detach it from the batch.

Figure 11A:
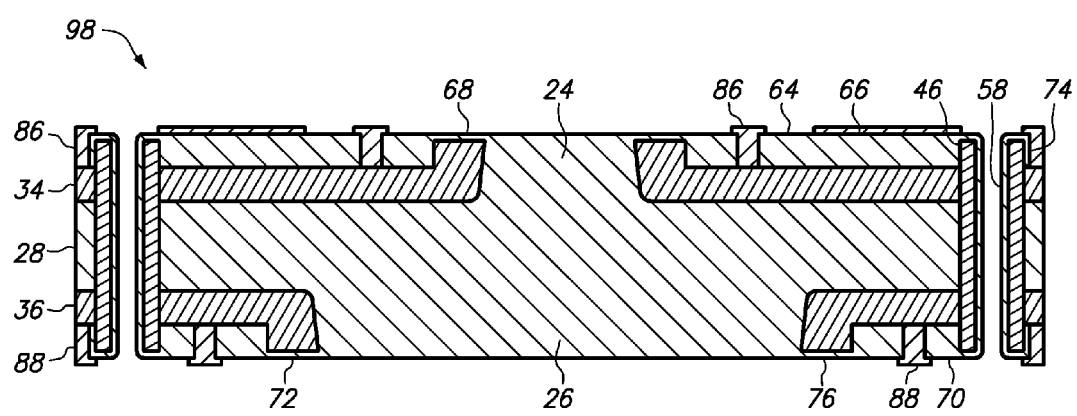
FIGS. 11A, 11B and 11C are cross-sectional, top and bottom views, respectively, of a thermal board with solder masks in accordance with an embodiment of the present invention.
Figure 11B:
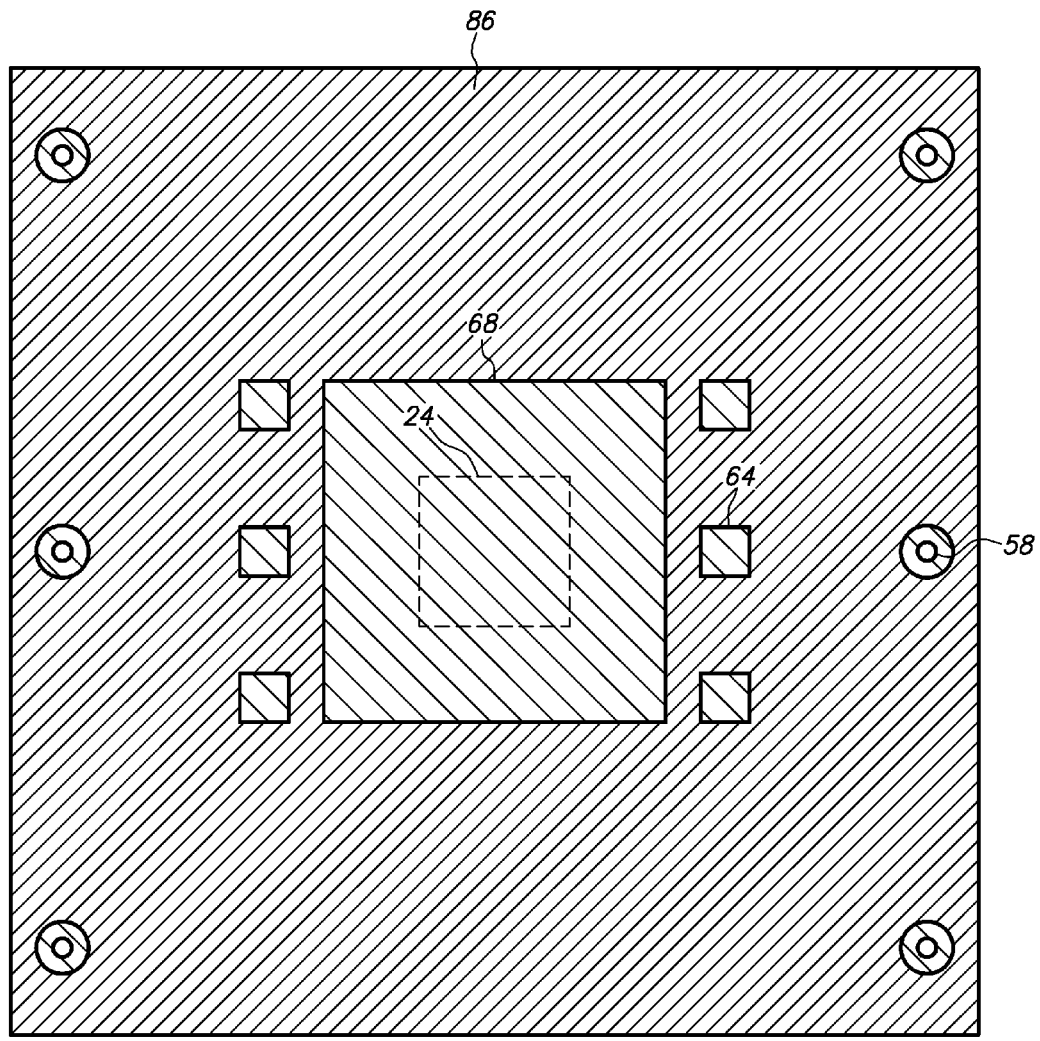
Figure 11C:
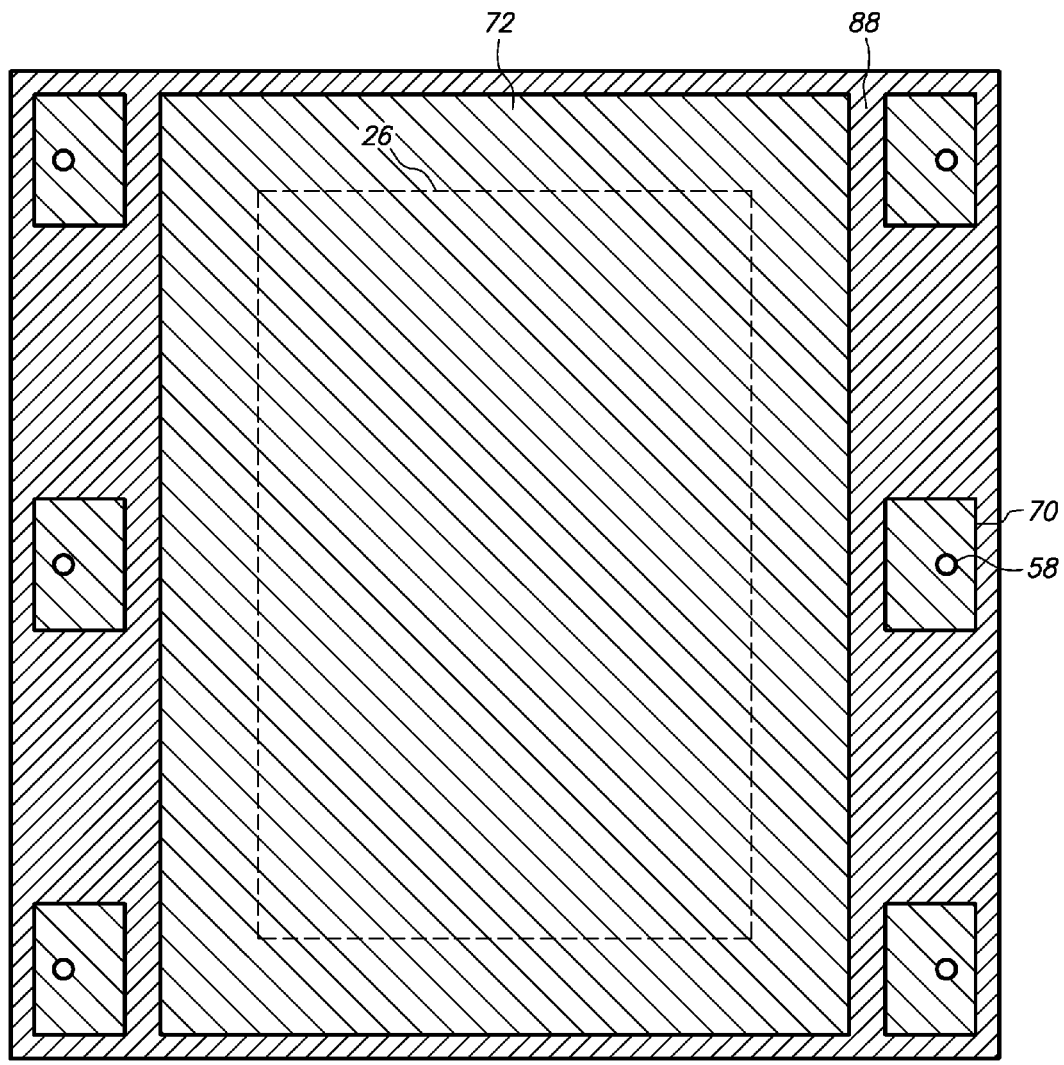

FIGS. 11A, 11B and 11C are cross-sectional, top and bottom views, respectively, of a thermal board with first and second solder masks in accordance with an embodiment of the present invention.

In this embodiment, first and second solder masks selectively expose the conductive trace and the heat spreader. For purposes of brevity, any description of thermal board 90 is incorporated herein insofar as the same is applicable, and the same description need not be repeated Likewise, elements of the thermal board similar to those in thermal board 90 have corresponding reference numerals.

Thermal board 98 includes adhesives 34 and 36, insulative filler 46, conductive trace 74, heat spreader 76 and solder masks 86 and 88. Conductive trace 74 includes plated through-hole 58, pad 64, routing line 66 and terminal 70. Heat spreader 76 includes posts 24 and 26, base 28 and caps 68 and 72.

Solder mask 86 is an electrically insulative layer that selectively exposes pad 64 and cap 68 in the upward direction and covers adhesive 34 where it is otherwise exposed in the upward direction, and solder mask 88 is an electrically insulative layer that selectively exposes terminal 70 and cap 72 in the downward direction and covers adhesive 36 where it is otherwise exposed in the downward direction.

Thermal board 98 can be manufactured in a manner similar to thermal board 90 with suitable adjustments for solder masks 86 and 88. For instance, adhesive 36 is mounted on base 28, conductive layer 32 is mounted on adhesive 36, the structure is inverted, adhesive 34 is mounted on base 28 and conductive layer 30 is mounted on adhesive 34. Thereafter, heat and pressure are applied to flow and solidify adhesives 34 and 36, outer hole 44 is drilled through base 28, conductive layers 30 and 32 and adhesives 34 and 36, insulative filler 46 is deposited into outer hole 44, grinding is applied to planarize the top and bottom surfaces, inner hole 50 is drilled through insulative filler 46 and then plated layers 54 and 56 and plated through-hole 58 are deposited on the structure. Thereafter, conductive layer 30 and plated layer 54 are etched to form pad 64, routing line 66 and cap 68 and conductive layer 32 and plated layer 56 are etched to form terminal 70 and cap 72.

Thereafter, solder mask 86 is formed on the top surface and solder mask 88 is formed on the bottom surface. Solder masks 86 and 88 are initially a photoimageable liquid resin that is dispensed on the top and bottom surfaces, respectively. Thereafter, solder masks 86 and 88 are patterned by selectively applying light through reticles (not shown) so that the solder mask portions exposed to the light are rendered insoluble, applying a developer solution to remove the solder mask portions that are unexposed to the light and remain soluble and then hard baking, as is conventional.

Thereafter, plated contacts 78 provide a surface finish for pad 64, cap 68, terminal 70 and cap 72 and then base 28, adhesives 34 and 36 and solder masks 86 and 88 are cut or cracked at the peripheral edges of thermal board 98 to detach it from the batch.

Figure 12A:
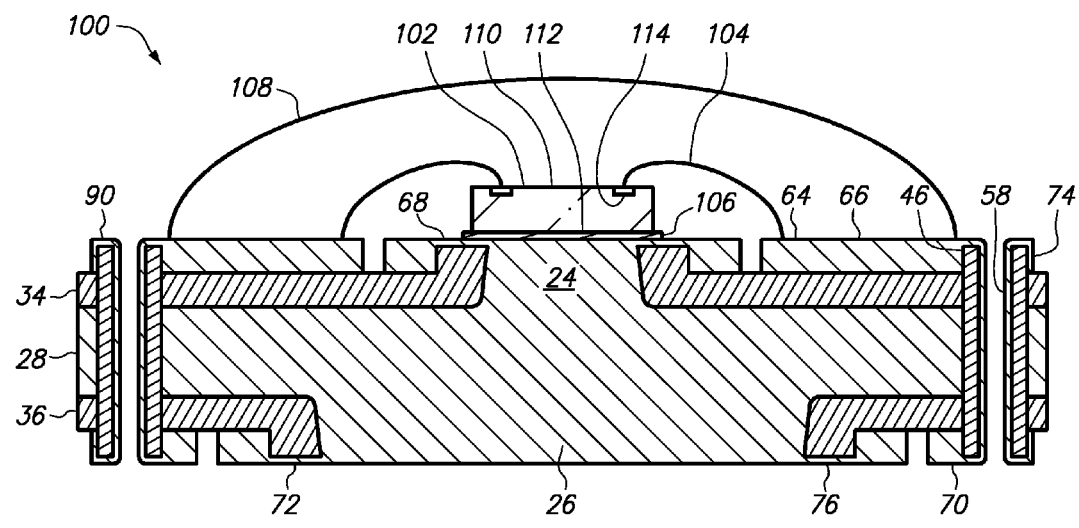
FIGS. 12A, 12B and 12C are cross-sectional, top and bottom views, respectively, of a semiconductor chip assembly that includes a thermal board, a semiconductor device and an encapsulant in accordance with an embodiment of the present invention.
Figure 12B:
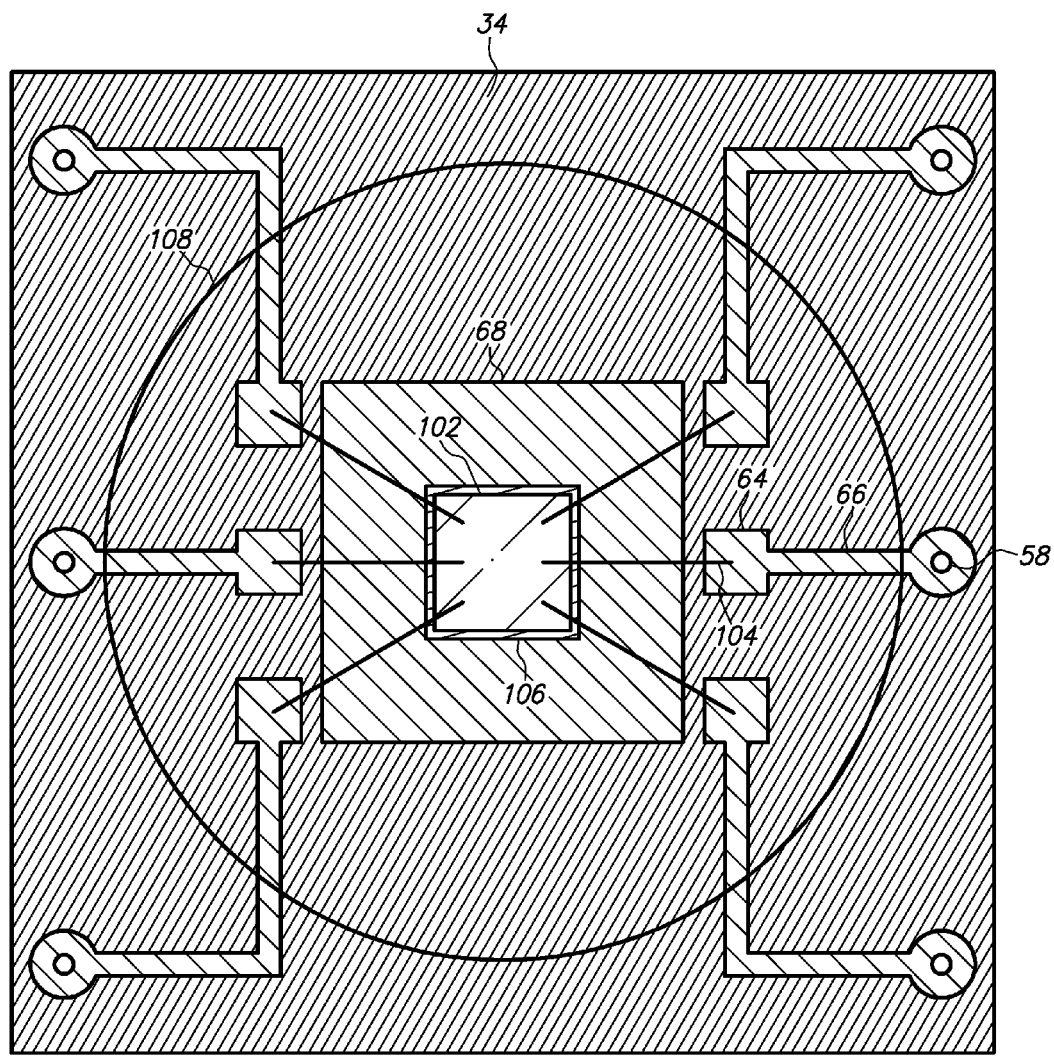
Figure 12C:
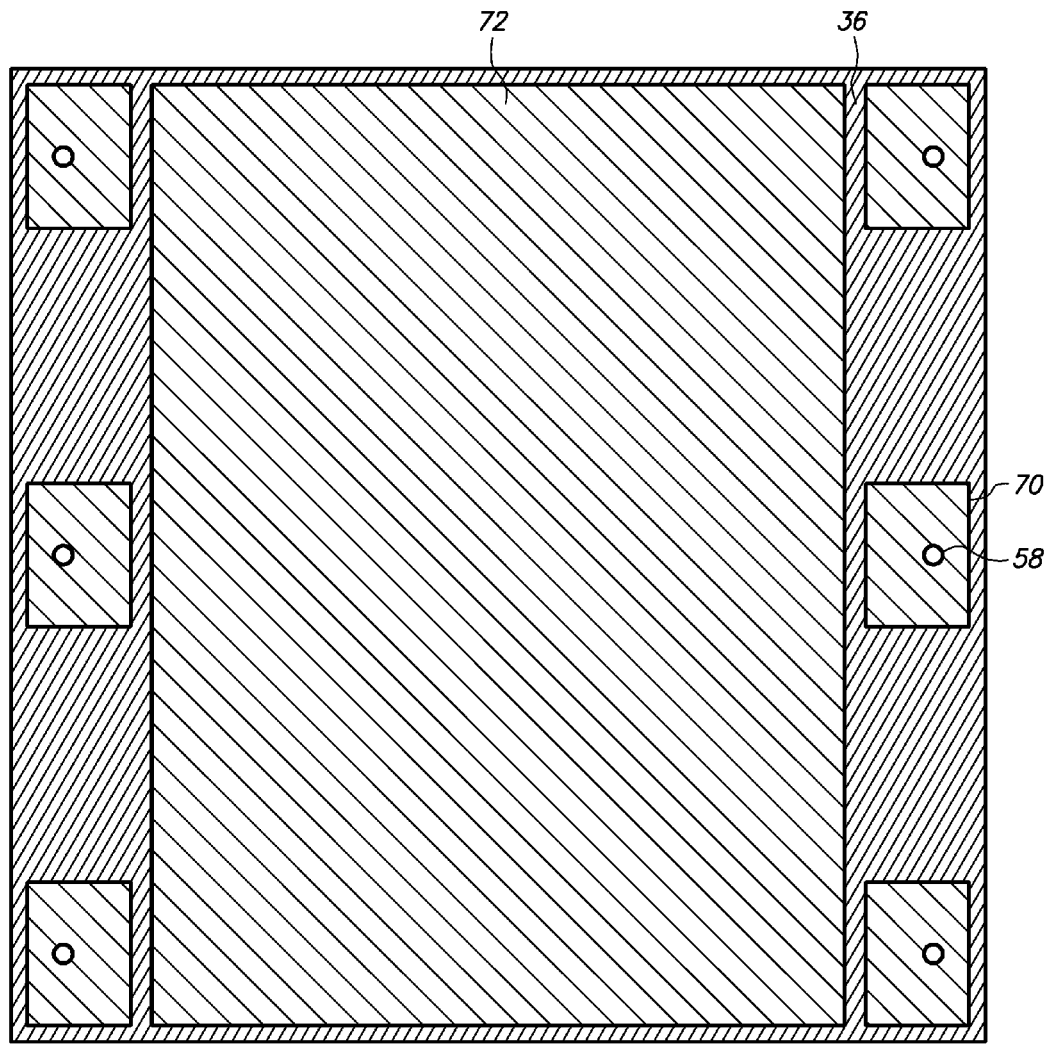

FIGS. 12A, 12B and 12C are cross-sectional, top and bottom views, respectively, of a semiconductor chip assembly that includes a thermal board, a semiconductor device and an encapsulant in accordance with an embodiment of the present invention.

In this embodiment, the semiconductor device is an LED chip that emits blue light, is mounted on the first cap, is electrically connected to the pad using a wire bond and is thermally connected to the first cap using a die attach. The semiconductor device is covered by a color-shifting encapsulant that converts the blue light to white light.

Semiconductor chip assembly 100 includes thermal board 90, LED chip 102, wire bond 104, die attach 106 and encapsulant 108. LED chip 102 includes top surface 110, bottom surface 112 and bond pad 114. Top surface 110 is the active surface and includes bond pad 114 and bottom surface 112 is a thermal contact surface.

LED chip 102 is mounted on heat spreader 76, electrically connected to conductive trace 74 and thermally connected to heat spreader 76. In particular, LED chip 102 is mounted on cap 68 (and thus post 24), overlaps (and thus extends laterally within the peripheries of) posts 24 and 26, base 28 and caps 68 and 72 but does not overlap (and thus is outside the periphery of) conductive trace 74, is electrically connected to pad 64 by wire bond 104 and is thermally connected to and mechanically attached to cap 68 by die attach 106. LED chip 102 also extends within the peripheries of posts 24 and 26, base 28 and caps 68 and 72 and is located within the peripheries of post 26, base 28 and caps 68 and 72 and outside the periphery of conductive trace 74.

For instance, wire bond 104 is bonded to and electrically connects pads 64 and 114, thereby electrically connecting LED chip 102 to terminal 70. Die attach 106 contacts and is sandwiched between and thermally connects and mechanically attaches cap 68 and thermal contact surface 112, thereby thermally connecting LED chip 102 to post 24, thereby thermally connecting LED chip 102 to base 28, thereby thermally connecting LED chip 102 to post 26 and thereby thermally connecting LED chip 102 to cap 72.

Encapsulant 108 is a solid adherent electrically insulative color-shifting protective enclosure that provides environmental protection such as moisture resistance and particle protection for LED chip 102 and wire bond 104. Encapsulant 108 contacts adhesive 34, pad 64, routing line 66, cap 68, LED chip 102, wire bond 104 and die attach 106, is spaced from posts 24 and 26, base 28, adhesive 36, plated through-hole 58, terminal 70 and cap 72 and covers post 24, pad 64, cap 68, LED chip 102, wire bond 104 and die attach 106 in the upward direction. Encapsulant 108 is transparent for convenience of illustration.

Pad 64 is spot plated with nickel/silver to bond well with wire bond 104, thereby improving signal transfer from conductive trace 74 to LED chip 102, and cap 68 is spot plated with nickel/silver to bond well with die attach 106, thereby improving heat transfer from LED chip 102 to heat spreader 76. Cap 68 also provides a highly reflective surface which reflects the light emitted towards the silver surface layer by LED chip 102, thereby increasing light output in the upward direction. Furthermore, since cap 68 is shaped and sized to accommodate thermal contact surface 112, post 24 is not and need not be shaped and sized to accommodate thermal contact 112.

LED chip 102 includes a compound semiconductor that emits blue light, has high luminous efficiency and forms a p-n junction. Suitable compound semiconductors include gallium-nitride, gallium-arsenide, gallium-phosphide, gallium-arsenic-phosphide, gallium-aluminum-phosphide, gallium-aluminum-arsenide, indium-phosphide and indium-gallium-phosphide. LED chip 102 also has high light output and generates considerable heat.

Encapsulant 108 includes transparent silicone and yellow phosphor. For instance, the silicone can be polysiloxane resin and the yellow phosphor can be cerium-doped yttrium-aluminum-garnet (Ce:YAG) fluorescent powder. The yellow phosphor emits yellow light in response to blue light, and the blue and yellow light mix to produce white light. As a result, encapsulant 108 converts the blue light emitted by LED chip 102 into white light and assembly 100 is a white light source. In addition, encapsulant 108 has a hemisphere dome shape which provides a convex refractive surface that focuses the white light in the upward direction.

Semiconductor chip assembly 100 can be manufactured by mounting LED chip 102 on cap 68 using die attach 106, then wire bonding pads 64 and 114 and then forming encapsulant 108.

For instance, die attach 106 is initially a silver-filled epoxy paste with high thermal conductivity that is selectively screen printed on cap 68 and then LED chip 102 placed on the epoxy paste using a pick-up head and an automated pattern recognition system in step-and-repeat fashion. Thereafter, the epoxy paste is heated and hardened at a relatively low temperature such as 190° C. to form die attach 106. Next, wire bond 104 is a gold wire that is thermosonically ball bonded to pads 64 and 114 and then encapsulant 108 is molded on the structure.

LED chip 102 can be electrically connected to pad 64 by a wide variety of connection media, thermally connected to and mechanically attached to heat spreader 76 by a wide variety of thermal adhesives and encapsulated by a wide variety of encapsulants.

Semiconductor chip assembly 100 is a first-level single-chip package.

Figure 13A:
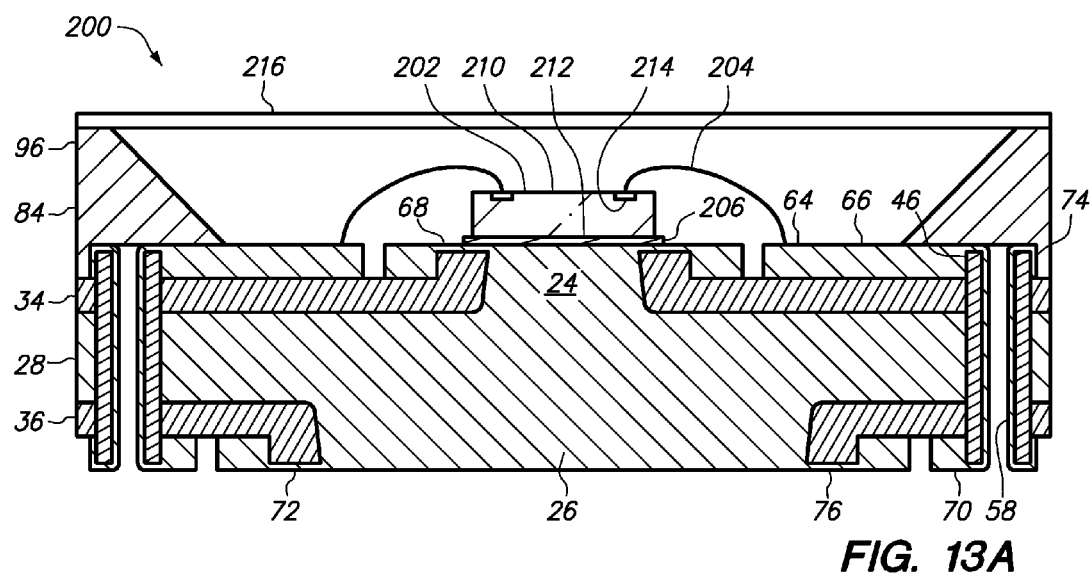
FIGS. 13A, 13B and 13C are cross-sectional, top and bottom views, respectively, of a semiconductor chip assembly that includes a thermal board with a rim, a semiconductor device and a lid in accordance with an embodiment of the present invention.
Figure 13B:
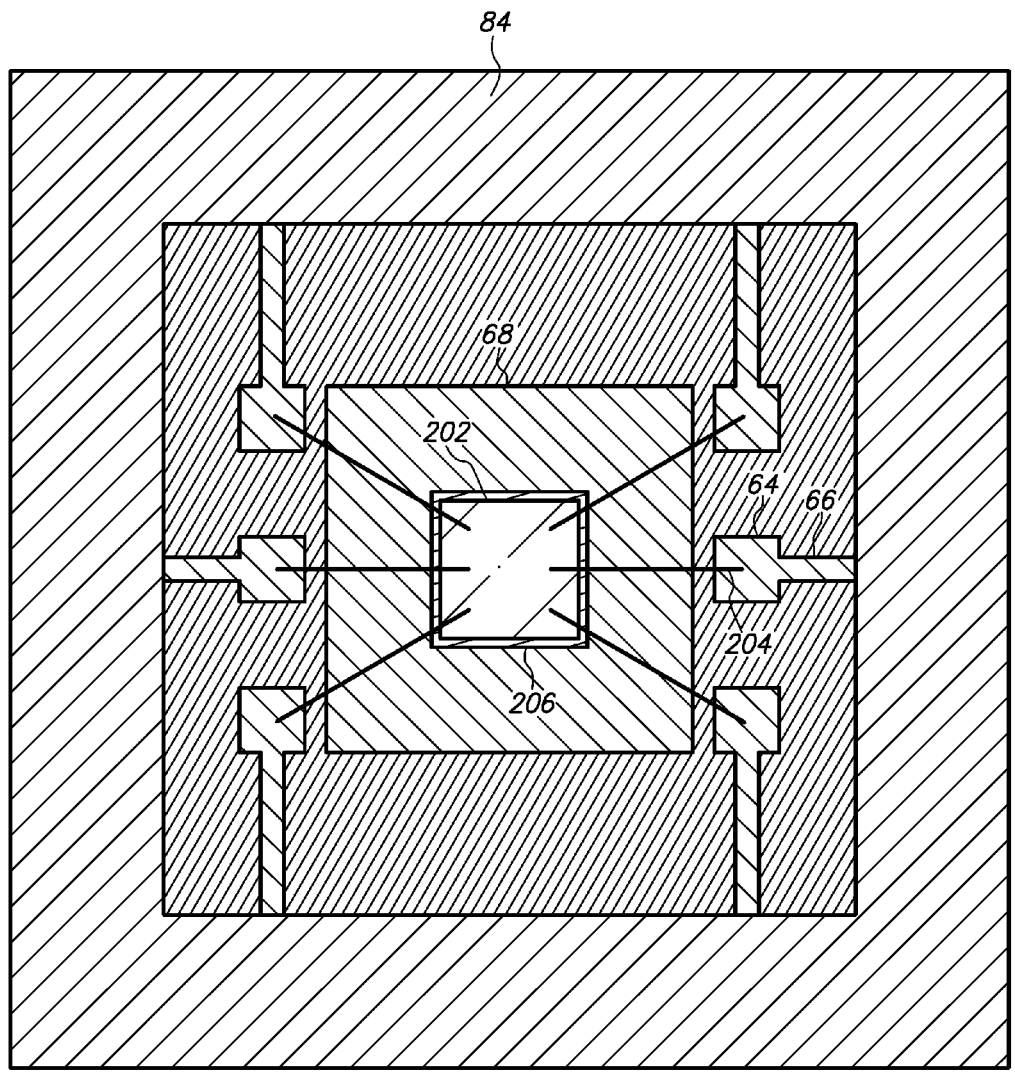
Figure 13C:
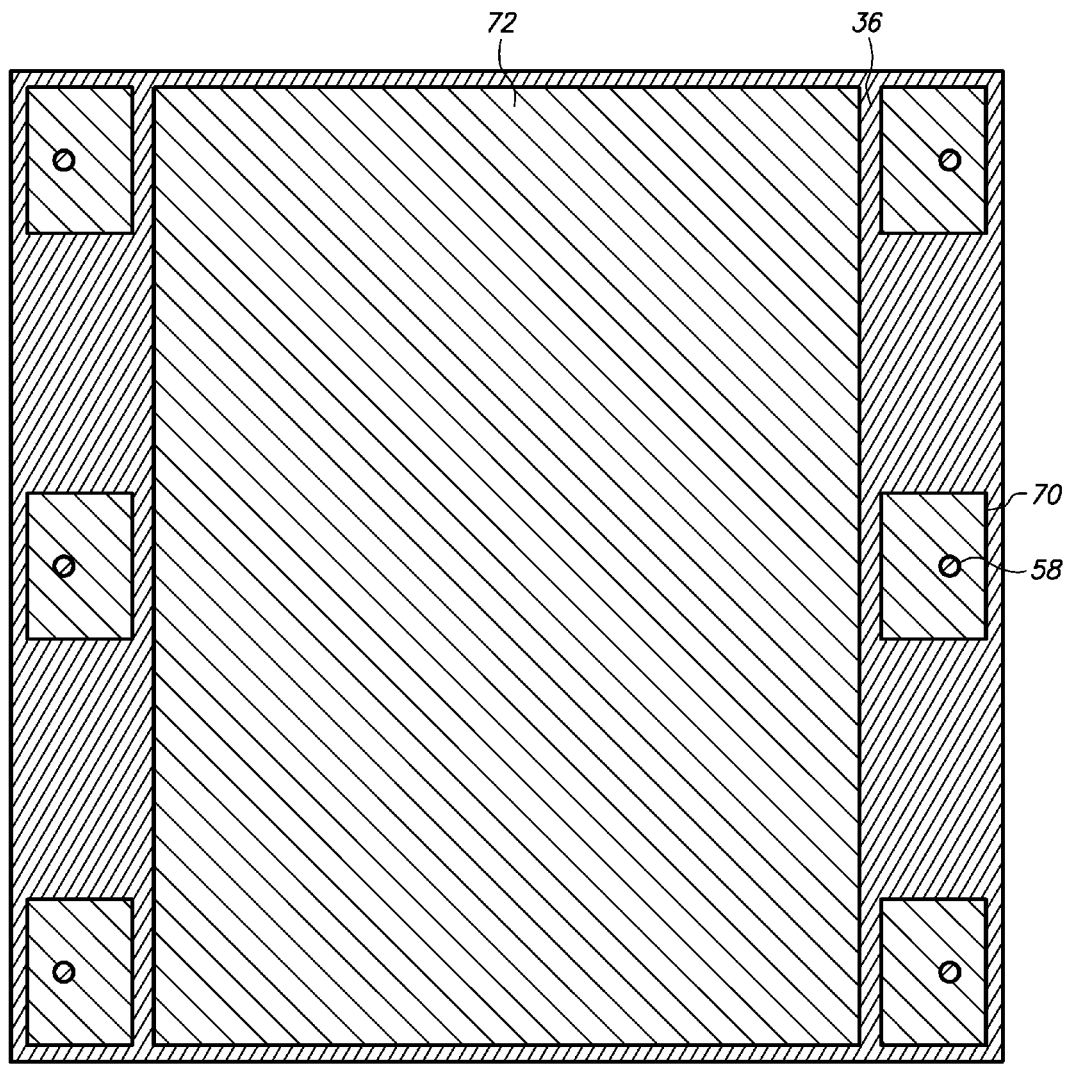

FIGS. 13A, 13B and 13C are cross-sectional, top and bottom views, respectively, of a semiconductor chip assembly that includes a thermal board with a rim, a semiconductor device and a lid in accordance with an embodiment of the present invention.

In this embodiment, the lid is mounted on the rim and the encapsulant is omitted. For purposes of brevity, any description of assembly 100 is incorporated herein insofar as the same is applicable, and the same description need not be repeated Likewise, elements of the assembly similar to those in assembly 100 have corresponding reference numerals indexed at two-hundred rather than one-hundred. For instance, LED chip 202 corresponds to LED chip 102, wire bond 204 corresponds to wire bond 104, etc.

Semiconductor chip assembly 200 includes thermal board 96, LED chip 202, wire bond 204, die attach 206 and lid 216. LED chip 202 includes top surface 210, bottom surface 212 and bond pad 214. Top surface 210 is the active surface and includes bond pad 214 and bottom surface 212 is the thermal contact surface.

LED chip 202 is mounted on heat spreader 76, electrically connected to conductive trace 74 and thermally connected to heat spreader 76. In particular, LED chip 202 is mounted on cap 68, overlaps posts 24 and 26, base 28 and caps 68 and 72 but does not overlap conductive trace 74, is electrically connected to pad 64 by wire bond 204 and is thermally connected to and mechanically attached to cap 68 by die attach 206.

Lid 216 is a glass sheet that is mounted on rim 84, thereby forming a sealed enclosure for LED chip 202 and wire bond 204 in an air cavity. Furthermore, lid 216 is transparent and does not color-shift light.

LED chip 202 emits white light which in turn radiates through lid 216 and assembly 200 is a white light source.

Semiconductor chip assembly 200 can be manufactured by mounting LED chip 202 on cap 68 using die attach 206, then wire bonding pads 64 and 214 and then mounting lid 216 on rim 84.

Semiconductor chip assembly 200 is a first-level single-chip package.

Figure 14A:
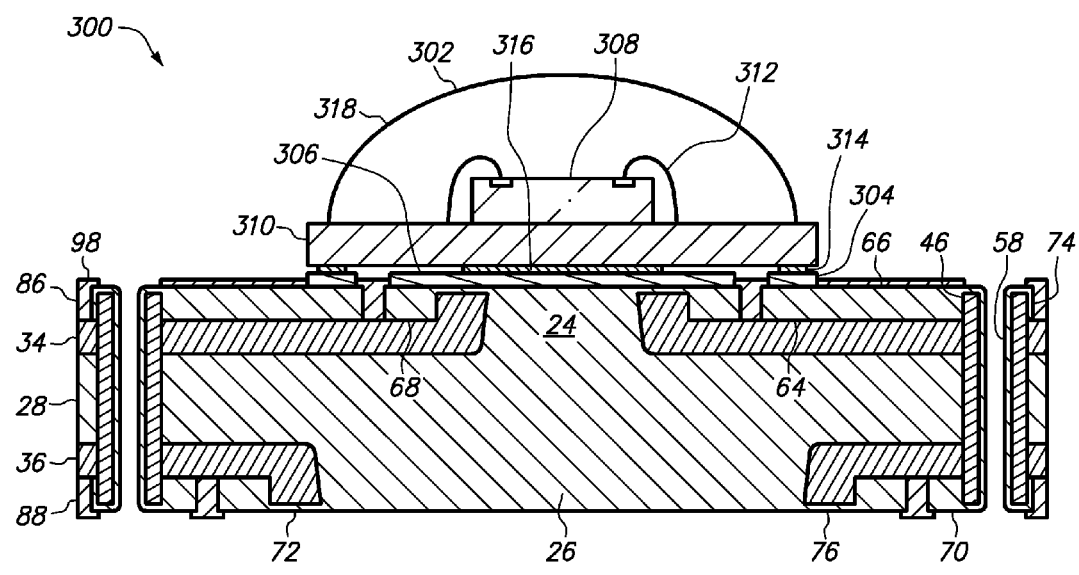
FIGS. 14A, 14B and 14C are cross-sectional, top and bottom views, respectively, of a semiconductor chip assembly that includes a thermal board with solder masks and a semiconductor device with backside contacts in accordance with an embodiment of the present invention.
Figure 14B:
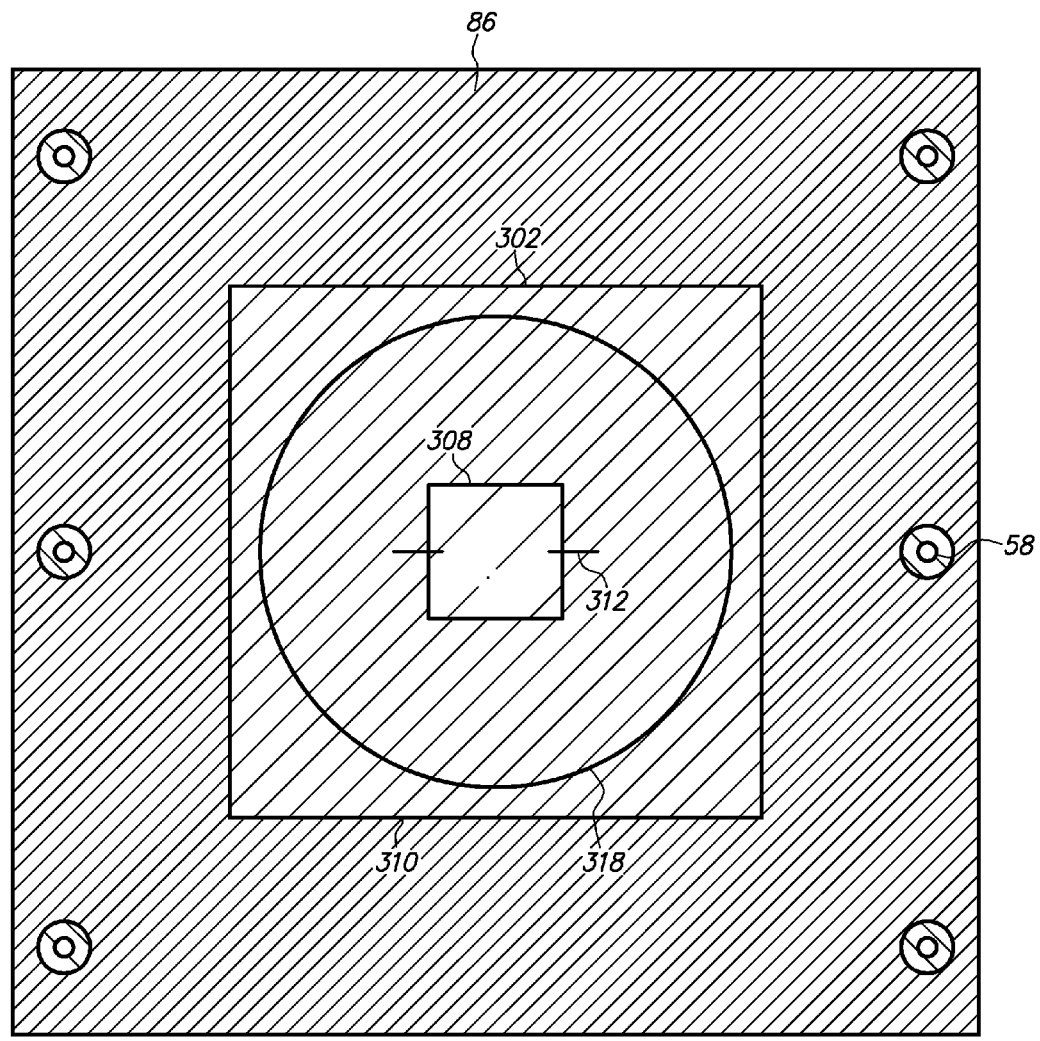
Figure 14C:
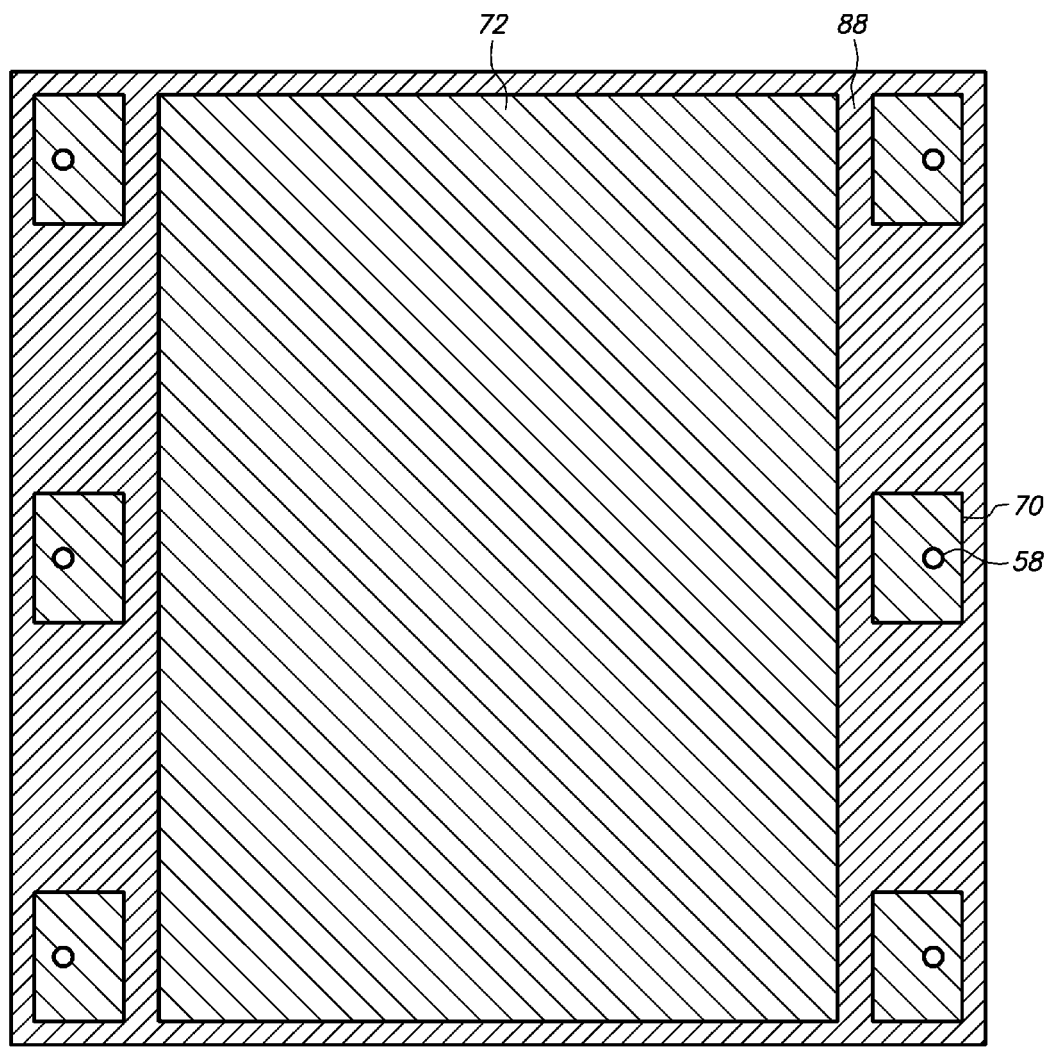

FIGS. 14A, 14B and 14C are cross-sectional, top and bottom views, respectively, of a semiconductor chip assembly that includes a thermal board with solder masks and a semiconductor device with backside contacts in accordance with an embodiment of the present invention.

In this embodiment, the semiconductor device is an LED package rather than an LED chip. Furthermore, the semiconductor device is mounted on the heat spreader and the conductive trace, overlaps the posts and the conductive trace, is electrically connected to the pad using a solder joint and is thermally connected to the first cap using a solder joint.

Semiconductor chip assembly 300 includes thermal board 98, LED package 302 and solder joints 304 and 306. LED package 302 includes LED chip 308, submount 310, wire bond 312, electrical contact 314, thermal contact 316 and encapsulant 318. LED chip 308 includes a bond pad (not shown) electrically connected to a via (not shown) in submount 310 by wire bond 312, thereby electrically connecting LED chip 308 to electrical contact 314. LED chip 308 is mounted on and thermally connected to and mechanically attached to submount 310 by a die attach (not shown), thereby thermally connecting LED chip 308 to thermal contact 316. Submount 310 is a ceramic block with low electrical conductivity and high thermal conductivity, and contacts 314 and 316 are plated on and protrude downwardly from the backside of submount 310. Furthermore, LED chip 308 is similar to LED chip 102, wire bond 312 is similar to wire bond 104 and encapsulant 318 is similar to encapsulant 108.

LED package 302 is mounted on conductive trace 74 and heat spreader 76, electrically connected to conductive trace 74 and thermally connected to heat spreader 76. In particular, LED package 302 is mounted on pad 64 and cap 68 (and thus post 24 and adhesive 34), overlaps (and thus extends laterally within the peripheries of) posts 24 and 26, base 28, adhesive 34, pad 64 and caps 68 and 72 but does not overlap (and thus is outside the peripheries of) adhesive 36, plated through-hole 58 and terminal 70, is electrically connected to pad 64 by solder joint 304 and is thermally connected to cap 68 by solder joint 306. LED package 302 also extends within the peripheries of posts 24 and 26, base 28, pad 64 and caps 68 and 72 and is located within the peripheries of base 28 and cap 72 and outside the peripheries of plated through-hole 58 and terminal 70.

For instance, solder joint 304 contacts and is sandwiched between and electrically connects and mechanically attaches pad 64 and electrical contact 314, thereby electrically connecting LED chip 308 to terminal 70. Likewise, solder joint 306 contacts and is sandwiched between and thermally connects and mechanically attaches cap 68 and thermal contact 316, thereby thermally connecting LED chip 308 to cap 72.

Pad 64 is spot plated with nickel/silver to bond well with solder joint 304, thereby improving signal transfer from conductive trace 74 to LED chip 308, and cap 68 is spot plated with nickel/silver to bond well with solder joint 306, thereby improving heat transfer from LED chip 308 to heat spreader 76. Furthermore, since cap 68 is shaped and sized to accommodate thermal contact 316, post 24 is not and need not be shaped and sized to accommodate thermal contact 316.

Semiconductor chip assembly 300 can be manufactured by depositing a solder material on pad 64 and cap 68, then placing contacts 314 and 316 on the solder material over pad 64 and cap 68, respectively, and then reflowing the solder material to provide solder joints 304 and 306.

For instance, solder paste is selectively screen printed on pad 64 and cap 68, then LED package 302 is positioned over thermal board 98 using a pick-up head and an automated pattern recognition system in step-and-repeat fashion. The pick-up head places contacts 314 and 316 on the solder paste over pad 64 and cap 68, respectively. Next, the solder paste is heated and reflowed at a relatively low temperature such as 190° C. and then the heat is removed and the solder paste cools and solidifies to form hardened solder joints 304 and 306. Alternatively, solder balls are placed on pad 64 and cap 68, then contacts 314 and 316 are placed on the solder balls over pad 64 and cap 68, respectively, and then the solder balls are heated and reflowed to form solder joints 304 and 306.

The solder material can be initially deposited on thermal board 98 or LED package 302 by plating or printing or placement techniques, then sandwiched between thermal board 98 and LED package 302 and then reflowed. The solder material can also be deposited on terminal 70 and cap 72 if required for the next level assembly. Furthermore, a conductive adhesive such as silver-filled epoxy or other connection media can be used instead of solder, and the connection media on pad 64, cap 68, terminal 70 and cap 72 need not be the same.

Semiconductor chip assembly 300 is a second-level single-chip module.

The semiconductor chip assemblies and thermal boards described above are merely exemplary. Numerous other embodiments are contemplated. In addition, the embodiments described above can be mixed-and-matched with one another and with other embodiments depending on design and reliability considerations. For instance, the thermal board can include single-level conductive traces and multi-level conductive traces. The thermal board can also include multiple first posts arranged in an array for multiple semiconductor devices and additional conductive traces to accommodate the additional semiconductor devices. The thermal board can also include a solder mask that selectively exposes the pad and the first cap and a rim mounted on the solder mask. The semiconductor device can be flip-chip bonded to the pad and the first cap by solder joints and cover the pad and the first post in the first vertical direction. The semiconductor device can be covered in the first vertical direction by a transparent, translucent or opaque encapsulant and/or a transparent, translucent or opaque lid. For instance, the semiconductor device can be an LED chip that emits blue light and is covered by a transparent encapsulant or lid so that the assembly is a blue light source or a color-shifting encapsulant or lid so that the assembly is a green, red or white light source Likewise, the semiconductor device can be an LED package with multiple LED chips and the thermal board can include additional conductive traces to accommodate the additional LED chips.

The semiconductor device can share or not share the heat spreader with other semiconductor devices. For instance, a single semiconductor device can be mounted on the heat spreader. Alternatively, numerous semiconductor devices can mounted on the heat spreader. For instance, four small chips in a 2×2 array can be attached to the first post and the thermal board can include additional conductive traces to receive and route additional wire bonds to the chips. This may be more cost effective than providing a miniature post for each chip.

The semiconductor chip can be optical or non-optical. For instance, the chip can be an LED, an IR detector, a solar cell, a microprocessor, a controller, a DRAM or an RF power amplifier. Likewise, the semiconductor package can be an LED package or an RF module. Thus, the semiconductor device can be a packaged or unpackaged optical or non-optical chip. Furthermore, the semiconductor device can be mechanically, electrically and thermally connected to the thermal board using a wide variety of connection media including solder and electrically and/or thermally conductive adhesive.

The heat spreader can provide rapid, efficient and essentially uniform heat spreading and dissipation for the semiconductor device to the next level assembly without heat flow through the adhesives. As a result, the adhesives can have low thermal conductivity which drastically reduces cost. The heat spreader can include posts and a base that are integral with one another and caps that are metallurgically bonded and thermally connected to the posts, thereby enhancing reliability and reducing cost. The first cap can be coplanar with the pad, thereby facilitating the electrical, thermal and mechanical connections with the semiconductor device. Furthermore, the first cap can be customized for the semiconductor device and the second cap can be customized for the next level assembly, thereby enhancing the thermal connection from the semiconductor device to the next level assembly. For instance, the first cap can have a square or rectangular shape in a lateral plane with the same or similar topography as the thermal contact of the semiconductor device and the second cap can have a square or rectangular shape in a lateral plane with the same or similar topography as a heat sink. In any case, the heat spreader can be a wide variety of thermally conductive structures.

The pad can be electrically connected to or isolated from the first cap. For instance, a routing line above the first adhesive can electrically connect the pad and the first cap, a routing line below the second adhesive can electrically connect the terminal and the second cap, the base can be adjacent to and electrically connected to the plated through-hole or the pad and the first cap can be merged. Thereafter, the terminal can be electrically connected to ground, thereby electrically connecting the first cap to ground.

The posts can be deposited on or integral with the base. The posts can be integral with the base when they are a single-piece metal such as copper or aluminum. The posts can also be integral with the base when they include a single-piece metal such as copper at their interface as well as additional metal elsewhere such as a solder post portion spaced from the base and a copper post portion adjacent to the base. The posts can also be integral with the base when they share single-piece metals at their interface such as a copper coating on a nickel buffer layer on an aluminum core.

The first post can include a flat top surface that is coplanar with the first adhesive. For instance, the first post can be coplanar with the first adhesive or the first post can be etched after the first adhesive is solidified to provide a cavity in the first adhesive over the first post. The first post can also be selectively etched to provide a cavity in the first post. In any case, the semiconductor device can be mounted on the first post and located in the cavity, and the wire bond can extend from the semiconductor device in the cavity to the pad outside the cavity. In this instance, the semiconductor device can be an LED chip and the cavity can focus the LED light in the first vertical direction.

The base can provide mechanical support for the conductive trace and the adhesives. For instance, the base can prevent the conductive layers from warping during metal grinding, chip mounting, wire bonding and encapsulant molding.

The caps can be formed by numerous deposition techniques including electroplating, electroless plating, evaporating and sputtering as a single layer or multiple layers after the adhesives are solidified. The caps can be the same metal as the posts or the surfaces of the posts. Furthermore, the caps can include or be spaced from the conductive layers. In any case, the first cap extends from the first post in the first vertical and lateral directions and the second cap extends from the second post in the second vertical and lateral directions.

The adhesives can provide a robust mechanical bond between the heat spreader and the conductive trace. For instance, the adhesives can extend laterally from the respective posts beyond the conductive trace to the peripheral edges of the assembly. The adhesives can also be void-free with consistent bond lines. The adhesives can also absorb thermal expansion mismatch between the heat spreader and the conductive trace. The adhesives can also be the same material as or a different material than the dielectric layers. Furthermore, the adhesives can be a low cost dielectric that need not have high thermal conductivity. Moreover, the adhesives are not prone to delamination.

The adhesives thickness can be adjusted so that the adhesives essentially fill the respective gaps and the adhesives are within structure once they are solidified and/or grinded. For instance, the optimal prepreg thickness can be established through trial and error.

The first conductive layer alone can be mounted on the first adhesive. For instance, the first aperture can be formed in the first conductive layer and then the first conductive layer can be mounted on the first adhesive so that the first conductive layer contacts the first adhesive and is exposed in the first vertical direction and the first post extends into and is exposed in the first vertical direction by the first aperture. In this instance, the first conductive layer can have a thickness of 80 to 150 microns which is thick enough to handle without warping and wobbling yet thin enough to pattern without excessive etching.

The second conductive layer alone can be mounted on the second adhesive. For instance, the second aperture can be formed in the second conductive layer and then the second conductive layer can be mounted on the second adhesive so that the second conductive layer contacts the second adhesive and is exposed in the second vertical direction and the second post extends into and is exposed in the second vertical direction by the second aperture. In this instance, the second conductive layer can have a thickness of 80 to 150 microns which is thick enough to handle without warping and wobbling yet thin enough to pattern without excessive etching.

The first conductive layer and the first dielectric layer can be mounted on the first adhesive. For instance, the first conductive layer can be provided on the first dielectric layer, then the first aperture can be formed in the first conductive layer and the first dielectric layer, and then the first conductive layer and the first dielectric layer can be mounted on the first adhesive so that the first conductive layer is exposed in the first vertical direction, the first dielectric layer contacts and is sandwiched between and separates the first conductive layer and the first adhesive and the first post extends into and is exposed in the first vertical direction by the first aperture. In this instance, the first conductive layer can have a thickness of 10 to 50 microns such as 30 microns which is thick enough for reliable signal transfer yet thin enough to reduce weight and cost. Furthermore, the first dielectric layer is a permanent part of the thermal board.

The second conductive layer and the second dielectric layer can be mounted on the second adhesive. For instance, the second conductive layer can be provided on the second dielectric layer, then the second aperture can be formed in the second conductive layer and the second dielectric layer, and then the second conductive layer and the second dielectric layer can be mounted on the second adhesive so that the second conductive layer is exposed in the second vertical direction, the second dielectric layer contacts and is sandwiched between and separates the second conductive layer and the second adhesive and the second post extends into and is exposed in the second vertical direction by the second aperture. In this instance, the second conductive layer can have a thickness of 10 to 50 microns such as 30 microns which is thick enough for reliable signal transfer yet thin enough to reduce weight and cost. Furthermore, the second dielectric layer is a permanent part of the thermal board.

The first conductive layer and a first carrier can be mounted on the first adhesive. For instance, the first conductive layer can be attached to a first carrier such biaxially-oriented polyethylene terephthalate polyester (Mylar) by a thin film, then the first aperture can be formed in the first conductive layer but not the first carrier, then the first conductive layer and the first carrier can be mounted on the first adhesive so that the first carrier covers the first conductive layer and is exposed in the first vertical direction, the thin film contacts and is sandwiched between the first carrier and the first conductive layer, the first conductive layer contacts and is sandwiched between the thin film and the first adhesive, and the first post is aligned with the first aperture and covered in the first vertical direction by the first carrier. After the first adhesive is solidified, the thin film can be decomposed by UV light so that the first carrier can be peeled off the first conductive layer, thereby exposing the first conductive layer in the first vertical direction, and then the first conductive layer can be grinded and patterned for the pad and the first cap. In this instance, the first conductive layer can have a thickness of 10 to 50 microns such as 30 microns which is thick enough for reliable signal transfer yet thin enough to reduce weight and cost, and the first carrier can have a thickness of 300 to 500 microns which is thick enough to handle without warping and wobbling yet thin enough to reduce weight and cost. Furthermore, the first carrier is a temporary fixture and not a permanent part of the thermal board.

The second conductive layer and a second carrier can be mounted on the second adhesive in a similar manner.

The first substrate with the first conductive layer and the first dielectric layer can be a low cost laminated structure that need not have high thermal conductivity. The first substrate can include a single conductive layer or multiple conductive layers. Furthermore, the first substrate can be other electrical interconnects such as a ceramic board or a printed circuit board and can include additional layers of embedded circuitry.

The second substrate with the second conductive layer and the second dielectric layer can be a low cost laminated structure that need not have high thermal conductivity. The second substrate can include a single conductive layer or multiple conductive layers. Furthermore, the second substrate can be other electrical interconnects such as a ceramic board or a printed circuit board and can include additional layers of embedded circuitry.

The pad and the first cap can be coplanar at a first surface that faces in the first vertical direction, thereby enhancing solder joints between the semiconductor device and the thermal board by controlling solder ball collapse. Likewise, the terminal and the second cap can be coplanar at a second surface that faces in the second vertical direction, thereby enhancing solder joints between the thermal board and the next level assembly by controlling solder ball collapse.

The pad and the terminal can have a wide variety of packaging formats as required by the semiconductor device and the next level assembly.

The pad and the terminal can be formed by numerous deposition techniques including electroplating, electroless plating, evaporating and sputtering as a single layer or multiple layers, either before or after the conductive layers are mounted on the adhesives. For instance, the first conductive layer can be patterned on a first substrate to provide the pad before it is mounted on the first adhesive or after it is attached to the first post and the base by the first adhesive. Likewise, the second conductive layer can be patterned on a second substrate to provide the terminal before it is mounted on the second adhesive or after it is attached to the second post and the base by the second adhesive.

The plated contact surface finish can be formed before or after the pad and the terminal are formed. For instance, the plated contacts can be deposited on the conductive layers before or after they are etched to form the pad, the terminal and the caps.

The rim can be reflective or non-reflective and transparent or non-transparent. For instance, the rim can include a highly reflective metal such as silver or aluminum with a slanted inner surface which reflects the light directed at it in the first vertical direction, thereby increasing light output in the first vertical direction. Likewise, the rim can include a transparent material such as glass or a non-reflective, non-transparent low cost material such as epoxy. Furthermore, a reflective rim can be used regardless of whether it contacts or confines the encapsulant.

The encapsulant can be numerous transparent, translucent or opaque materials and have various shapes and sizes. For instance, the encapsulant can be transparent silicone, epoxy or combinations thereof. Silicone has higher thermal and color-shifting stability than epoxy but also higher cost and lower rigidity and adhesion than epoxy.

The lid can cover or replace the encapsulant. The lid can provide environmental protection such as moisture resistance and particle protection for the chip and the wire bond in a sealed enclosure. The lid can be numerous transparent, translucent or opaque materials and have various shapes and sizes. For instance, the lid can be transparent glass or silica.

A lens can cover or replace the encapsulant. The lens can provide environmental protection such as moisture resistance and particle protection for the chip and the wire bond in a sealed enclosure. The lens can also provide a convex refractive surface that focuses the light in the first vertical direction. The lens can be numerous transparent, translucent or opaque materials and have various shapes and sizes. For instance, a glass lens with a hollow hemisphere dome can be mounted on the thermal board and spaced from the encapsulant, or a plastic lens with a solid hemisphere dome can be mounted on the encapsulant and spaced from the thermal board.

The conductive trace can include additional pads, terminals, plated through-holes, routing lines and vias as well as passive components and have different configurations. The conductive trace can function as a signal, power or ground layer depending on the purpose of the corresponding semiconductor device pad. The conductive trace can also include various conductive metals such as copper, gold, nickel, silver, palladium, tin, combinations thereof, and alloys thereof. The preferred composition will depend on the nature of the external connection media as well as design and reliability considerations. Furthermore, those skilled in the art will understand that in the context of a semiconductor chip assembly, the copper material can be pure elemental copper but is typically a copper alloy that is mostly copper such as copper-zirconium (99.9% copper), copper-silver-phosphorus-magnesium (99.7% copper) and copper-tin-iron-phosphorus (99.7% copper) to improve mechanical properties such as tensile strength and elongation.

The caps, conductive layers, plated layers, plated through-hole, plated contacts, insulative filler, dielectric layers, solder masks and rim are generally desirable but may be omitted in some embodiments. For instance, if the openings and the apertures are punched rather than drilled so that the first post is shaped and sized to accommodate a thermal contact surface of the semiconductor device then the first cap can be omitted Likewise, if a reflector is unnecessary then the rim can be omitted.

The thermal board can include a thermal via that is spaced from the posts, extends through the base and the adhesives outside the openings and the apertures and is adjacent to and thermally connects the base and the caps to improve heat dissipation from the first cap to the second cap and heat spreading in the second cap.

The assembly can provide horizontal or vertical single-level or multi-level signal routing.

Horizontal single-level signal routing with the pad, the terminal and the routing line above the dielectric layer is disclosed in U.S. application Ser. No. 12/616,773 filed Nov. 11, 2009 by Charles W. C. Lin et al. entitled "Semiconductor Chip Assembly with Post/Base Heat Spreader and Substrate" which is incorporated by reference.

Horizontal single-level signal routing with the pad, the terminal and the routing line above the adhesive and no dielectric layer is disclosed in U.S. application Ser. No. 12/616,775 filed Nov. 11, 2009 by Charles W. C. Lin et al. entitled "Semiconductor Chip Assembly with Post/Base Heat Spreader and Conductive Trace" which is incorporated by reference.

Horizontal multi-level signal routing with the pad and the terminal above the dielectric layer electrically connected by first and second vias through the dielectric layer and a routing line beneath the dielectric layer is disclosed in U.S. application Ser. No. 12/557,540 filed Sep. 11, 2009 by Chia-Chung Wang et al. entitled "Semiconductor Chip Assembly with Post/Base Heat Spreader and Horizontal Signal Routing" which is incorporated by reference.

Vertical multi-level signal routing with the pad above the dielectric layer and the terminal beneath the adhesive electrically connected by a first via through the dielectric layer, a routing line beneath the dielectric layer and a second via through the adhesive is disclosed in U.S. application Ser. No. 12/557,541 filed Sep. 11, 2009 by Chia-Chung Wang et al. entitled "Semiconductor Chip Assembly with Post/Base Heat Spreader and Vertical Signal Routing" which is incorporated by reference.

The working format for the thermal board can be a single thermal board or multiple thermal boards based on the manufacturing design. For instance, a single thermal board can be manufactured individually. Alternatively, numerous thermal boards can be simultaneously batch manufactured using a single metal plate, a single first conductive layer, a single second conductive layer, a single first adhesive, a single second adhesive and a single plated metal and then separated from one another Likewise, numerous sets of heat spreaders and conductive traces that are each dedicated to a single semiconductor device can be simultaneously batch manufactured for each thermal board in the batch using a single metal plate, a single first conductive layer, a single second conductive layer, a single first adhesive, a single second adhesive and a single plated metal.

For example, multiple recesses can be etched in the metal plate to form multiple first posts, multiple second posts and the base, then the non-solidified second adhesive with second openings corresponding to the second posts can be mounted on the base such that each second post extends through a second opening, then the second conductive layer with second apertures corresponding to the second posts can be mounted on the second adhesive such that each second post extends through a second opening into a second aperture, then the structure can be inverted, then the non-solidified first adhesive with first openings corresponding to the first posts can be mounted on the base such that each first post extends through a first opening, then the first conductive layer with first apertures corresponding to the first posts can be mounted on the first adhesive such that each first post extends through a first opening into a first aperture, then the conductive layers can be moved towards one another by platens to force the first adhesive into the first gaps and the second adhesive into the second gaps, then the adhesives can be cured and solidified, then multiple outer holes can be drilled through the conductive layers, the adhesives and the base, then the insulative filler can be deposited into the outer holes, then the posts, the conductive layers, the adhesives and the insulative filler can be grinded to form first and second opposing lateral surfaces, then the inner holes can be drilled through the insulative filler in the outer holes, then the plated metal can be plated on the structure to form the plated layers and the plated through-holes in the inner holes, then the first conductive layer and the first plated layer can be etched to form the first caps corresponding to the first posts and the pads and the routing lines corresponding to the plated through-holes, the second conductive layer and the second plated layer can be etched to form the second caps corresponding to the second posts and the terminals corresponding to the plated through-holes, then the plated contact surface finish can be formed on the pads, the terminals and the caps and then the base and the adhesives can be cut or cracked at the desired locations of the peripheral edges of the thermal boards, thereby separating the individual thermal boards from one another.

The working format for the semiconductor chip assembly can be a single assembly or multiple assemblies based on the manufacturing design. For instance, a single assembly can be manufactured individually. Alternatively, numerous assemblies can be simultaneously batch manufactured before the thermal boards are separated from one another. Likewise, multiple semiconductor devices can be electrically, thermally and mechanically connected to each thermal board in the batch.

For example, solder paste portions can be deposited on the pads and the first caps, then LED packages can be placed on the solder paste portions, then the solder paste portions can be simultaneously heated, reflowed and hardened to provide the solder joints and then the thermal boards can be separated from one another.

As another example, die attach paste portions can be deposited on the first caps, then chips can be placed on the die attach paste portions, then the die attach paste portions can be simultaneously heated and hardened to provide the die attaches, then the chips can be wired bonded to the corresponding pads, then the encapsulants can be formed over the chips and the wire bonds and then the thermal boards can be separated from one another.

The thermal boards can be detached from one another in a single step or multiple steps. For instance, the thermal boards can be batch manufactured as a panel, then the semiconductor devices can be mounted on the panel and then the semiconductor chip assemblies of the panel can be detached from one another. Alternatively, the thermal boards can be batch manufactured as a panel, then the thermal boards of the panel can be singulated into strips of multiple thermal boards, then the semiconductor devices can be mounted on the thermal boards of a strip and then the semiconductor chip assemblies of the strip can be detached from one another. Furthermore, the thermal boards can be detached by mechanical sawing, laser sawing, cleaving or other suitable techniques.

The term "adjacent" refers to elements that are integral (single-piece) or in contact (not spaced or separated from) with one another. For instance, the posts are adjacent to the base regardless of whether the posts are formed additively or subtractively.

The term "overlap" refers to above and extending within a periphery of an underlying element. Overlap includes extending inside and outside the periphery or residing within the periphery. For instance, when the first post protrudes upward from the base and the second post protrudes downward from the base, the semiconductor device overlaps the posts since an imaginary vertical line intersects the semiconductor device and the posts, regardless of whether another element such as the first cap or the die attach is between the semiconductor device and the posts and is intersected by the line, and regardless of whether another imaginary vertical line intersects the posts but not the semiconductor device (outside the periphery of the semiconductor device). Likewise, the first adhesive overlaps the base and is overlapped by the pad, the first post overlaps and is within a periphery of the base and the base is overlapped by the first post. Moreover, overlap is synonymous with over and overlapped by is synonymous with under or beneath.

The term "contact" refers to direct contact. For instance, the insulative filler contacts the base and the adhesives but does not contact the posts.

The term "cover" refers to complete coverage in the vertical and/or lateral directions. For instance, the base covers the first post in the second vertical direction but the first post does not cover the base in the first vertical direction and the base covers the second post in the first vertical direction but the second post does not cover the base in the second vertical direction.

The term "layer" refers to patterned and unpatterned layers. For instance, the conductive layers can be unpatterned blanket sheets when the adhesives are flowed and solidified, and the conductive layers can be patterned circuits with spaced traces when the semiconductor device is mounted on the heat spreader. Furthermore, a layer can include stacked layers.

The term "surface area" refers to a lateral region in a lateral plane that is parallel to the lateral directions and orthogonal to the vertical directions. Furthermore, the surface area of an element is defined by the periphery of the element. For instance, the surface area of the first post is a lateral region defined by the periphery of the first post and is orthogonal to the vertical directions and the surface area of the second post is a lateral region defined by the periphery of the second post and is orthogonal to the vertical directions.

The term "pad" in conjunction with the conductive trace refers to a connection region that is adapted to contact and/or bond to external connection media (such as solder or a wire bond) that electrically connects the conductive trace to the semiconductor device.

The term "terminal" in conjunction with the conductive trace refers to a connection region that is adapted to contact and/or bond to external connection media (such as solder or a wire bond) that electrically connects the conductive trace to an external device (such as a PCB or a wire thereto) associated with the next level assembly.

The term "plated through-hole" in conjunction with the conductive trace refers to an electrical interconnect that is formed in a hole using plating. For instance, the plated through-hole exists regardless of whether it remains intact in the hole and spaced from peripheral edges of the assembly or is subsequently split or trimmed such that the hole is converted into a groove and the remaining portion is in the groove at a peripheral edge of the assembly.

The term "first cap" in conjunction with the heat spreader refers to a contact region that is adapted to contact and/or bond to external connection media (such as solder or thermally conductive adhesive) that thermally connects the heat spreader to the semiconductor device.

The term "second cap" in conjunction with the heat spreader refers to a contact region that is adapted to contact and/or bond to external connection media (such as solder or thermally conductive adhesive) that thermally connects the heat spreader to an external device (such as a PCB or a heat sink) associated with the next level assembly.

The terms "opening" and "aperture" and "hole" refer to a through-hole and are synonymous. For instance, the first post is exposed by the first adhesive in the first vertical direction when it is inserted into the first opening in the first adhesive and the second post is exposed by the second adhesive in the second vertical direction when it is inserted into the second opening in the second adhesive.

The term "inserted" refers to relative motion between elements. For instance, the first post is inserted into the first aperture regardless of whether the base is stationary and the first conductive layer moves towards the base, the first conductive layer is stationary and the base moves towards the first conductive layer or the base and the first conductive layer both approach the other. Furthermore, the first post is inserted (or extends) into the first aperture regardless of whether it goes through (enters and exits) or does not go through (enters without exiting) the first aperture.

The phrase "move towards one another" also refers to relative motion between elements. For instance, the base and the first conductive layer move towards one another regardless of whether the base is stationary and the first conductive layer moves towards the base, the first conductive layer is stationary and the base moves towards the first conductive layer or the base and the first conductive layer both approach the other.

The phrase "aligned with" refers to relative position between elements. For instance, the first post is aligned with the first aperture when the first adhesive is mounted on the base, the first conductive layer is mounted on the first adhesive, the first post is inserted into and aligned with the first opening and the first aperture is aligned with the first opening regardless of whether the first post is inserted into or spaced from the first aperture.

The phrase "mounted on" includes contact and non-contact with a single or multiple support element(s). For instance, the semiconductor device is mounted on the heat spreader regardless of whether it contacts the heat spreader or is separated from the heat spreader by a die attach.

The term "above" refers to upward extension and includes adjacent and non-adjacent elements as well as overlapping and non-overlapping elements. For instance, when the first post protrudes upward from the base and the second post protrudes downward from the base, the first post extends above, is adjacent to, overlaps and protrudes from the base. Likewise, the plated through-hole extends above the second post even though it is not adjacent to or overlap the second post.

The term "below" refers to downward extension and includes adjacent and non-adjacent elements as well as overlapping and non-overlapping elements. For instance, when the first post protrudes upward from the base and the second post protrudes downward from the base, the base extends below, is adjacent to and is overlapped by the first post. Likewise, the plated through-hole extends below the first post even though it is not adjacent to or overlapped by the first post.

The "first vertical direction" and "second vertical direction" do not depend on the orientation of the semiconductor chip assembly (or the thermal board), as will be readily apparent to those skilled in the art. For instance, the first post extends vertically beyond the base in the first vertical direction and vertically beyond the first cap in the second vertical direction regardless of whether the assembly is inverted and/or mounted on a heat sink. Likewise, the base extends "laterally" from the posts in a lateral plane regardless of whether the assembly is inverted, rotated or slanted. Thus, the first and second vertical directions are opposite one another and orthogonal to the lateral directions, and laterally aligned elements are coplanar with one another at a lateral plane orthogonal to the first and second vertical directions. Furthermore, the first vertical direction is the upward direction and the second vertical direction is the downward direction when the first post protrudes upward from the base and the second post protrudes downward from the base, and the first vertical direction is the downward direction and the second vertical direction is the upward direction when the first post protrudes downward from the base and the second post protrudes upward from the base.

The semiconductor chip assembly of the present invention has numerous advantages. The assembly is reliable, inexpensive and well-suited for high volume manufacture. The assembly is especially well-suited for high power semiconductor devices such as LED chips and large semiconductor chips as well as multiple semiconductor devices such as small semiconductor chips in arrays which generate considerable heat and require excellent heat dissipation in order to operate effectively and reliably.

The manufacturing process is highly versatile and permits a wide variety of mature electrical, thermal and mechanical connection technologies to be used in a unique and improved manner. The manufacturing process can also be performed without expensive tooling. As a result, the manufacturing process significantly enhances throughput, yield, performance and cost effectiveness compared to conventional packaging techniques. Moreover, the assembly is well-suited for copper chip and lead-free environmental requirements.

The embodiments described herein are exemplary and may simplify or omit elements or steps well-known to those skilled in the art to prevent obscuring the present invention Likewise, the drawings may omit duplicative or unnecessary elements and reference labels to improve clarity.

Various changes and modifications to the embodiments described herein will be apparent to those skilled in the art. For instance, the materials, dimensions, shapes, sizes, steps and arrangement of steps described above are merely exemplary. Such changes, modifications and equivalents may be made without departing from the spirit and scope of the present invention as defined in the appended claims.

We claim:

1. A method of making a semiconductor chip assembly, comprising:

providing a first post, a second post, a first adhesive, a second adhesive and a base, wherein
the first post is adjacent to the base, extends vertically from the base in a first vertical direction and extends into a first opening in the first adhesive,
the second post is adjacent to the base, extends vertically from the base in a second vertical direction opposite the first vertical direction and extends into a second opening in the second adhesive,
the first adhesive contacts the base, extends vertically beyond the base in the first vertical direction and is non-solidified,
the second adhesive contacts the base, extends vertically beyond the base in the second vertical direction and is non-solidified,
the base is sandwiched between the posts and between the adhesives and extends laterally from the posts in lateral directions orthogonal to the vertical directions, and
the first post and the first opening are located within a periphery of the second post; then
flowing the first adhesive;
flowing the second adhesive;
solidifying the adhesives; then
depositing a first plated layer on the first post and the first adhesive, wherein the first plated layer covers the first post in the first vertical direction;
depositing a second plated layer on the second post and the second adhesive, wherein the second plated layer covers the second post in the second vertical direction;
providing a conductive trace that includes a pad, a terminal and an electrical interconnect, wherein the pad extends vertically beyond the base in the first vertical direction and includes a selected portion of the first plated layer, the terminal extends vertically beyond the base in the second vertical direction and includes a selected portion of the second plated layer, the electrical interconnect extends through the adhesives and the base and is spaced from and electrically isolated from the base and an electrically conductive path between the pad and the terminal includes the electrical interconnect;
providing a heat spreader that includes the posts and the base; then
mounting a semiconductor device on the first post, wherein the semiconductor device extends vertically beyond the base in the first vertical direction, extends laterally within peripheries of the posts and the first post is sandwiched between the semiconductor device and the base;
electrically connecting the semiconductor device to the pad, thereby electrically connecting the semiconductor device to the terminal; and
thermally connecting the semiconductor device to the first post, thereby thermally connecting the semiconductor device to the second post.

2. The method of claim 1, wherein providing the posts and the base includes:

providing a metal plate;
forming a first etch mask on the metal plate that selectively exposes the metal plate in the first vertical direction and defines the first post;
forming a second etch mask on the metal plate that selectively exposes the metal plate in the second vertical direction and defines the second post; then
etching the metal plate in a first pattern defined by the first etch mask and a second pattern defined by the second etch mask, thereby forming a first recess in the metal plate that extends into but not through the metal plate and a second recess in the metal plate that extends into but not through the metal plate, wherein the first post includes an unetched portion of the metal plate that protrudes beyond the base in the first vertical direction and is laterally surrounded by the first recess, the second post includes an unetched portion of the metal plate that protrudes beyond the base in the second vertical direction and is laterally surrounded by the second recess and the base includes an unetched portion of the metal plate that is sandwiched between the posts and between the recesses; and then
removing the etch masks.

3. The method of claim 1, wherein:

providing the first adhesive includes providing a first prepreg with a first uncured epoxy and providing the second adhesive includes providing a second prepreg with a second uncured epoxy;
flowing the first adhesive includes melting the first uncured epoxy and compressing the first uncured epoxy and flowing the second adhesive includes melting the second uncured epoxy and compressing the second uncured epoxy; and
solidifying the first adhesive includes curing the first uncured epoxy and solidifying the second adhesive includes curing the second uncured epoxy.

4. The method of claim 1, including:

contacting a first release sheet and the first adhesive, wherein the first adhesive contacts and is sandwiched between the first release sheet and the base, then flowing and solidifying the first adhesive, then removing the first release sheet from the first adhesive, then depositing a first conductive layer on the first adhesive and then providing the conductive trace with a selected portion of the first conductive layer; and
contacting a second release sheet and the second adhesive, wherein the second adhesive contacts and is sandwiched between the second release sheet and the base, then flowing and solidifying the second adhesive, then removing the second release sheet from the second adhesive, then depositing a second conductive layer on the second adhesive and then providing the conductive trace with a selected portion of the second conductive layer.

5. The method of claim 1, including:
contacting a first conductive layer and the first adhesive, then flowing the first adhesive into a first aperture that extends through the first conductive layer alone and then providing the conductive trace with a selected portion of the first conductive layer; and
contacting a second conductive layer and the second adhesive, then flowing the second adhesive into a second aperture that extends through the second conductive layer alone and then providing the conductive trace with a selected portion of the second conductive layer.

6. The method of claim 1, including:
contacting a first dielectric layer and the first adhesive, wherein the first dielectric layer contacts and is sandwiched between a first conductive layer and the first adhesive and is solidified, then flowing the first adhesive into a first aperture that extends through the first conductive layer and the first dielectric layer and then providing the conductive trace with a selected portion of the first conductive layer; and
contacting a second dielectric layer and the second adhesive, wherein the second dielectric layer contacts and is sandwiched between a second conductive layer and the second adhesive and is solidified, then flowing the second adhesive into a second aperture that extends through the second conductive layer and the second dielectric layer and then providing the conductive trace with a selected portion of the second conductive layer.

7. The method of claim 1, wherein providing the pad includes removing selected portions of a first conductive layer that contacts the first adhesive after solidifying the adhesives.

8. The method of claim 1, wherein providing the terminal includes removing selected portions of a second conductive layer that contacts the second adhesive after solidifying the adhesives.

9. The method of claim 1, wherein mounting the semiconductor device includes providing a first solder joint between the semiconductor device and the pad and a second solder joint between the semiconductor device and the first post, electrically connecting the semiconductor device includes providing the first solder joint between the semiconductor device and the pad, and thermally connecting the semiconductor device includes providing the second solder joint between the semiconductor device and the first post.

10. The method of claim 1, wherein mounting the semiconductor device includes providing a die attach between the semiconductor device and the first post, electrically connecting the semiconductor device includes providing a wire bond between the semiconductor device and the pad, and thermally connecting the semiconductor device includes providing the die attach between the semiconductor device and the first post.

11. A method of making a semiconductor chip assembly, comprising:
providing a first post, a second post, a first adhesive, a second adhesive, a first conductive layer, a second conductive layer and a base, wherein
the first post is adjacent to and integral with the base, extends vertically from the base in a first vertical direction, extends into a first opening in the first adhesive and is aligned with a first aperture in the first conductive layer,
the second post is adjacent to and integral with the base, extends vertically from the base in a second vertical direction opposite the first vertical direction, extends into a second opening in the second adhesive and is aligned with a second aperture in the second conductive layer,
the first adhesive contacts the base, is sandwiched between the base and the first conductive layer, extends vertically beyond the base in the first vertical direction and is non-solidified,
the second adhesive contacts the base, is sandwiched between the base and the second conductive layer, extends vertically beyond the base in the second vertical direction and is non-solidified,
the first conductive layer extends vertically beyond the first adhesive in the first vertical direction,
the second conductive layer extends vertically beyond the second adhesive in the second vertical direction,
the base is sandwiched between the posts, between the adhesives and between the conductive layers and extends laterally from the posts in lateral directions orthogonal to the vertical directions, and
the first post, the first opening and the first aperture are located within a periphery of the second post; then
flowing the first adhesive in the first vertical direction into a first gap located in the first aperture between the first post and the first conductive layer;
flowing the second adhesive in the second vertical direction into a second gap located in the second aperture between the second post and the second conductive layer;
solidifying the adhesives, thereby mechanically attaching the first conductive layer to the first post and the base using the first adhesive and mechanically attaching the second conductive layer to the second post and the base using the second adhesive; then
depositing a first plated layer on the first post, the first adhesive and the first conductive layer, wherein the first plated layer covers the first post in the first vertical direction;
depositing a second plated layer on the second post, the second adhesive and the second conductive layer, wherein the second plated layer covers the second post in the second vertical direction;
providing a conductive trace that includes a pad, a terminal and an electrical interconnect, wherein the pad extends vertically beyond the base in the first vertical direction and includes selected portions of the first conductive layer and the first plated layer, the terminal extends vertically beyond the base in the second vertical direction and includes selected portions of the second conductive layer and the second plated layer, the electrical interconnect extends through the adhesives and the base and is spaced from and electrically isolated from the base and an electrically conductive path between the pad and the terminal includes the electrical interconnect;
providing a heat spreader that includes the posts and the base; then
mounting a semiconductor device on the first post, wherein the semiconductor device extends vertically beyond the base in the first vertical direction, extends laterally within peripheries of the posts and the first post is sandwiched between the semiconductor device and the base;

electrically connecting the semiconductor device to the pad, thereby electrically connecting the semiconductor device to the terminal; and thermally connecting the semiconductor device to the first post, thereby thermally connecting the semiconductor device to the second post.

12. The method of claim 11, wherein providing the posts and the base includes:

providing a metal plate;

forming a first etch mask on the metal plate that selectively exposes the metal plate in the first vertical direction and defines the first post;

forming a second etch mask on the metal plate that selectively exposes the metal plate in the second vertical direction and defines the second post; then etching the metal plate in a first pattern defined by the first etch mask and a second pattern defined by the second etch mask, thereby forming a first recess in the metal plate that extends into but not through the metal plate and a second recess in the metal plate that extends into but not through the metal plate, wherein the first post includes an unetched portion of the metal plate that protrudes beyond the base in the first vertical direction and is laterally surrounded by the first recess, the second post includes an unetched portion of the metal plate that protrudes beyond the base in the second vertical direction and is laterally surrounded by the second recess and the base includes an unetched portion of the metal plate that is sandwiched between the posts and between the recesses; and then removing the etch masks.

13. The method of claim 11, wherein:

providing the first adhesive includes providing a first prepreg with a first uncured epoxy and then inserting the first post into the first opening and providing the second adhesive includes providing a second prepreg with a second uncured epoxy and then inserting the second post into the second opening;

flowing the first adhesive includes melting the first uncured epoxy and compressing the first uncured epoxy between the first conductive layer and the base and flowing the second adhesive includes melting the second uncured epoxy and compressing the second uncured epoxy between the second conductive layer and the base; and solidifying the first adhesive includes curing the first uncured epoxy and solidifying the second adhesive includes curing the second uncured epoxy.

14. The method of claim 11, wherein flowing the first adhesive includes filling the first gap with the first adhesive and flowing the second adhesive includes filling the second gap with the second adhesive.

15. The method of claim 11, wherein:

providing the first conductive layer includes contacting the first conductive layer and the first adhesive, wherein the first aperture extends through the first conductive layer alone, and then flowing the first adhesive into the first gap; and providing the second conductive layer includes contacting the second conductive layer and the second adhesive, wherein the second aperture extends through the second conductive layer alone, and then flowing the second adhesive into the second gap.

16. The method of claim 11, wherein:

providing the first conductive layer includes providing a first substrate that includes the first conductive layer and a first dielectric layer and then contacting the first dielectric layer and the first adhesive, wherein the first dielectric layer contacts and is sandwiched between the first conductive layer and the first adhesive and is solidified and the first aperture extends through the first conductive layer and the first dielectric layer, and then flowing the first adhesive into the first gap; and providing the second conductive layer includes providing a second substrate that includes the second conductive layer and a second dielectric layer and then contacting the second dielectric layer and the second adhesive, wherein the second dielectric layer contacts and is sandwiched between the second conductive layer and the second adhesive and is solidified and the second aperture extends through the second conductive layer and the second dielectric layer, and then flowing the second adhesive into the second gap.

17. The method of claim 11, wherein providing the pad includes removing selected portions of the first conductive layer after solidifying the adhesives.

18. The method of claim 11, wherein providing the pad includes:

grinding the first post, the first adhesive and the first conductive layer such that the first post, the first adhesive and the first conductive layer are laterally aligned with one another at a lateral surface that faces in the first vertical direction; and then removing selected portions of the first conductive layer using an etch mask that defines the pad.

19. The method of claim 11, wherein providing the terminal includes removing selected portions of the second conductive layer after solidifying the adhesives.

20. The method of claim 11, wherein providing the terminal includes:

grinding the second post, the second adhesive and the second conductive layer such that the second post, the second adhesive and the second conductive layer are laterally aligned with one another at a lateral surface that faces in the second vertical direction; and then removing selected portions of the second conductive layer using an etch mask that defines the terminal.

21. The method of claim 11, wherein providing the electrical interconnect includes providing a plated through-hole that extends through the base and the adhesives after solidifying the adhesives.

22. The method of claim 11, wherein providing the conductive trace includes:

removing selected portions of the first conductive layer using a first etch mask that defines the pad after solidifying the adhesives; and removing selected portions of the second conductive layer using a second etch mask that defines the terminal after solidifying the adhesives.

23. The method of claim 11, wherein providing the conductive trace includes:

providing a hole that extends through the base, the adhesives and the conductive layers after solidifying the adhesives; then depositing a plated metal on the posts, the adhesives and the conductive layers, wherein the plated metal forms the plated layers and forms and the electrical interconnect as a plated through-hole in the hole; then forming a first etch mask on the first plated layer that defines the pad;

forming a second etch mask on the second plated layer that defines the terminal; then etching the first conductive layer and the first plated layer in a first pattern defined by the first etch mask;

etching the second conductive layer and the second plated layer in a second pattern defined by the second etch mask; and then removing the etch masks.

24. The method of claim 23, wherein providing the hole includes:

providing an outer hole that extends through and is adjacent to the base, the adhesives and the conductive layers after solidifying the adhesives; then depositing an insulative filler into the outer hole; and then forming an inner hole that extends through the outer hole, extends through and is adjacent to the insulative filler, extends through and is spaced from the base, the adhesives and the conductive layers and provides the hole.

25. The method of claim 11, wherein mounting the semiconductor device includes providing a die attach between the semiconductor device and the first post, electrically connecting the semiconductor device includes providing a wire bond between the semiconductor device and the pad, and thermally connecting the semiconductor device includes providing the die attach between the semiconductor device and the first post.

26. A method of making a semiconductor chip assembly, comprising:

providing a first post, a second post, a first adhesive, a second adhesive, a first conductive layer, a second conductive layer and a base, wherein the first post is adjacent to and integral with the base, extends vertically from the base in a first vertical direction, extends into a first opening in the first adhesive and is aligned with a first aperture in the first conductive layer, the second post is adjacent to and integral with the base, extends vertically from the base in a second vertical direction opposite the first vertical direction, extends into a second opening in the second adhesive and is aligned with a second aperture in the second conductive layer, the first adhesive contacts the base, is sandwiched between the base and the first conductive layer, extends vertically beyond the base in the first vertical direction and is non-solidified, the second adhesive contacts the base, is sandwiched between the base and the second conductive layer, extends vertically beyond the base in the second vertical direction and is non-solidified, the first conductive layer extends vertically beyond the first adhesive in the first vertical direction, the second conductive layer extends vertically beyond the second adhesive in the second vertical direction, the base is sandwiched between the posts, between the adhesives and between the conductive layers and extends laterally from the posts in lateral directions orthogonal to the vertical directions, and the first post, the first opening and the first aperture are located within a periphery of the second post; then flowing the first adhesive in the first vertical direction into a first gap located in the first aperture between the first post and the first conductive layer;

flowing the second adhesive in the second vertical direction into a second gap located in the second aperture between the second post and the second conductive layer;

solidifying the adhesives, thereby mechanically attaching the first conductive layer to the first post and the base using the first adhesive and mechanically attaching the second conductive layer to the second post and the base using the second adhesive; then depositing a first plated layer on the first post, the first adhesive and the first conductive layer, wherein the first plated layer covers the first post in the first vertical direction;

depositing a second plated layer on the second post, the second adhesive and the second conductive layer, wherein the second plated layer covers the second post in the second vertical direction;

providing a conductive trace that includes a pad, a terminal and an electrical interconnect, wherein the pad extends vertically beyond the first adhesive in the first vertical direction and includes selected portions of the first conductive layer and the first plated layer, the terminal extends vertically beyond the second adhesive in the second vertical direction and includes selected portions of the second conductive layer and the second plated layer, the electrical interconnect extends through the adhesives and the base and is spaced from and electrically isolated from the base and an electrically conductive path between the pad and the terminal includes the electrical interconnect;

providing a heat spreader that includes the posts, the base, a first cap, a second cap and selected portions of the conductive layers, wherein the first cap is adjacent to the first post, covers the first post in the first vertical direction, extends laterally from the first post and extends vertically beyond the first adhesive in the first vertical direction and includes selected portions of the first conductive layer and the first plated layer and the second cap is adjacent to the second post, covers the second post in the second vertical direction, extends laterally from the second post and extends vertically beyond the second adhesive in the second vertical direction and includes selected portions of the second conductive layer and the second plated layer; then mounting a semiconductor device on the first cap, wherein the semiconductor device extends vertically beyond the first cap in the first vertical direction and extends laterally within peripheries of the posts and the caps and the first post and the first cap are sandwiched between the semiconductor device and the base;

electrically connecting the semiconductor device to the pad, thereby electrically connecting the semiconductor device to the terminal; and thermally connecting the semiconductor device to the first cap, thereby thermally connecting the semiconductor device to the second cap.

27. The method of claim 26, wherein providing the posts and the base includes:

providing a metal plate;

forming a first etch mask on the metal plate that selectively exposes the metal plate in the first vertical direction and defines the first post;

forming a second etch mask on the metal plate that selectively exposes the metal plate in the second vertical direction and defines the second post; then etching the metal plate in a first pattern defined by the first etch mask and a second pattern defined by the second etch mask, thereby forming a first recess in the metal plate that extends into but not through the metal plate and a second recess in the metal plate that extends into but not through the metal plate, wherein the first post includes an unetched portion of the metal plate that protrudes beyond the base in the first vertical direction and is laterally surrounded by the first recess, the second post includes an unetched portion of the metal plate that protrudes beyond the base in the second vertical direction and is laterally surrounded by the second recess and the base includes an unetched portion of the metal plate that is sandwiched between the posts and between the recesses; and then removing the etch masks.

28. The method of claim 26, wherein:

providing the first adhesive includes providing a first prepreg with a first uncured epoxy and then inserting the first post into the first opening and providing the second adhesive includes providing a second prepreg with a second uncured epoxy and then inserting the second post into the second opening;

flowing the first adhesive includes melting the first uncured epoxy and compressing the first uncured epoxy between the first conductive layer and the base and flowing the second adhesive includes melting the second uncured epoxy and compressing the second uncured epoxy between the second conductive layer and the base; and solidifying the first adhesive includes curing the first uncured epoxy and solidifying the second adhesive includes curing the second uncured epoxy.

29. The method of claim 26, wherein flowing the first adhesive includes filling the first gap with the first adhesive and flowing the second adhesive includes filling the second gap with the second adhesive.

30. The method of claim 26, wherein:

providing the first conductive layer includes contacting the first conductive layer and the first adhesive, wherein the first aperture extends through the first conductive layer alone, and then flowing the first adhesive into the first gap; and providing the second conductive layer includes contacting the second conductive layer and the second adhesive, wherein the second aperture extends through the second conductive layer alone, and then flowing the second adhesive into the second gap.

31. The method of claim 26, wherein:

providing the first conductive layer includes providing a first substrate that includes the first conductive layer and a first dielectric layer and then contacting the first dielectric layer and the first adhesive, wherein the first dielectric layer contacts and is sandwiched between the first conductive layer and the first adhesive and is solidified and the first aperture extends through the first conductive layer and the first dielectric layer, and then flowing the first adhesive into the first gap; and providing the second conductive layer includes providing a second substrate that includes the second conductive layer and a second dielectric layer and then contacting the second dielectric layer and the second adhesive, wherein the second dielectric layer contacts and is sandwiched between the second conductive layer and the second adhesive and is solidified and the second aperture extends through the second conductive layer and the second dielectric layer, and then flowing the second adhesive into the second gap.

32. The method of claim 26, wherein providing the pad and the first cap includes removing selected portions of the first conductive layer using an etch mask that defines the pad and the first cap after solidifying the adhesives.

33. The method of claim 26, wherein providing the pad and the first cap includes:

grinding the first post, the first adhesive and the first conductive layer such that the first post, the first adhesive and the first conductive layer are laterally aligned with one another at a lateral surface that faces in the first vertical direction; and then removing selected portions of the first conductive layer using an etch mask that defines the pad and the first cap.

34. The method of claim 26, wherein providing the terminal and the second cap includes removing selected portions of the second conductive layer using an etch mask that defines the terminal and the second cap after solidifying the adhesives.

35. The method of claim 26, wherein providing the terminal and the second cap includes:

grinding the second post, the second adhesive and the second conductive layer such that the second post, the second adhesive and the second conductive layer are laterally aligned with one another at a lateral surface that faces in the second vertical direction; and then removing selected portions of the second conductive layer using an etch mask that defines the terminal and the second cap.

36. The method of claim 26, wherein providing the electrical interconnect includes providing a plated through-hole that extends through the base and the adhesives after solidifying the adhesives.

37. The method of claim 26, wherein providing the conductive trace and the heat spreader includes:

removing selected portions of the first conductive layer using a first etch mask that defines the pad and the first cap after solidifying the adhesives; and removing selected portions of the second conductive layer using a second etch mask that defines the terminal and the second cap after solidifying the adhesives.

38. The method of claim 26, wherein providing the conductive trace and the heat spreader includes:

providing a hole that extends through the base, the adhesives and the conductive layers after solidifying the adhesives; then depositing a plated metal on the posts, the adhesives and the conductive layers, wherein the plated metal forms the plated layers and forms the electrical interconnect as a plated through-hole in the hole; then forming a first etch mask on the first plated layer that defines the pad and the first cap;

forming a second etch mask on the second plated layer that defines the terminal and the second cap; then etching the first conductive layer and the first plated layer in a first pattern defined by the first etch mask;

etching the second conductive layer and the second plated layer in a second pattern defined by the second etch mask; and then removing the etch masks.

39. The method of claim 38, wherein providing the hole includes:

providing an outer hole that extends through and is adjacent to the base, the adhesives and the conductive layers after solidifying the adhesives; then depositing an insulative filler into the outer hole; and then forming an inner hole that extends through the outer hole, extends through and is adjacent to the insulative filler, extends through and is spaced from the base, the adhesives and the conductive layers and provides the hole.

40. The method of claim 26, wherein mounting the semiconductor device includes providing a die attach between the semiconductor device and the first cap, electrically connecting the semiconductor device includes providing a wire bond between the semiconductor device and the pad, and thermally connecting the semiconductor device includes providing the die attach between the semiconductor device and the first cap.

41. A method of making a semiconductor chip assembly, comprising:

provide a first post, a second post, a first adhesive, a second adhesive, a first conductive layer, a second conductive layer and a base, wherein
the first post is adjacent to and integral with the base, extends vertically from the base in a first vertical direction, extends into a first opening in the first adhesive and is aligned with a first aperture in the first conductive layer,
the second post is adjacent to and integral with the base, extends vertically from the base in a second vertical direction opposite the first vertical direction, extends into a second opening in the second adhesive and is aligned with a second aperture in the second conductive layer,
the first adhesive contacts the base, is sandwiched between the base and the first conductive layer, extends vertically beyond the base in the first vertical direction and is non-solidified,
the second adhesive contacts the base, is sandwiched between the base and the second conductive layer, extends vertically beyond the base in the second vertical direction and is non-solidified,
the first conductive layer extends vertically beyond the first adhesive in the first vertical direction,
the second conductive layer extends vertically beyond the second adhesive in the second vertical direction,
the base is sandwiched between the posts, between the adhesives and between the conductive layers and extends laterally from the posts in lateral directions orthogonal to the vertical directions, and
the first post, the first opening and the first aperture are located within a periphery of the second post; then
applying heat to melt the adhesives
moving the conductive layers towards one another, thereby moving the first post in the first vertical direction in the first aperture, moving the second post in the second vertical direction in the second aperture, applying pressure to the molten first adhesive between the base and the first conductive layer and applying pressure to the molten second adhesive between the base and the second conductive layer, wherein the pressure between the base and the first conductive layer forces the molten first adhesive to flow in the first vertical direction into a first gap located in the first aperture between the first post and the first conductive layer and the pressure between the base and the second conductive layer forces the molten second adhesive to flow in the second vertical direction into a second gap located in the second aperture between the second post and the second conductive layer;
applying heat to solidify the molten adhesives, thereby mechanically attaching the first conductive layer to the first post and the base using the first adhesive and mechanically attaching the second conductive layer to the second post and the base using the second adhesive; then
providing a conductive trace that includes a pad, a terminal and an electrical interconnect, wherein the pad includes a selected portion of the first conductive layer and extends vertically beyond the first adhesive in the first vertical direction, the terminal includes a selected portion of the second conductive layer and extends vertically beyond the second adhesive in the second vertical direction, the electrical interconnect extends through the adhesives and the base and is spaced from and electrically isolated from the base and an electrically conductive path between the pad and the terminal includes the electrical interconnect;
providing a heat spreader that includes the posts, the base, a first cap and a second cap, wherein the first cap is adjacent to the first post, covers the first post in the first vertical direction, extends laterally from the first post, extends vertically beyond the first adhesive in the first vertical direction and includes a selected portion of the first conductive layer and the second cap is adjacent to the second post, covers the second post in the second vertical direction, extends laterally from the second post, extends vertically beyond the second adhesive in the second vertical direction and includes a selected portion of the second conductive layer; then
mounting a semiconductor device on the first cap, wherein the semiconductor device extends vertically beyond the first cap in the first vertical direction and extends laterally within peripheries of the posts and the caps and the first post and the first cap are sandwiched between the semiconductor device and the base;
electrically connecting the semiconductor device to the pad, thereby electrically connecting the semiconductor device to the terminal; and
thermally connecting the semiconductor device to the first cap, thereby thermally connecting the semiconductor device to the second cap.

42. The method of claim 41, wherein providing the posts and the base includes:
providing a metal plate;
forming a first etch mask on the metal plate that selectively exposes the metal plate in the first vertical direction and defines the first post;
forming a second etch mask on the metal plate that selectively exposes the metal plate in the second vertical direction and defines the second post; then
etching the metal plate in a first pattern defined by the first etch mask and a second pattern defined by the second etch mask, thereby forming a first recess in the metal plate that extends into but not through the metal plate and a second recess in the metal plate that extends into but not through the metal plate, wherein the first post includes an unetched portion of the metal plate that protrudes beyond the base in the first vertical direction and is laterally surrounded by the first recess, the second post includes an unetched portion of the metal plate that protrudes beyond the base in the second vertical direction and is laterally surrounded by the second recess and the base includes an unetched portion of the metal plate that is sandwiched between the posts and between the recesses; and then
removing the etch masks.

43. The method of claim 41, wherein:
providing the first adhesive includes providing a first prepreg with a first uncured epoxy and then inserting the first post into the first opening and providing the second adhesive includes providing a second prepreg with a second uncured epoxy and then inserting the second post into the second opening;
flowing the first adhesive includes melting the first uncured epoxy and compressing the first uncured epoxy between the first conductive layer and the base and flowing the second adhesive includes melting the second uncured epoxy and compressing the second uncured epoxy between the second conductive layer and the base; and solidifying the first adhesive includes curing the first uncured epoxy and solidifying the second adhesive includes curing the second uncured epoxy.

44. The method of claim 41, wherein:

providing the first conductive layer includes contacting the first conductive layer and the first adhesive, wherein the first aperture extends through the first conductive layer alone, and then flowing the first adhesive into the first gap; and providing the second conductive layer includes contacting the second conductive layer and the second adhesive, wherein the second aperture extends through the second conductive layer alone, and then flowing the second adhesive into the second gap.

45. The method of claim 41, wherein:

providing the first conductive layer includes providing a first substrate that includes the first conductive layer and a first dielectric layer and then contacting the first dielectric layer and the first adhesive, wherein the first dielectric layer contacts and is sandwiched between the first conductive layer and the first adhesive and is solidified and the first aperture extends through the first conductive layer and the first dielectric layer, and then flowing the first adhesive into the first gap; and providing the second conductive layer includes providing a second substrate that includes the second conductive layer and a second dielectric layer and then contacting the second dielectric layer and the second adhesive, wherein the second dielectric layer contacts and is sandwiched between the second conductive layer and the second adhesive and is solidified and the second aperture extends through the second conductive layer and the second dielectric layer, and then flowing the second adhesive into the second gap.

46. The method of claim 41, wherein providing the pad and the first cap includes removing selected portions of the first conductive layer using an etch mask that defines the pad and the first cap after solidifying the adhesives.

47. The method of claim 41, wherein providing the terminal and the second cap includes removing selected portions of the second conductive layer using an etch mask that defines the terminal and the second cap after solidifying the adhesives.

48. The method of claim 41, wherein providing the conductive trace and the heat spreader includes:

providing a plated through-hole that extends through the base and the adhesives to provide the electrical interconnect after solidifying the adhesives; then removing selected portions of the first conductive layer using a first etch mask that defines the pad and the first cap; and removing selected portions of the second conductive layer using a second etch mask that defines the terminal and the second cap.

49. The method of claim 41, wherein providing the conductive trace and the heat spreader includes:

providing an outer hole that extends through and is adjacent to the base, the adhesives and the conductive layers after solidifying the adhesives; then depositing an insulative filler into the outer hole; then forming an inner hole that extends through the outer hole, extends through and is adjacent to the insulative filler and extends through and is spaced from the base, the adhesives and the conductive layers; then depositing a plated metal on the posts, the adhesives, the conductive layers and the insulative filler, wherein the plated metal forms a first plated layer that covers the first post in the first vertical direction, a second plated layer that covers the second post in the second vertical direction and the electrical interconnect as a plated through-hole in the inner hole; then forming a first etch mask on the first plated layer that defines the pad and the first cap;

forming a second etch mask on the second plated layer that defines the terminal and the second cap; then etching the first conductive layer and the first plated layer in a first pattern defined by the first etch mask;

etching the second conductive layer and the second plated layer in a second pattern defined by the second etch mask; and then removing the etch masks.

50. The method of claim 41, wherein mounting the semiconductor device includes providing a die attach between the semiconductor device and the first cap, electrically connecting the semiconductor device includes providing a wire bond between the semiconductor device and the pad, and thermally connecting the semiconductor device includes providing the die attach between the semiconductor device and the first cap.

51. The method of claim 1, 11, 26 or 41, wherein the pad is located outside the periphery of the first post and extends laterally within the periphery of the second post.

52. The method of claim 1, 11, 26 or 41, wherein the pad is located outside the periphery of the first post and extends laterally within the periphery of the second post and the terminal is located outside the peripheries of the posts.

53. The method of claim 26 or 41, wherein the pad is located outside the periphery of the first post and extends laterally within the periphery of the second post, the terminal is located outside the peripheries of the posts and the first cap is located within the periphery of the second post.

* * * * *